United States Patent
Nagasaka et al.

(10) Patent No.: US 6,300,683 B1
(45) Date of Patent: *Oct. 9, 2001

(54) SEMICONDUCTOR DEVICE HAVING HIGH DENSITY INTERCONNECTIONS AND METHOD FOR MANUFACTURING THE SAME

(75) Inventors: Shigeru Nagasaka; Tadashi Yamamoto, both of Yokkaichi (JP)

(73) Assignee: Kabushiki Kaisha Toshiba, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/119,764

(22) Filed: Jul. 21, 1998

(30) Foreign Application Priority Data

Jul. 23, 1997 (JP) .................................................... 9-197497
Jul. 7, 1998 (JP) .................................................. 10-192042

(51) Int. Cl.[7] ......................... H01L 23/48; H01L 27/108; H01L 23/52

(52) U.S. Cl. ......................... 257/774; 257/303; 257/306; 257/751; 257/752; 257/773

(58) Field of Search ................................... 257/751, 752, 257/758, 773, 774, 776, 301, 303, 306; 438/618, 629, 666, 667, 668, 672, 675

(56) References Cited

U.S. PATENT DOCUMENTS

| | | | |
|---|---|---|---|
| 4,803,535 | * | 2/1989 | Taguchi ................................. 257/301 |
| 5,091,768 | * | 2/1992 | Yamazaki .............................. 257/758 |
| 5,841,196 | * | 11/1998 | Gupta et al. .......................... 257/774 |
| 5,914,510 | * | 6/1999 | Hieda .................................... 257/301 |

FOREIGN PATENT DOCUMENTS 62-37961 * 2/1987 (JP) .

* cited by examiner

Primary Examiner—Steven Loke
Assistant Examiner—Hung Kim Vu
(74) Attorney, Agent, or Firm—Hogan & Hartson, L.L.P.

(57) ABSTRACT

A main electrode region of a semiconductor element is provided in a semiconductor region on the surface of a semiconductor substrate, and first and second interlayer insulating films are deposited on this semiconductor region. A metal interconnection is provided on top of the second interlayer insulating film. The main electrode region and the metal interconnection a shape having a first tapered portion with an isotropic taper angle θ3, which starts from the interface between the first and second interlayer insulating films, and a second tapered portion with an anisotropic taper angle θ4, which starts from a point within the second interlayer insulating film. As a result, the shape of the face of the contact plug connecting to the metal interconnection is anisotropic, having dimensions which are greater in the direction parallel to the metal interconnection than in the direction perpendicular to the metal interconnection. The shoulders of the contact hole which are parallel to the metal interconnection are smoothed by anisotropic recession caused by the second tapered portion. Therefore, barrier metal film can be deposited approximately evenly inside the contact hole. Since the diameter of the contact hole does not increase perpendicular to the metal interconnection due to the anisotropic taper angle θ4, the intervals between adjoining metal interconnections can be minimized. The metal interconnection and the contact plug can be comprised from the same conductor or different conductors. The metal interconnection may, for instance, be a DRAM bit line or the like.

23 Claims, 49 Drawing Sheets

(a)

(b)

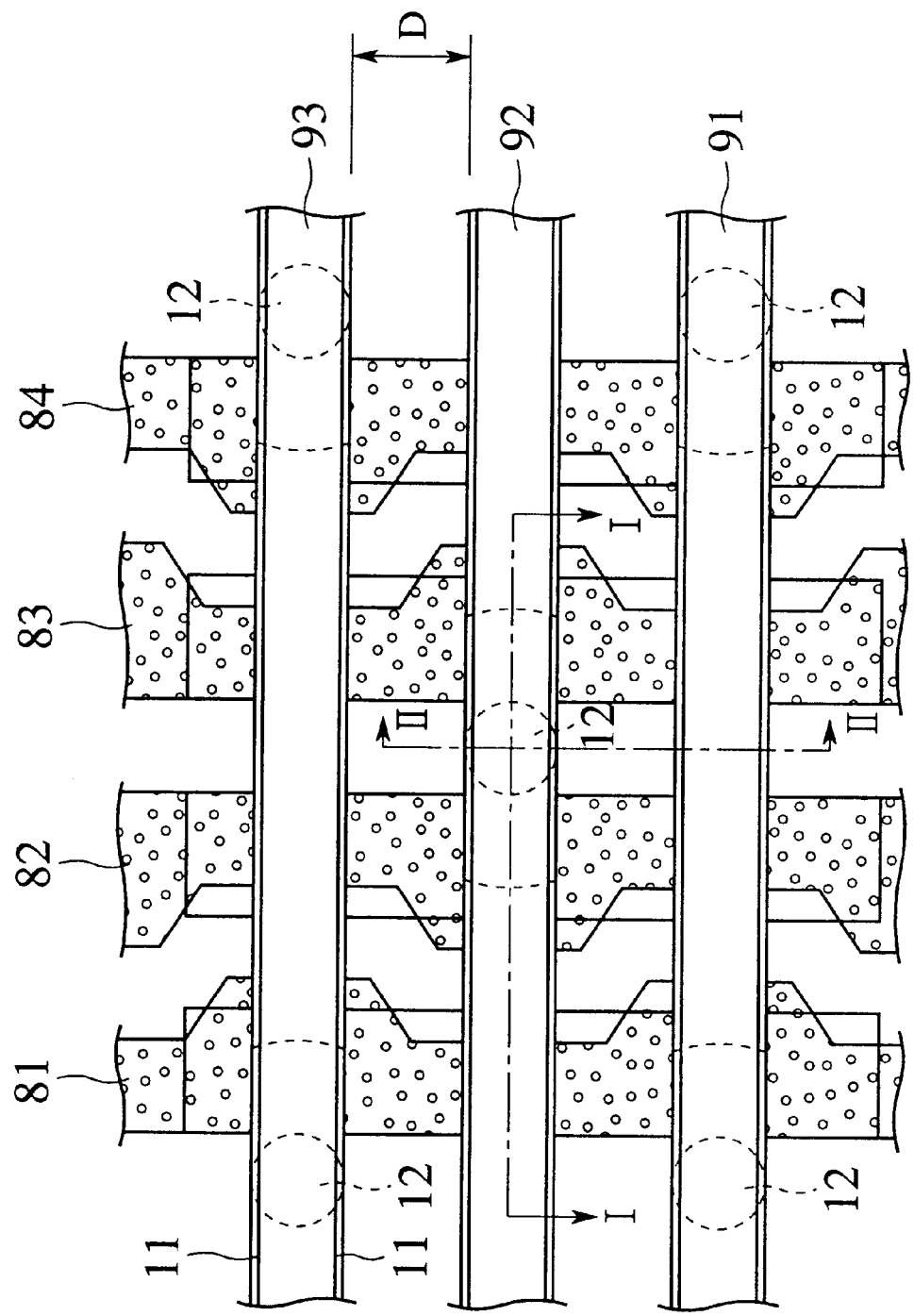

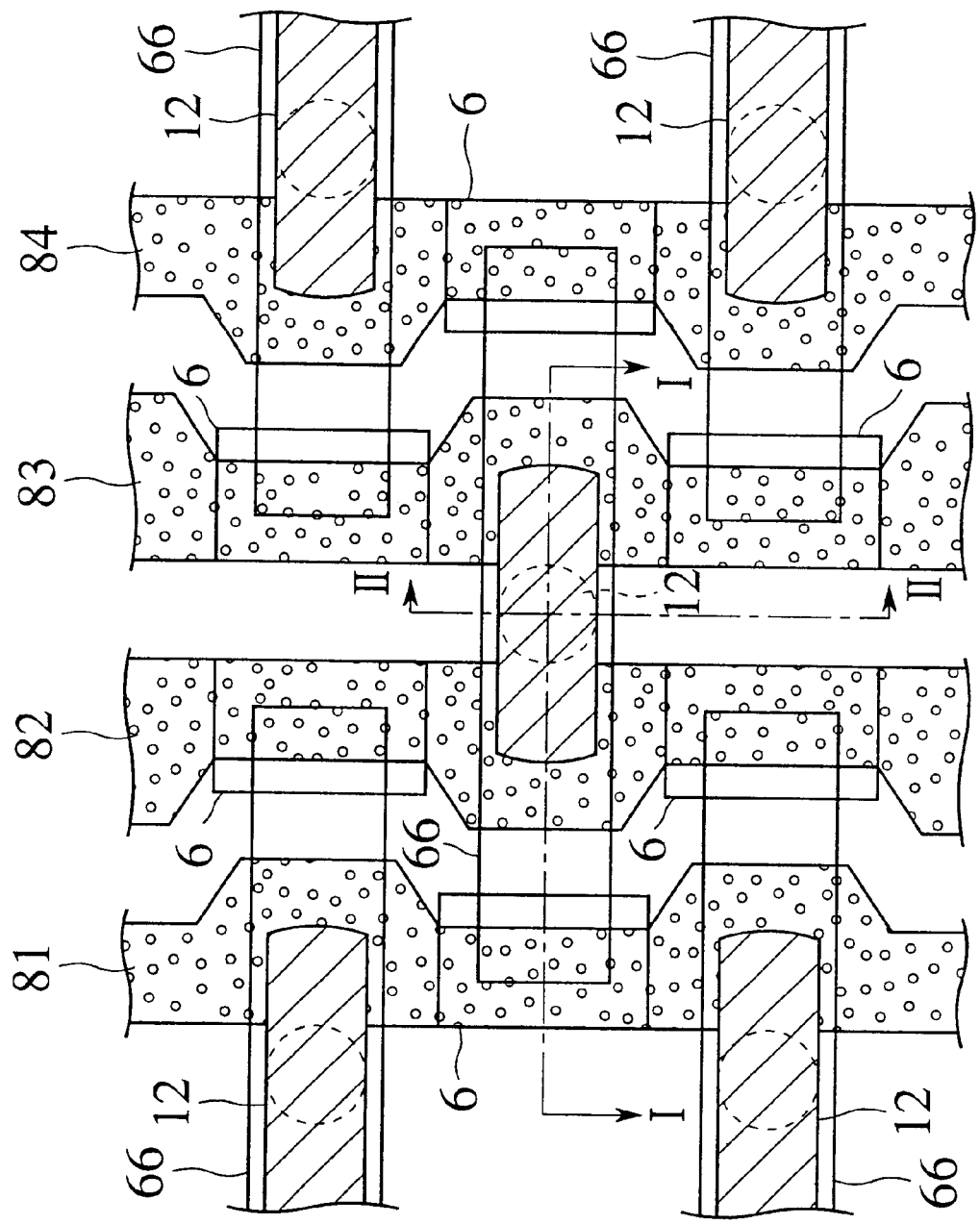

SEMICONDUCTOR DEVICE HAVING HIGH DENSITY INTERCONNECTIONS AND METHOD FOR MANUFACTURING THE SAME

BACKGROUND OF THE INVENTION

1. Field of the Invention

The present invention relates to a semiconductor device having a contact hole with a large aspect ratio, and more particularly to a semiconductor integrated circuit such as Dynamic Random Access Memory (DRAM) on gigabit level with high density surface interconnections, and a method of fabricating the same.

2. Description of the Related Art

In recent years, integration density of a semiconductor integrated circuit increases and particularly a high integration density on gigabit level is required in DRAM. Following such an increase of integration density of semiconductor integrated circuit, metallization techniques for making fine patterns of a surface interconnection and the contact holes for the surface interconnection are becoming indispensable. Among them, the metallization technique for connecting a semiconductor region such as a source/drain region formed on a semiconductor substrate to a conductor (metal interconnection) by opening a contact hole through an interlayer insulating film or the metallization technique for interconnection of multi-level wiring through a contact hole (via hole) and necessary metallization processes for these techniques are required to add many contrivances according to a decrease of the minimum feature size.

Problems in the conventional wiring techniques of DRAM will be described below. The case of connecting a bit line to a drain region of an access transistor is described here as an example of the conventional techniques. FIG. 1A is a top plan view illustrating a part of the memory cell of one-transistor (1-T) DRAM and shows a contact hole connected to a bit line 109-2 and other bit lines 109-1, 3. FIG. 1B is a cross-sectional view along the direction of I—I line in FIG. 1A, i.e. the direction of a bit line 109-2. FIG. 1C is a cross-sectional view along the direction perpendicular to II—II line in FIG. 1A, i.e. the direction of a bit line 109-2. An access transistor (nMOSFET) comprising an $n^+$ drain region 106d, an $n^+$ source region 106s and a polysilicon gate electrode 105 formed in a p-type silicon substrate 101 is shown. The gate 105 also serves as a word line. Though a storage capacitor connected to the $n^+$ source region 106s is not shown in the figure, the $n^+$ drain region 106d and the bit line 109-2 are connected each other through a contact plug 112.

A memory cell of the DRAM shown in FIGS. 1A–1C is manufactured by the following fabrication steps:

(a) First, an isolation region 102 is formed in a p-type silicon substrate 101 as shown in FIG. 2A. Next, a gate insulating film 103, a phosphor-doped polycrystalline silicon layer 105 and a silicon nitride ($Si_3N_4$) layer 104 are deposited. Thereafter, the silicon nitride layer 104 and the polycrystalline silicon layer 105 are dry-etched using a photo-resist (hereafter denote simply as "resist") as an etching-mask and thus a polysilicon gate electrode 105 is formed.

(b) Next, a silicon oxide layer 107 and an $n^+$ source and an $n^+$ drain regions 106s and 106d, respectively of the nMOSFET are formed on the side wall of the polysilicon gate electrode 105 by ion implantation of for example, phosphor ($^{31}P^+$) using the polysilicon gate electrode 105/silicon nitride layer 104 as an implantation mask and a thermal annealing after the ion implantation.

(c) Then, an interlayer insulating film 108 made from BPSG or another substance is deposited as shown in FIG. 2B, and the surface of the interlayer insulating film 108 is flattened to a predetermined thickness (d) Next, the resist is patterned by photolithography technique as shown in FIGS. 2C and 2D. Then, grooves 109a, 109b and 109c for the formation of the bit lines are formed by etching using the resist as an etching mask. After etching, the resist is removed. FIG. 2D is a cross-sectional view corresponding to II–II direction in FIG. 1A.

(e) Next, as shown in FIG. 2E, a new resist 121 is patterned by photolithography. A connecting hole (contact hole) 110b is opened at a certain position by dry-etching using the resist 121 as an etching mask. After opening the contact hole, the resist is removed.

(f) Next, as shown in FIG. 2F, a barrier metal film 111, typically for example, Ti/TiN laminated film, is deposited. Thereafter, a tungsten film 112 is deposited and the surface of the tungsten film 112 is flattened by CMP (Chemical Mechanical Polishing). Then the bit lines of DRAM shown in FIGS. 1A–1C are brought to completion.

Thus, both the bit line and contact hole are filled up by the contact plug 112 composed of the barrier metal film 111 and tungsten film. Though the barrier metal film 111 is prepared to prevent silicon from mutual reaction with tungsten, such as a solid-state reaction called as "contact spiking", which leads to a leakage current, the step coverage is not so good because it is formed by sputtering.

The conventional semiconductor device and the fabricating method as above-mentioned generate the following problems:

(1) The aspect ratio for the contact hole 110b of the present DRAM is the order of 1.5 to 3 and further has a tendency to be required to have high values more than 4. When the contact hole 110b of DRAM is filled up by the tungsten plug 112, the tungsten film cannot be filled sufficiently into the interior of the contact hole 110b, if the aspect ratio of the contact hole 110b is high. This is due to the fact that the angle between the substrate surface and the side surface of the contact hole, θ6 (hereafter denote as "the taper angle"), is nearly a right angle. Consequently, it is hard to bury the tungsten plug 112 into the contact hole 110b uniformly.

(2) As shown in FIG. 3, even if the aspect ratio is reduced, the situation that the angle between the side surface of the contact hole 110a and the bottom surface of the bit line 109, θ7 (hereafter the corner having the angle θ7 is denoted as "shoulder"), is nearly a right angle (θ>87°~89°) cannot be improved, so that the barrier metal film 111 is hard to be deposited and there is a possibility of a penetration of tungsten plug 112 into silicon through a pinhole of the barrier metal film. That is, the barrier metal film 111 in the shoulder portion of the upper edge of contact hole becomes thick and by this increment of the thickness, the layer thickness at a corner "X" in the bottom surface is extremely reduced, resulting in possibly of a significant intermixing between tungsten plug 112 and silicon substrate 101 at the corner "X".

(3) In order to avoid the above-mentioned problem (2), a technique of increasing the hole diameter of the contact hole 110b only on the upper portion, keeping the diameter constant at the lower portion as shown in FIGS. 5(a) and (b), is proposed. However, in this case there is a possibility of short-circuiting with the neighboring bit line when the bit line spacing becomes narrow.

Namely, increasing the contact hole diameter only on the upper portion of the contact hole by isotropic etching as shown in FIG. 5(a) is examined. By this attempt, the above-mentioned barrier metal film 111 is nearly uniformly deposited, since the hole diameter on the upper portion of the above-mentioned contact hole 110b becomes large.

However, in this case a significant restriction on reducing the distance between the neighboring wiring grooves 109a and 109b is generated, because the hole diameters in the upper portions of the contact holes 110a and 110b come in contact with the neighboring wiring grooves 109b and 109a, respectively as shown in FIG. 5(b). Particularly, when the contact hole positions of the neighboring wirings approach, there is a possibility of direct interference between the contact holes and so, this restriction is further enlarged.

SUMMARY OF THE INVENTION

The present invention aims to solve such problems of conventional technology.

More particularly, it is an object of the present invention to provide a high-density semiconductor device by reducing the intervals between surface interconnections without making the manufacturing process complex.

It is another object of the present invention to provide a semiconductor device, such as a high-density semiconductor integrated circuit, having few metallization failures such as open failures (breaks due to uneven surface) between surface interconnections and main electrode regions provided within a semiconductor substrate and junction leakage failures due to contact spiking.

It is another object of the present invention to provide a semiconductor device wherein the thickness uniformity of barrier metal can be improved and good ohmic contact with main electrode regions within the semiconductor substrate can be achieved.

It is another object of the present invention to provide a semiconductor device which has few metallization failures such as open failures between surface interconnections and the main electrode regions and junction leakage failures, even when contact holes have high aspect ratios.

It is another object of the present invention to provide a high-density DRAM wherein intervals between bit lines have been reduced with a simple manufacturing process.

It is another object of the present invention to provide a DRAM having few metallization failures such as open failures between bit lines and access transistor source/drain regions and junctions leakage failures around the source regions/drain regions and the like.

It is yet another object of the present invention to provide a DRAM capable of improving thickness uniformity of barrier metal and achieving good ohmic contact with access transistor source/drain regions.

It is yet another object of the present invention to provide a DRAM which has few metallization failures such as open failures between bit lines and access transistor source/drain regions and junctions leakage failures around the source regions/drain regions and the like, even when the contact holes on the source regions/drain regions have high aspect ratios.

It is a final object of the present invention to provide a method for manufacturing a semiconductor device few metallization failures such as open failures between bit lines and access transistor-source/drain regions and junctions leakage currents around the source regions/drain regions and the like, capable of being integrated at high-density and which can be manufactured easily.

In order to achieve the above objectives, a first aspect of the present invention pertains to a semiconductor device comprising a semiconductor region; a main electrode region provided in the semiconductor region; an interlayer insulating film provided on the semiconductor region; an interconnection provided on top of the interlayer insulating film; a contact plug, having a special shape, for connecting the main electrode region with the interconnection. "A contact plug having a special shape" signifies that the shape of the end face of the contact plug, which is the top end face which connects with the interconnection, and the shape of the area around this top end face, is anisotropic with respect to the center axis of the contact plug. The "center axis of the contact plug" denotes the axis of a contact plug which is pillar-shaped, for instance, a round-headed or square-headed pillar; namely, the axis which is perpendicular to the surface of the semiconductor substrate. "Anisotropic" signifies that the shape of the connecting face (top end face) of the contact plug extends only in an orthogonal direction to the center axis of the contact plug. For instance, "anisotropic" describes a shape having a long axis parallel to the interconnection and a short axis perpendicular to the interconnection, such as an oval or a rectangle, as opposed to isotropic shapes such as a perfect circle or a square. Furthermore, "main electrode region" signifies the source region and drain region of an FET, or the emitter region and collector region of a bipolar transistor (BJT). Moreover, "semiconductor region" signifies either a p-well and n-well provided on a semiconductor substrate, forming the support substrate, or a semiconductor substrate by itself. Also acceptable is a semiconductor layer provided on a buried insulating film, such as an SOI substrate.

According to the first aspect of the present invention, shorts between adjoining interconnections and contact plugs can be prevented, and interconnections can be reliably connected to contact plugs and main electrode regions provided in semiconductor regions, with no additional complex processes. Therefore, a semiconductor device with high reliability can be provided.

The present invention is particularly effective when applied to semiconductor integrated circuits which require a high level of integration, such as DRAM, Static Random Access Memory (SRAM), Ferroelectric Random Access Memory (FRAM) and logic LSI. For instance, in the case of large capacity DRAM such as 64 M-bit, 256 M-bit and DRAMs with capacity of over 1 G-bit, the intervals between bit lines are extremely narrow. A second aspect of the present invention pertains to a semiconductor memory of this type, comprising a memory cell having at least: a semiconductor region; first and second main electrode regions provided in the semiconductor region; a storage capacitor connected to the first main electrode region; a word line provided above a part between the first and second main electrode regions; an interlayer insulating film provided above the semiconductor region and the word line; a bit line provided above the interlayer insulating film; and a contact plug, having a special shape, for connecting the second main electrode region to the bit line. "A contact plug having a special shape" signifies that the shape of the face of the contact plug which connects with the bit line is anisotropic with respect to the center axis of the contact plug. The "center axis of the contact plug" denotes the axis of a round-headed or square-headed pillar-shaped contact plug which is perpendicular to the surface of the semiconductor substrate. "Anisotropic" signifies that the shape of the connecting face of the contact plug extends only in the direction at a right angle to the center axis of the contact plug. For instance, "anisotropic" describes a shape having a long axis parallel to the bit line and a short axis parallel to the word line such as an oval or a rectangle. Furthermore, "main electrode region" signifies the source and drain regions if an FET is employed as an access transistor of a memory cell, or the emitter and collector regions if a BJT is employed as the access transistor. And, "semiconductor region" signifies either a p-well and n-well provided on a semiconductor substrate, or a semiconductor substrate by itself. Also acceptable is a semiconductor layer provided on a buried insulating film, such as an SOI substrate.

According to the second aspect of the present invention, contact plugs and bit lines can be connected at a smoother angle, so that the connection does not take up any unnecessary space. Consequently, there is no danger of open failures (breaks or disconnection between bit lines and the second main electrode region ) and bit lines can be easily provided closer together, improving integration density.

A third aspect of the present invention pertains to a method for manufacturing a semiconductor device, comprising the steps of forming a main electrode region in a semiconductor region; forming a control electrode region above the semiconductor region; depositing an interlayer insulating film above the semiconductor region and the control electrode region; opening a contact hole through the interlayer insulating film to expose a surface of the main electrode region; forming an auxiliary film on an inner wall of the contact hole and on the interlayer insulating film; selectively removing the auxiliary film from around a top opening of the contact hole; selectively removing the interlayer insulating film from around the top opening and providing a tapered portion to the top opening; and filling the contact hole with a conductive material. Here, "auxiliary film" may acceptably comprise organic material film or the like formed by spin-coating. "Main electrode region" signifies FET source and drain regions, or BJT emitter and collector regions. "Control electrode region" signifies a region for controlling the flow of main current between the main electrode regions, such as the gate electrode region or the base electrode region.

According to the third aspect of the present invention, it is possible to provide an anisotropically shaped tapered portion near to the top opening of the contact hole. Therefore, the contact plug and the metal wire can be connected together at a smoother angle, so that the connection does not take up any unnecessary space. Consequently, there is no danger of open failures between the conductive material and the main electrode regions, and metal wires can be easily provided closer together, improving integration density.

A fourth aspect of the present invention also pertains to a method for manufacturing a semiconductor device, comprising the steps of forming a main electrode region in a semiconductor region; forming a control electrode region above the semiconductor region; depositing a first interlayer insulating film on the semiconductor region and the control electrode region; depositing a second interlayer insulating film on the first interlayer insulating film; opening a contact hole through the first and second interlayer insulating films to expose a surface of the main electrode region; forming a first tapered portion on an inner wall of the contact hole by etching thereof; forming an auxiliary film on the inner wall of the contact hole and on the second interlayer insulating film; selectively removing the auxiliary film from around a top opening of the contact hole; selectively removing the second interlayer insulating film from around the top opening and providing a second tapered portion to the top opening; and filling the contact hole with a conductive material. Here, "auxiliary film" may acceptably comprise organic material film or the like formed by spin-coating. "Main electrode region" signifies FET source and drain regions, or BJT emitter and collector regions. "Control electrode region" signifies a region for controlling the flow of main current between the main electrode regions, such as the gate electrode region or the base electrode region.

According to the fourth aspect of the present invention, it is possible to provide an anisotropic tapered portion near to the top opening of the contact hole. Therefore, the contact plug and the metal wire can be connected together at a smoother angle, so that the connection does not take up any unnecessary space. Consequently, there is no danger of open failures between the conductive material and the main electrode regions, and metal wires can be easily provided closer together, improving integration density.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 6A is a top plan view showing bit lines and word lines of DRAM according to the first embodiment of the present invention.

FIG. 6B is a top plan view showing contact plugs and active areas of the lower levels under the bit lines of FIG. 6A.

FIG. 12A is a top plan view and FIGS. 12B, 13A, 14A, 15A, 16A, 17A and 18A are cross-sectional views corresponding to the I—I direction of FIG. 12A. FIGS. 12C, 13B, 14B, 15B, 16B, 17B and 18B are cross-sectional views along the II—II direction of FIG. 12A.

DETAILED DESCRIPTION OF THE PREFERRED EMBODIMENTS

Figure 1A:
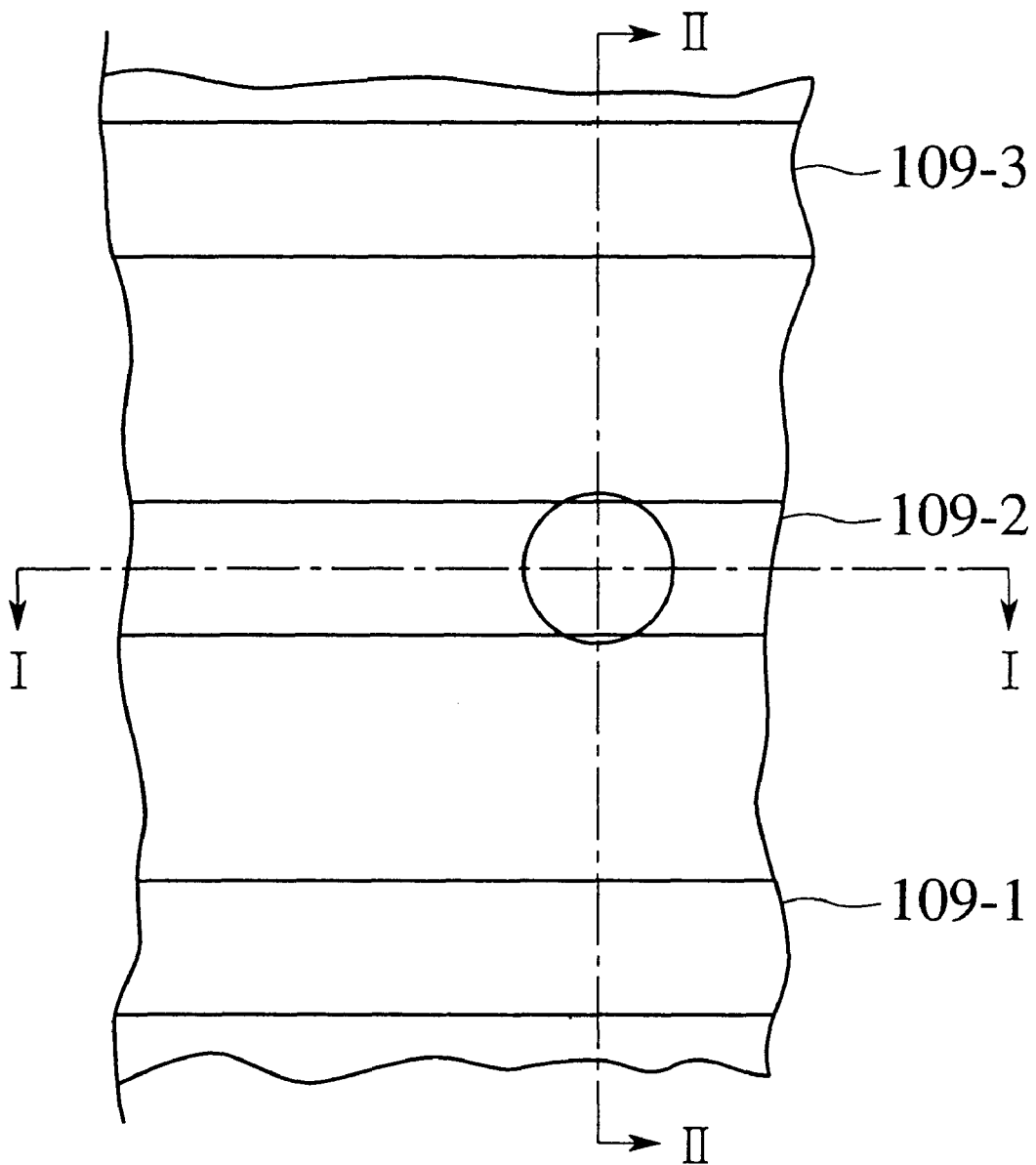
FIGS. 1A, 1B and 1C are a top plan view illustrating a portion connecting a metal interconnection to a main electrode region in the semiconductor region of a conventional semiconductor device, a cross-sectional view along the I—I direction of FIG. 1A and that along the II—II direction of FIG. 1A, respectively.
Figure 1B:
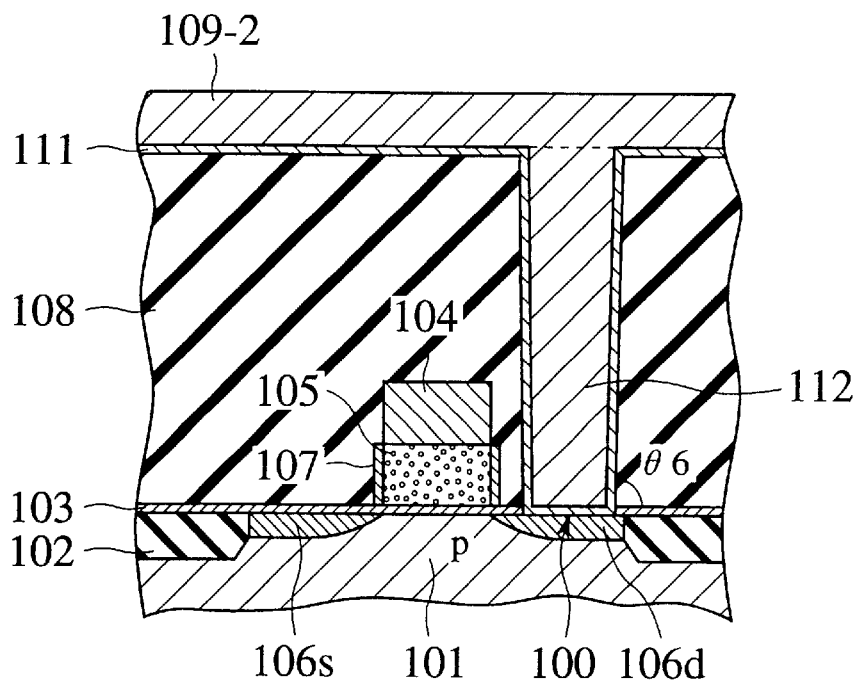
Figure 1C:
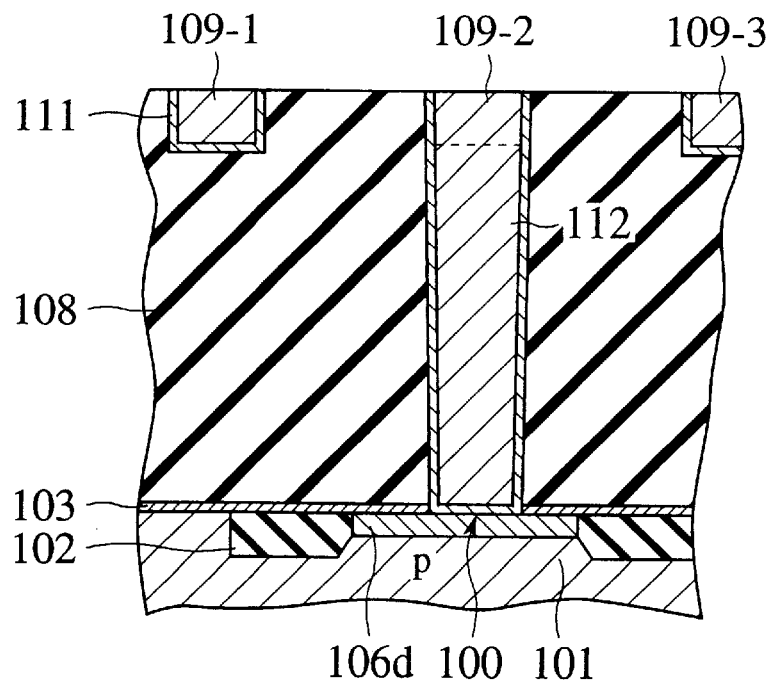
Figure 2A:
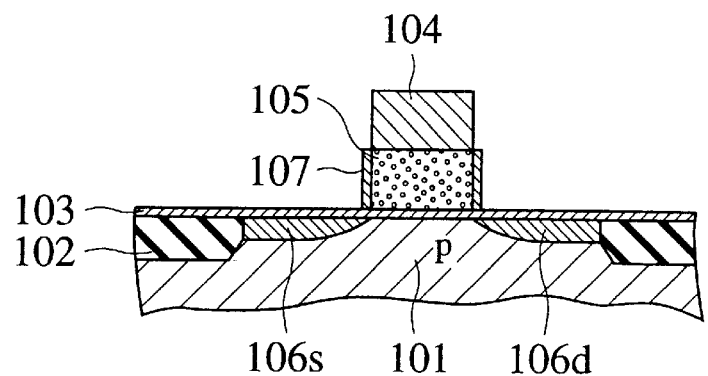
FIGS. 2A–2F are cross-sectional views of steps illustrating a fabricating method of a conventional semiconductor device shown in FIGS. 1A–1C.
Figure 2B:
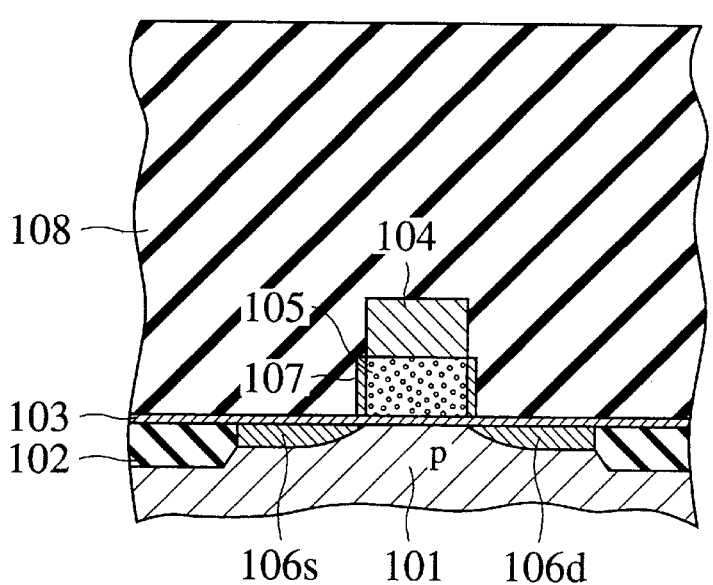
Figure 2C:
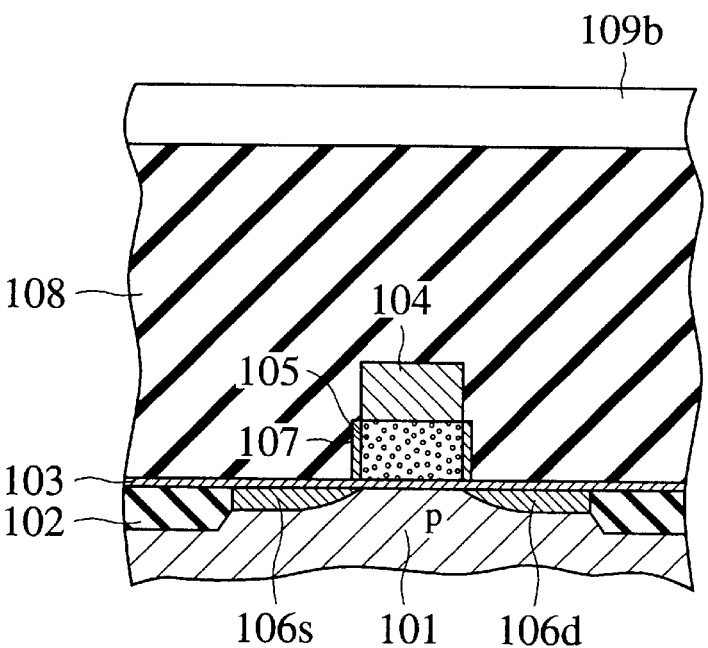
Figure 2D:
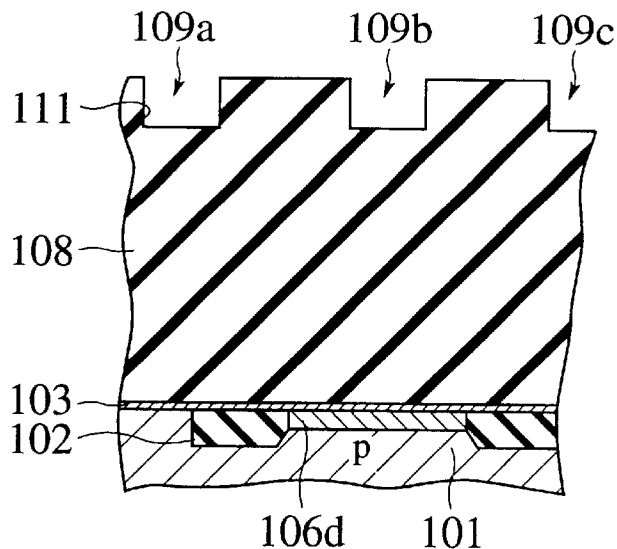
Figure 2E:
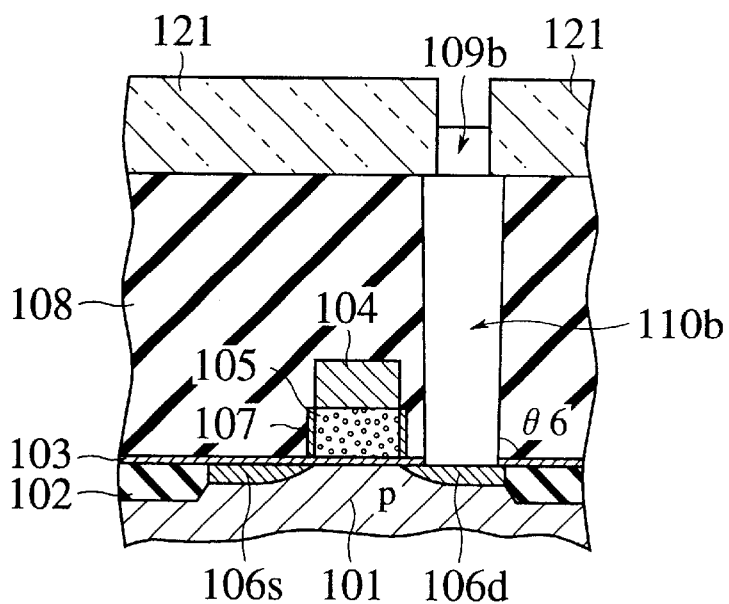
Figure 2F:
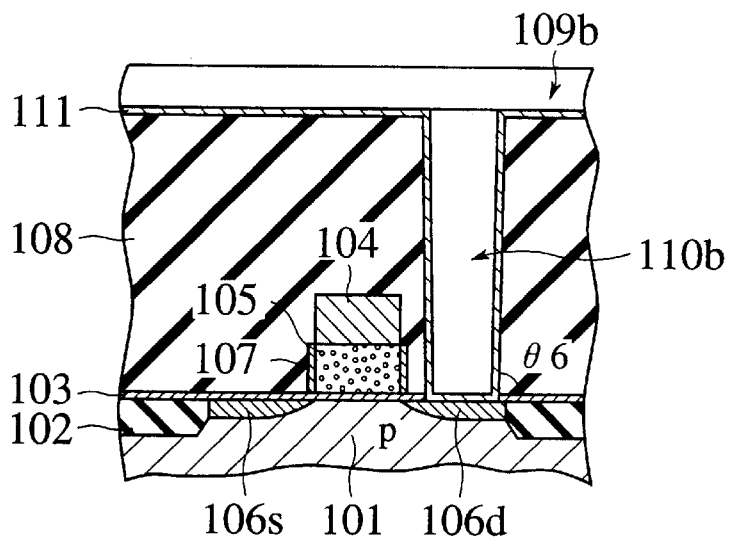
Figure 3:
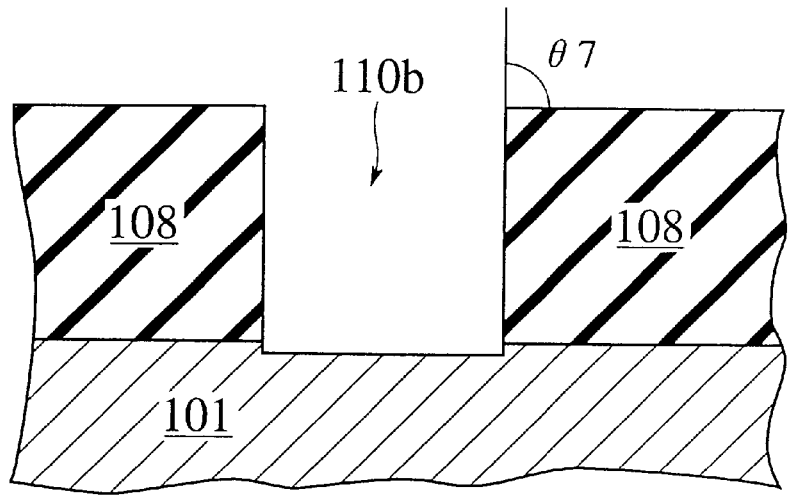
FIG. 3 is a cross-sectional view illustrating a form of a contact hole in a conventional semiconductor device.
Figure 4:
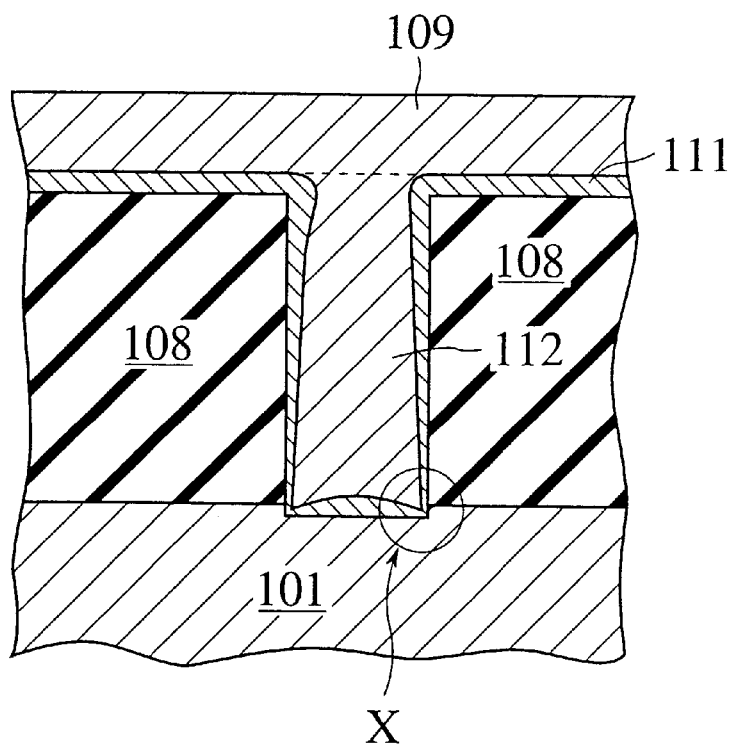
FIG. 4 shows a thickness distribution of a barrier metal in a contact hole of a conventional semiconductor device.
Figure 5:
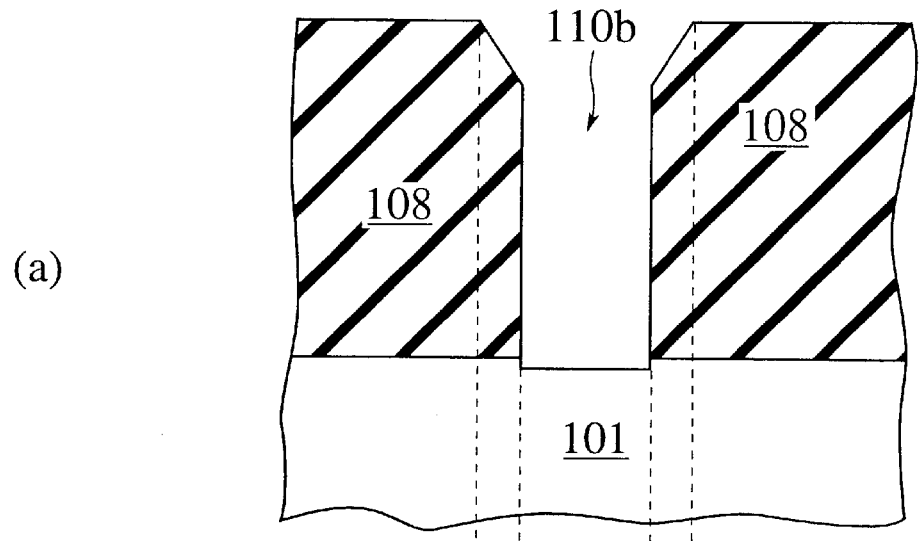
FIGS. 5(a) and (b) are a cross-sectional and a top plan views, respectively illustrating an another shape of the contact hole of a conventional semiconductor device.
Figure 5:
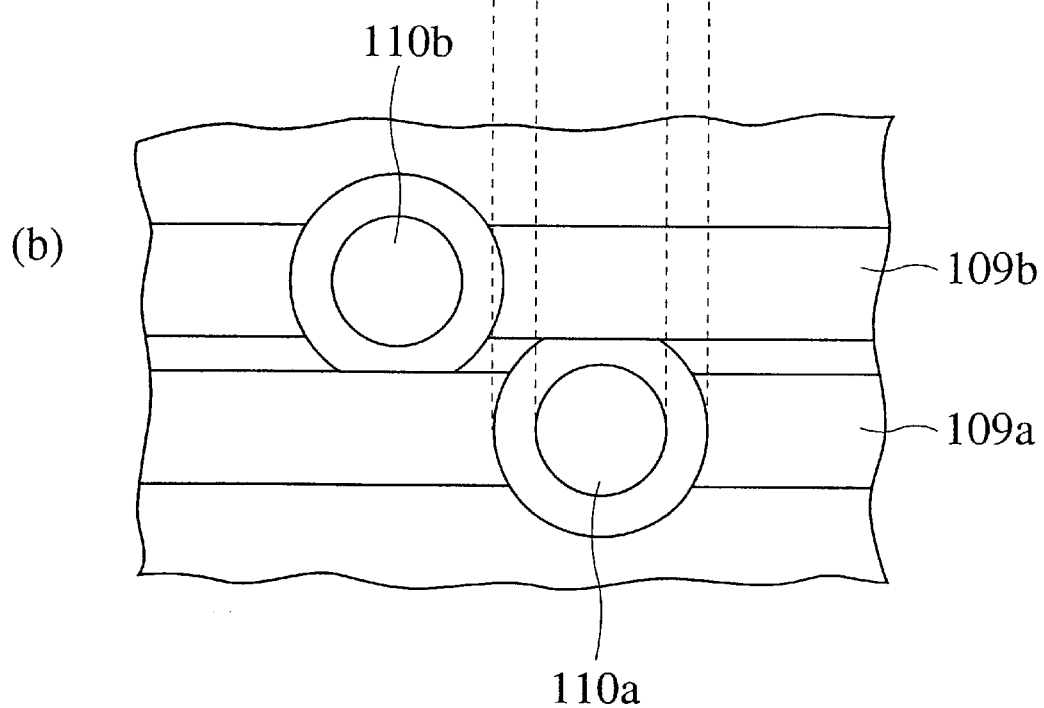

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

FIRST EMBODIMENT

Figure 6C:
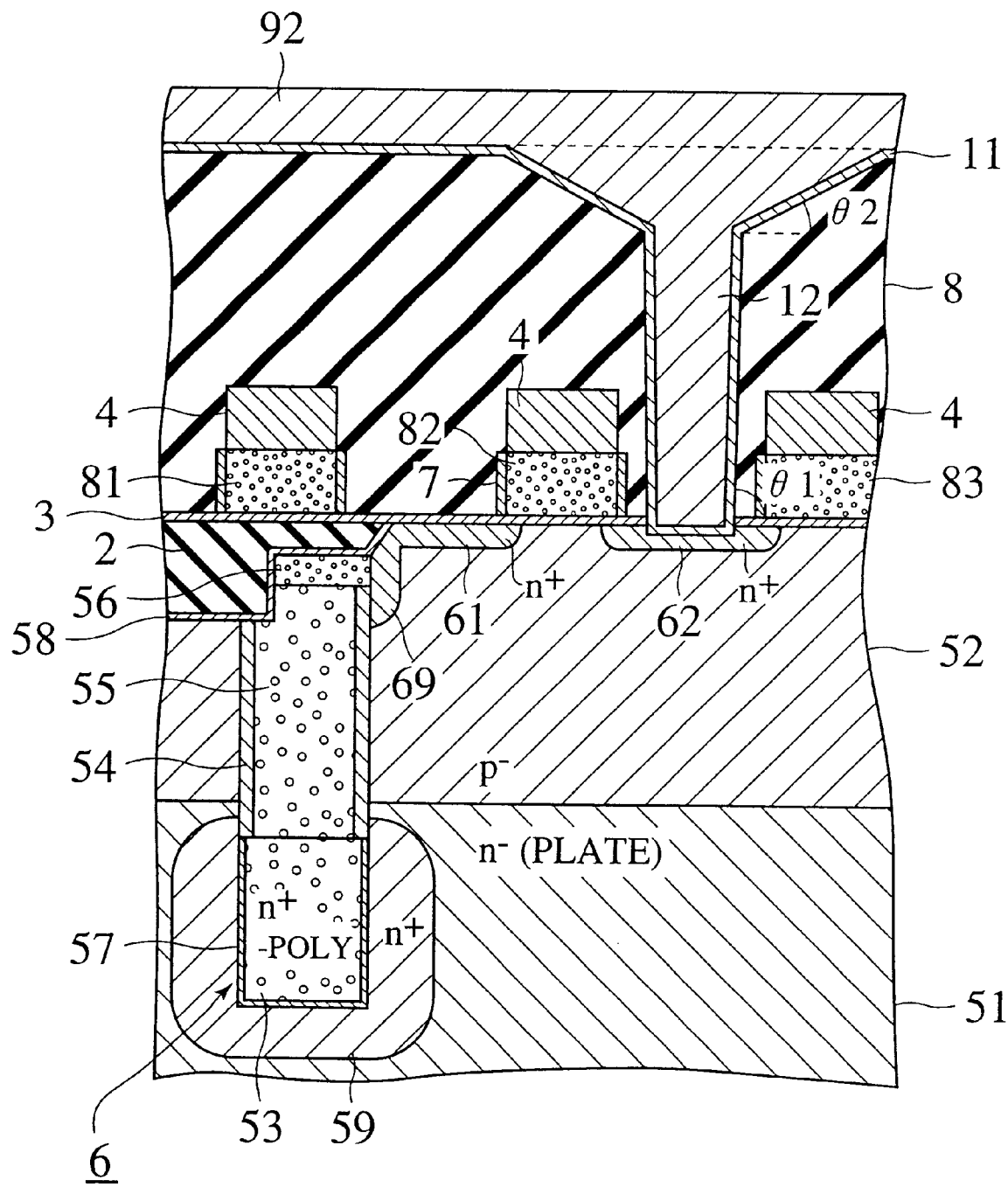
FIG. 6C is a cross-sectional view along the I—I direction of FIG. 6A.
Figure 6D:
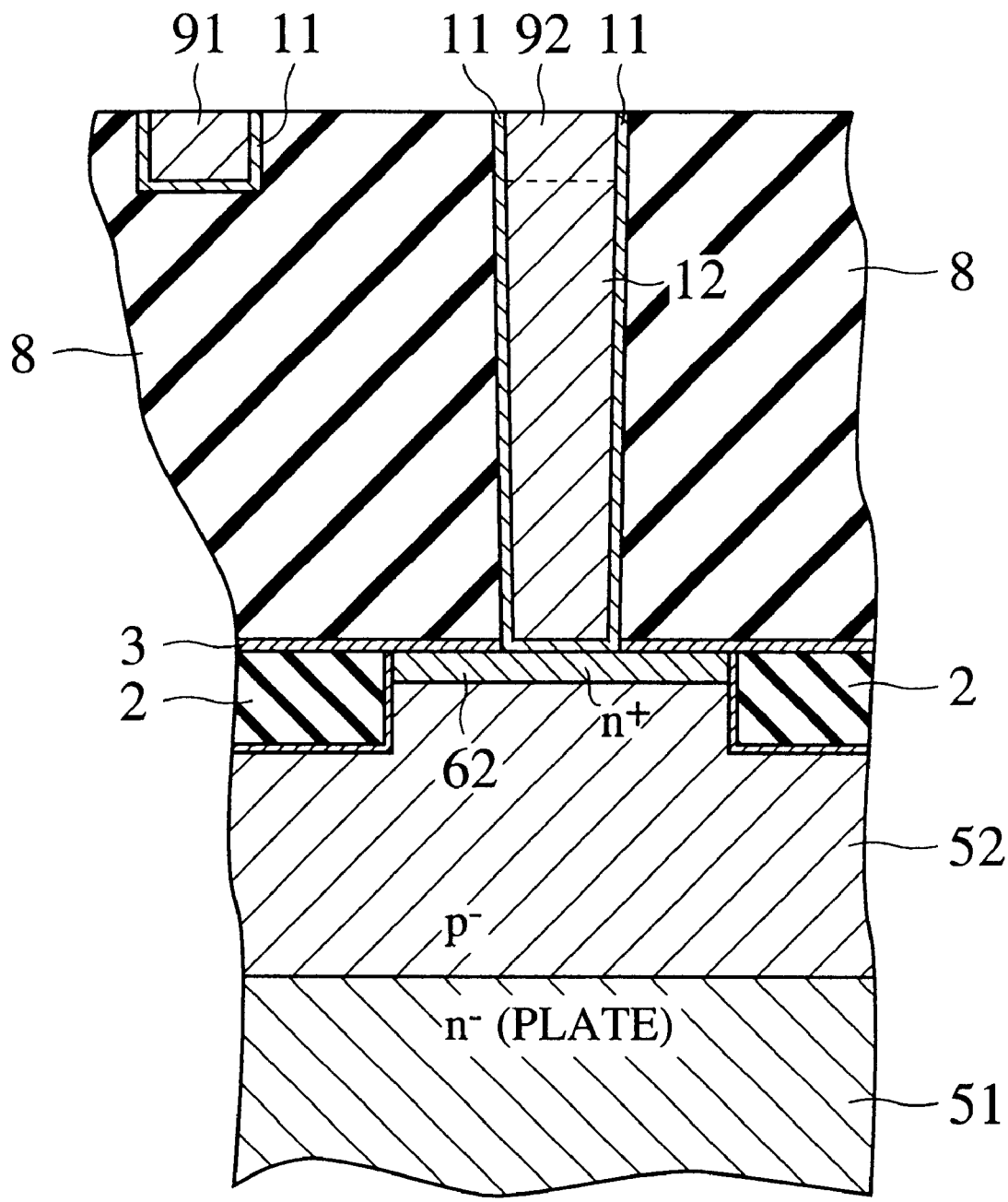
FIG. 6D is a cross-sectional view along the II—II direction of FIG. 6A.

FIGS. 6A and 6B are top plan views of DRAM according to the first embodiment of the present invention. FIG. 6B shows the shape of contact plugs 12 and active areas 66 (device regions) by eliminating the bit lines located on the upper level (top layer). FIG. 6C is a cross-sectional view along the I—I direction of FIG. 6A. FIG. 6D is a cross-sectional view along the II—II direction of FIG. 6A.

DRAM according to the first embodiment of the present invention is constructed by arranging a number of memory cells in the form of X-Y matrix. Each memory cell is made of an access transistor and a storage capacitor. FIGS. 6A and 6B are partial diagrams showing only several memory cells among them. FIG. 6C shows the neighborhood of two memory cells to be connected with word lines 82 and 83. The contact plug 12 arranged in the center of two memory cells is connected with a bit line 92 extending right and left. Access transistors comprising $n^+$ source region 61 and $n^+$ drain region 62 are arranged on both sides of the contact plug 12 located in the center. The $n^+$ source region 61 of the access transistor on the right side of the contact plug 12 is omitted in the figure. Further, a trench capacitor 51 is located adjacent to the perimeter of the $n^+$ source region 61 and interconnected through a buried strap 69.

As shown in FIG. 6C, a plate layer of DRAM according to the first embodiment of the present invention is an $n^-$ buried layer 51 formed on a p-type (100) silicon substrate which is omitted in the figure. A p-well 52 is arranged on this plate layer and an access transistor of the unit cell in DRAM is constructed on the surface of a p-well 52. The p-well 52 is surrounded by an insulating film 2 such as silicon oxide ($SiO_2$) layer for isolation or another material formed by STI (Shallow Trench Isolation) method or another method. The area surrounded by the insulating film 2 is "an active area". Ranges of the active areas are indicated by rectangles 66 in FIG. 6B (FIG. 6C is equivalent to a partial cross section of a specific active area 66). On the surface of the p-well 52 in the active area 66, the $n^+$ source region 61 and the $n^+$ drain region 62 of the access transistor are arranged. The p-well 52 between the $n^+$ source region 61 and the $n^+$ drain region 62 is a channel region. On this channel region 52, gate electrodes 81, 82 and 83 made of polysilicon or another material are formed through a gate insulating film (gate oxide film) 3. As shown in FIG. 6A, the polysilicon electrodes 81, 82 and 83 serve also as word lines extending to a direction perpendicular to the bit lines 91, 92 and 93. Silicon nitride ($Si_3N_4$) layers 4 are formed on the polysilicon gate electrodes 81, 82 and 83 to have nearly the same size as these electrodes and thin silicon oxide layers 7 are formed on the side walls of the polysilicon gate electrodes 81, 82 and 83. On the electrodes 81, 82, 83/silicon nitride ($Si_3N_4$) layers 4, an interlayer insulating film 8 made of BPSG or another material is formed and the bit line 92 is arranged thereon as shown in FIG. 6C.

The contact plug 12 having a taper portion with a taper angle θ2 is connected to the upper portion of the $n^+$ drain region 62 and further connected to the bit line 92 as shown in FIG. 6C. The contact plug 12 is buried into a contact hole formed through the interlayer insulating film 8. This taper portion is in an anisotropic shape with respect to the axis of the contact, plug 12, i.e., the contact hole has a surface with a taper angle θ2 only in the direction of the bit line in the upper portion. Consequently, cross-sectional shape of the opening portion of the contact hole, i.e., shape of the connecting surface of the contact plug 12 with the bit line 92 is anisotropic with respect to the central axis of the contact plug 12. "Anisotropic" shape means such a shape that extends only to an axial direction perpendicular to the central axis of the contact plug 12, i.e., extends only to the direction of bit line and relatively short in the perpendicular direction, as shown in FIG. 6B. In other words, shape of the connecting surface of the contact plug 12 is an anisotropic shape having a long axis parallel to the bit line 92 and a short axis perpendicular to the bit line 92. The cross-sectional shape on the upper opening portion of the contact hole extends right and left symmetrically.

The anisotropic shape of the contact plug 12 can be understood if we compare the cross-sectional view along the I—I direction and that along the II—II direction of FIG. 6A. As shown in FIG. 6D, which is a cross-sectional view along the II—II direction of FIG. 6A, the p-well 52 is surrounded by an insulating film 2, and on the surface of the p-well 52 the $n^+$ drain region 62 of the access transistor are disposed. On the $n^+$ drain region 62 and the insulating film 2, the interlayer insulating film 8 is formed through a gate insulating film (gate oxide film) 3, and the bit lines 91 and 92 are arranged thereon. The n⁺ drain region 62 and the bit line 92 is connected by the contact plug 12. Since, the contact plug 12 has the anisotropic shape, taper portion with a taper angle θ2 depicted on FIG. 6C is not appeared on this cross-section of FIG. 6D. The width of the top end of the contact plug 12 shown in FIG. 6D is relatively short to assure a high density bit line arrangement. Namely, the growth of diameter of the contact plug 12 along the gate electrode direction due to the taper angle θ2 does not occur because the taper angle θ2 is anisotropic. Hence, the short-circuiting between the neighboring bit lines and the contact plug 12 can be avoided easily.

Uniformity of thickness of the barrier metal film 11 between the side wall of the contact hole and the contact plug is high because the taper angle θ2 of the contact hole, i.e., the contact plug 12 is sufficiently smaller than θ1. Consequently, the connections between contact plug 12 and the bit lines 91, 92 and 93 are formed at a small angle so that danger of disconnection (break), or the generation of voids can be avoided.

Further, a trench is formed in the neighborhood of the n⁺ source region 61 by penetrating the p-well and digging further into the n-plate layer 51, and on the inside wall thereof an NO layer of 3–8 nm in thickness which serves as a capacitor dielectric 57 is formed. On the surface of this capacitor dielectric 57, the first n⁺ doped polysilicon (n⁺ DOPOS) which serves as a storage node electrode 55 is formed to be buried into the trench. Instead of the first n⁺ DOPOS, refractory metals such as tungsten (W), molybdenium (Mo), titanium (Ti), or another substance, and their silicides ($WSi_2$, $TiSi_2$, $MoSi_2$) or another material can be used. An n⁺ diffusion layer 59 is formed in the neighborhood of the bottom portion of the trench. A storage capacitor (capacitor part) according to the first embodiment of the present embodiment is constructed by the storage node electrode 55 composed of the first n⁺ DOPOS, capacitor dielectric 57 and the n⁺ diffusion layer 59 (the n⁺ diffusion layer 59 may be regarded as a part of the n-plate electrode 51). This storage node electrode 55 in the capacitor part is connected to the n⁺ source region 61 of the access transistor through the second and third n⁺ DOPOS 55, 56 and the buried strap 69. A thick silicon oxide layer 54 called "collar oxide" is formed between the second n⁺ DOPOOS 55 and the p-well 52. The "collar oxide" 54 is a silicon oxide layer for suppressing the leakage current due to a parasitic transistor formed between the n⁺ source region 61 and the n⁺ diffusion layer 59/n-plate electrode 51.

As shown in the top plan view FIG. 6A, three bit lines 91, 92 and 93 are extended right and left and the contact plugs 12 are located at equal intervals. Since the form of the upper portions connecting the contact plugs 12 to the bit lines has such a shape as extending only to the direction of the extension of the bit line, the bit lines 91, 92 and 93 can be arranged as closely as possible. Even if the bit lines are closely arranged, there is no possibility of short-circuiting between these bit lines nor possibility of disconnection between bit line and n⁺ drain region. Consequently, integration density of a memory cell can be improved easily by the structure of DRAM according to the first embodiment of the present invention. As above-mentioned, according to the first embodiment of the present invention the interval D between the bit lines is approximately a margin itself for the interference between the bit lines. Hence, an improvement of integration density is possible by reducing the bit line intervals Further, a trench is formed in the neighborhood of the n⁺ source region 61 by penetrating the p-well and digging further into the n-plate layer 51, and on the inside wall thereof an NO layer of 3–8 nm in thickness which serves as a capacitor dielectric 57 is formed. On the surface of this capacitor dielectric 57, the first no doped polysilicon (n⁺ DOPOS) which serves as a storage node electrode 55 is formed to be buried into the trench. Instead of the first n⁺ DOPOS, refractory metals such as tungsten (W), molybdenium (Mo), titanium (Ti), or another substance, and their silicides ($WSi_2$, $TiSi_2$, $MoSi_2$) or another material can be used. An n⁺ diffusion layer 59 is formed in the neighborhood of the bottom portion of the trench. A storage capacitor (capacitor part) according to the first embodiment of the present embodiment is constructed by the storage node electrode 55 composed of the first n⁺ DOPOS, capacitor dielectric 57 and the n⁺ diffusion layer 59 (the n⁺ diffusion layer 59 may be regarded as a part of the n-plate electrode 51). This storage node electrode 55 in the capacitor part is connected to the n⁺ source region 61 of the access transistor through the second and third n⁺ DOPOS 55, 56 and the buried strap 69. A thick silicon oxide layer 54 called "collar oxide" is formed between the second n⁺ DOPOOS 55 and the p-well 52. The "collar oxide" 54 is a silicon oxide layer for suppressing the leakage current due to a parasitic transistor formed between the n⁺ source region 61 and the n⁺ diffusion layer 59/n-plate electrode 51.

As shown in the top plan view FIG. 6A, three bit lines 91, 92 and 93 are extended right and left and the contact plugs 12 are located at equal intervals. Since the form of the upper portions connecting the contact plugs 12 to the bit lines has such a shape as extending only to the direction of the extension of the bit line, the bit lines 91, 92 and 93 can be arranged as closely as possible. Even if the bit lines are closely arranged, there is no possibility of short-circuiting between these bit lines nor possibility of disconnection between bit line and n⁺ drain region. Consequently, integration density of a memory cell can be improved easily by the structure of DRAM according to the first embodiment of the present invention. As above-mentioned, according to the first embodiment of the present invention the interval D between the bit lines is approximately a margin itself for the interference between the bit lines. Hence, an improvement of integration density is possible by reducing the bit line intervals.

DRAM according to the first embodiment of the present invention can be manufactured by the following fabrication steps:

(a) First, the n⁻ buried layer 51 is formed by ion implantation of arsenic ($^{75}As^+$) into a p (100) substrate at 1 to 10 MeV and subsequent annealing. It may also be formed by diffusion method without using high energy ion implantation of MeV class. In this case, it is necessary to diffuse the p⁻ layer (p-well) 52 onto the surface of a diffusion layer of the n⁻ buried layer 51. Depositions of the n⁻ buried layer 51 and the p⁻ layer 52 thereon by selective epitaxial growth may also be possible. Next, a silicon oxide layer is formed on the surface of the p-well 52. Then a photoresist pattern is formed on the silicon oxide layer except the portion planned to form trench (U groove) by photolithography. The silicon oxide layer on the surface of the p-well 52 is etched by ECR ion etching or by RIE, using for example, $CF_4$, $CF_4/H_2$, $C_3F_8$ or other compound gases as etching gases. The trench for the formation of capacitor portion of 5 to 10 μm in depth is formed by RIE using $CF_4$, $SF_6$, $CBrF_3$, $SiCl_4$, or $CCl_4$, or another compound or by ECR ion etching using the silicon oxide layer as an etching mask. Cooling of the substrate to −110° C. to −130° C. at the time of trench etching is also effective. By ion implantation of arsenic from the bottom portion of the trench, the n⁺ diffusion layer 59 is formed in the neighborhood thereof.

Figure 7:
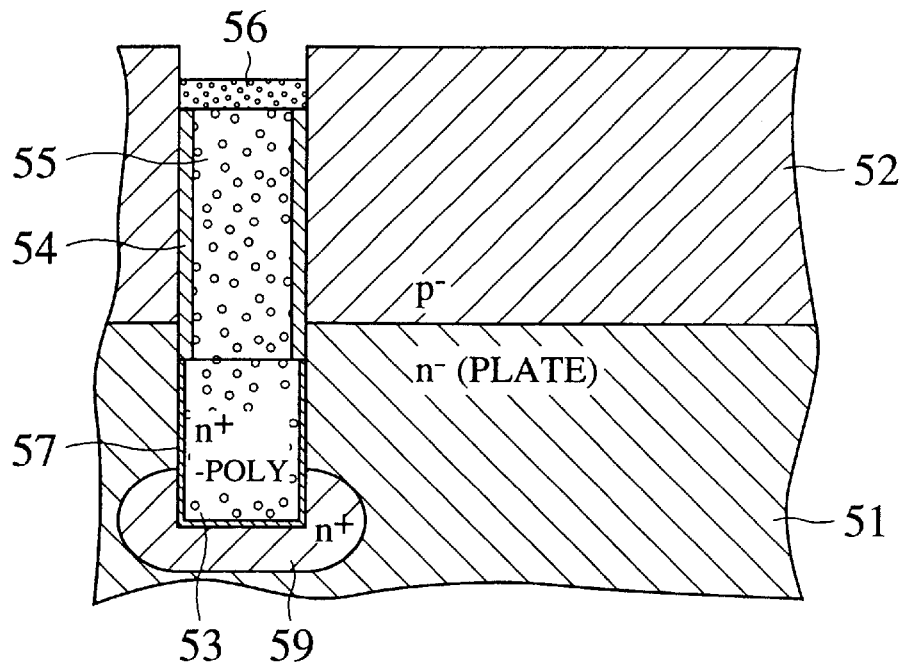
FIGS. 7–11, 12A–12C, 13A, 13B, 14A, 14B, 15A, 15B, 16A, 16B, 17A, 17B, 18A and 18B are process flow views illustrating the fabricating method of DRAM according to the first embodiment of the present invention.

(b) The NO layer of 3–8 nm in thickness which serves as the capacitor dielectric 57 is formed in the trench. In succession of the formation of NO layer, the first n⁺ DOPOS 53 is buried into the trench. Thereafter, the first n⁺ DOPOS 53 is etched back by about 1 μm using RIE, to expose an upper sidewall of the trench. The thick "collar oxide" 54 is formed by thermally oxidizing the upper sidewall of the etch-backed trench. Thereafter, only the "collar oxide" at the upper portion of the first n⁺ DOPOS 53 is selectively removed using RIE having high directionality. Successively, on the first n⁺ DOPOS 53, the second n⁺ DOPOS 55 is buried. The first and second n⁺ DOPOS 53 and 55, respectively can be buried by low-pressure CVD. Thereafter, upper portion of the second n⁺ DOPOS 55 is etched back by an equal length to the depth of the planned buried strap 69. Further, the exposed "collar oxide" is removed. Then, successively after deposition of the second n⁺ DOPOS 55, the third n⁺ DOPOS 56 is deposited by CVD and etched back as shown in FIG. 7.

Figure 8:
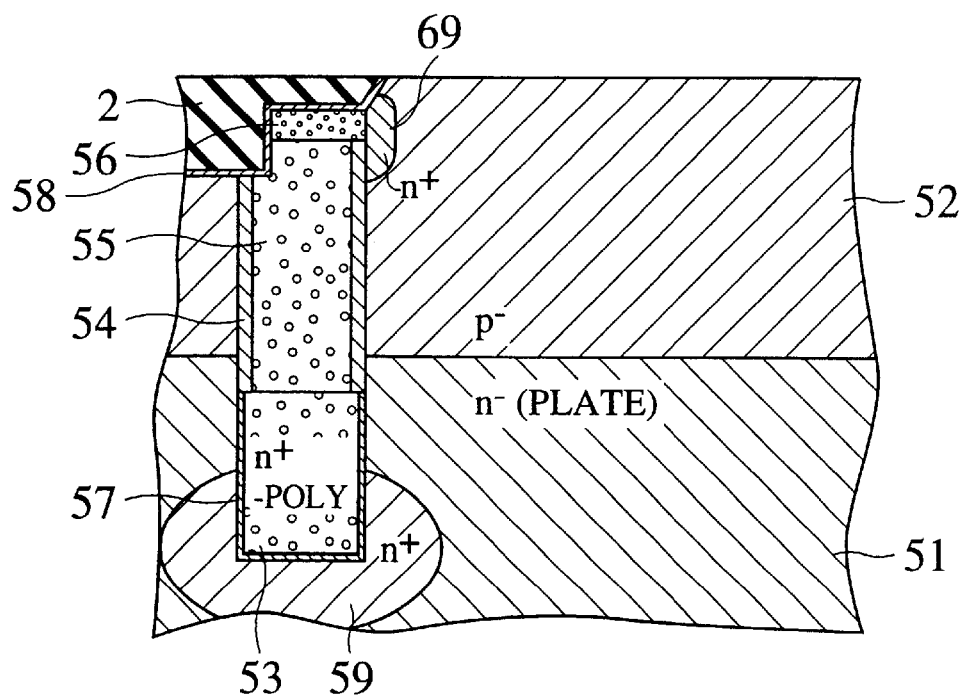

(c) Further, the p⁻ layer 52 surrounding the active area is removed by etching to form a shallow trench, using photolithography and RIE methods. A part of the third n⁺ DOPOS 56, or the excess third n⁺ DOPOS 56 at the upper portion of the trench is also removed. The silicon nitride ($Si_3N_4$) layer 58 is formed in the shallow trench formed by the process as above-mentioned and further the insulator 2 made of silicon oxide or another material is buried by a CVD process and thus, STI region as shown in FIG. 8 is formed. The n-type impurity in the third n⁺ DOPOS 56 is diffused into the p-well 52 by heat treatment necessary to bury the insulator 2 in the shallow trench and by an additional heat treatment thereafter, and thus the final buried strap 69 is completed.

Figure 9:
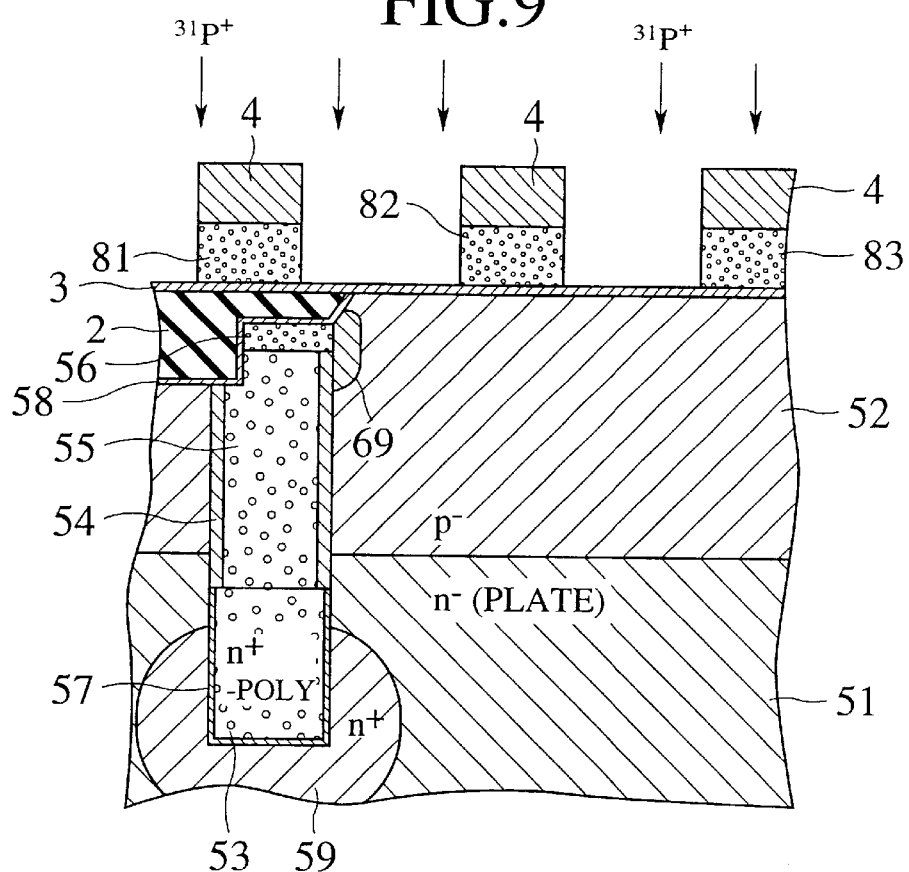

(d) The polysilicon gate electrodes 81, 82 and 83 as shown in FIG. 9 are formed by depositing the gate insulating film 3, the phosphor-doped n⁺ DOPOS layers 81, 82 and 83 of 100 to 300 nm in thickness and the silicon nitride ($Si_3N_4$) layer of 150 to 250 nm in thickness and by dry-etching the silicon nitride ($Si_3N_4$) layers 4 and the n⁺ DOPOS layers 81, 82 and 83 using resist as an etching mask. In this case, the gate electrodes 81, 82 and 83 are not restricted to the n⁺ DOPOS but refractory metals such as W, Mo, Ti, or another substance, and their suicides ($WSi_2$, $MoSi_2$, $TiSi_2$) or a laminated film of polycrystallinesilicon layer with silicide layer ("policide" layer) can also be used. Next for example, phosphor ($^{31}P^+$) is ion-implanted using the polysilicon gate electrodes 81, 82 and 83 /silicon nitride ($Si_3N_4$) layers 4 as implantation masks.

Figure 10:
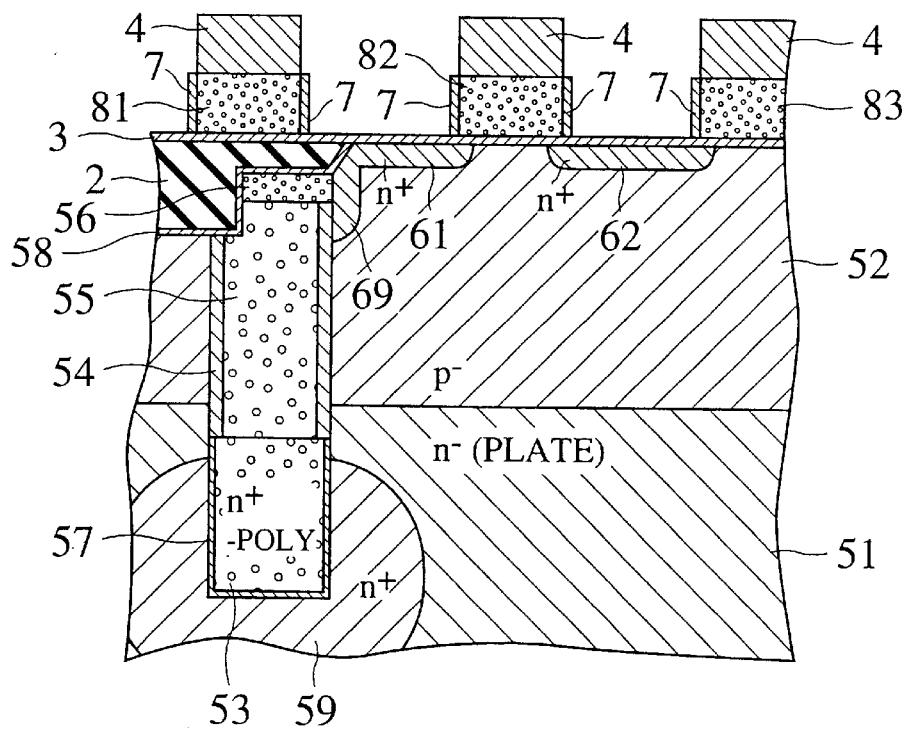

(e) After ion implantation, the n⁺ source region 61, n⁺ drain region 62 of the nMOSFET are formed by a specified heat treatment process. By this specified heat treatment process, the side walls of the polysilicon gate electrodes 81, 82 and 83 are thermally oxidized to form sidewall silicon oxide layers 7 as shown in FIG. 10. This sequence of fabrication process along FIGS. 9 and 10 is similar to the well-known fabrication process of MOSFET. Another structure other than that shown in FIG. 10 and many similar methods can be adopted. For example, MOSFET of LDD structure can be provided by performing ion implantation twice.

Figure 11:
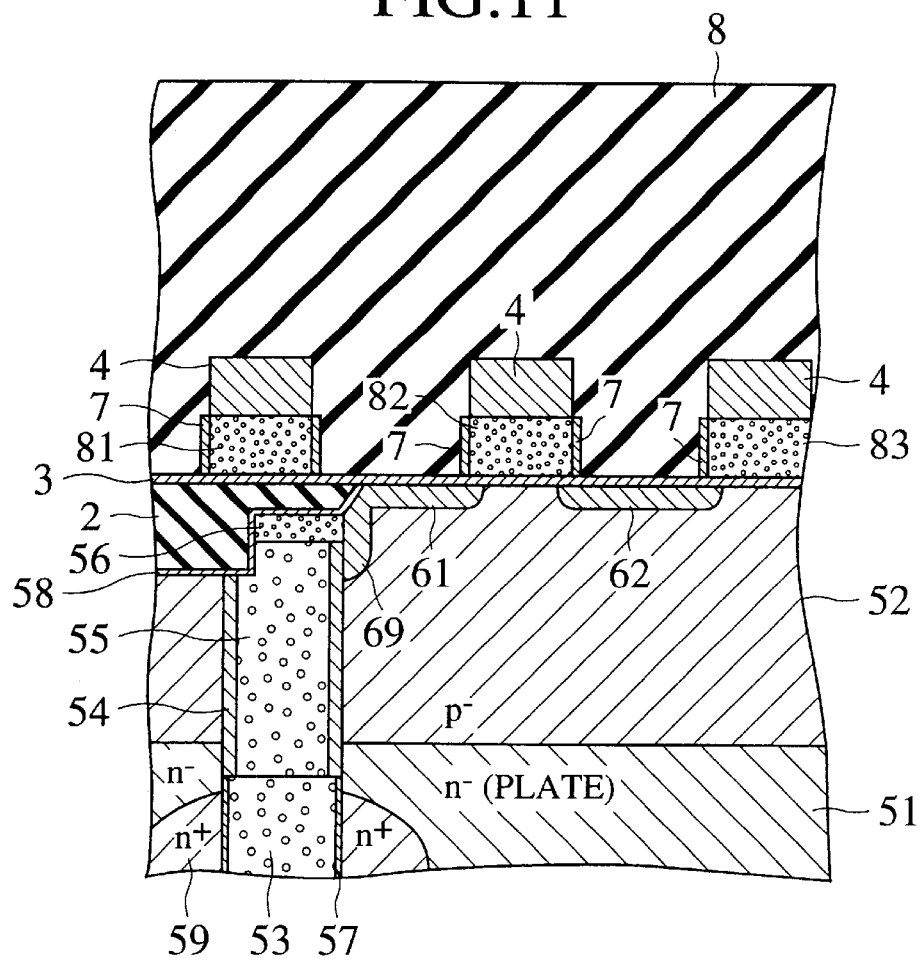
Figure 12A:
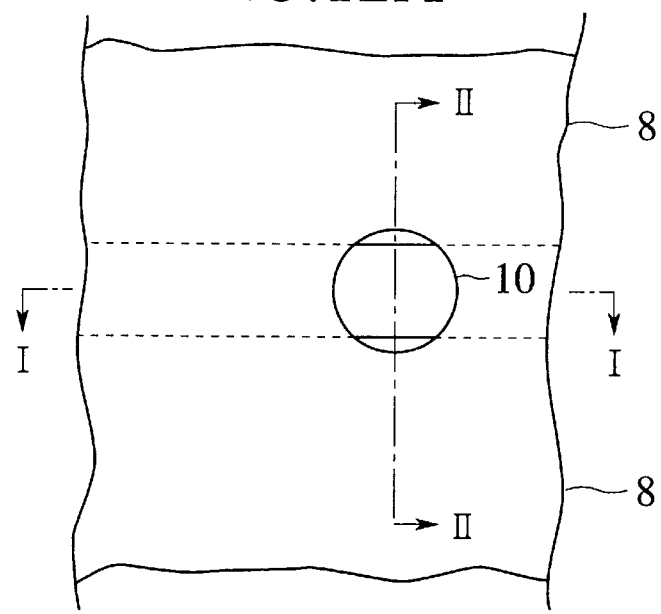
Figure 12B:
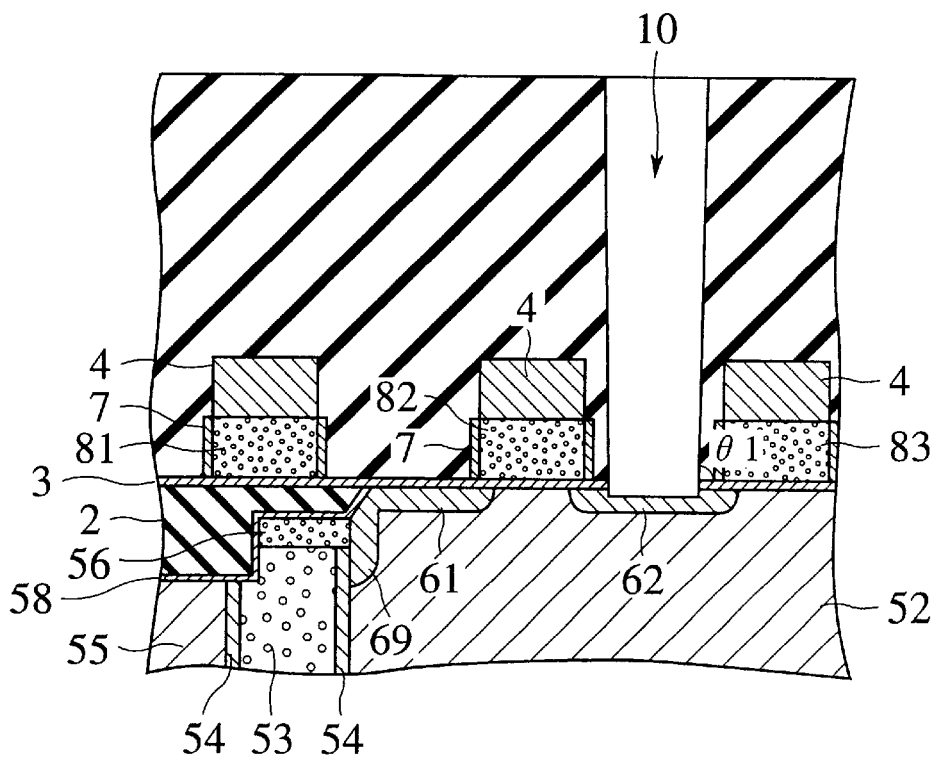
Figure 12C:
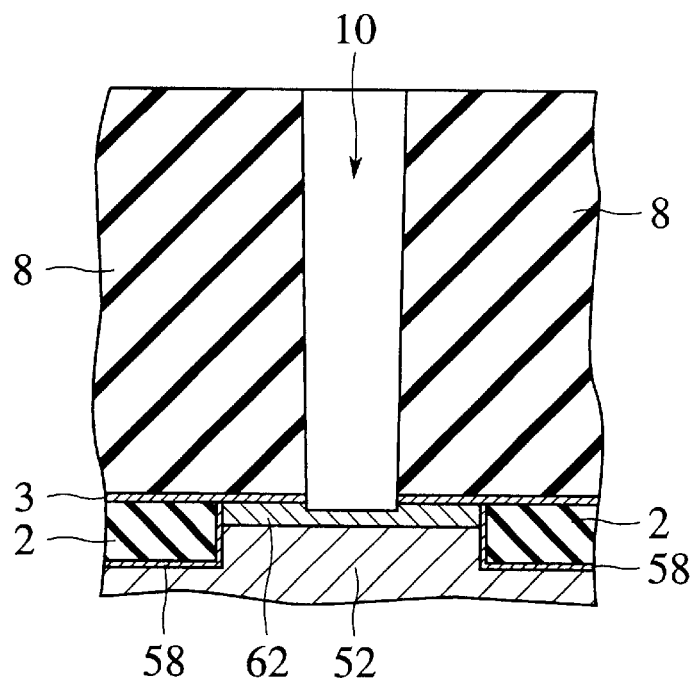

(f) Subsequently, the interlayer insulating film 8 made of BPSG or another material is deposited as shown in FIG. 11. Then, the surface of the interlayer insulating film 8 is flattened to a predetermined thickness of, for instance, 400 to 600 nm. Next, a resist is spin-coated on the interlayer insulating film 8 and patterned using photolithography. Using the pattern of this resist as etching mask, the contact hole 10 shown in FIGS. 12A, 12B and 12C is opened by RIE. Diameter of the contact hole 10 may be 0.15 to 0.5 μm. Thereafter, the resist is removed. FIG. 12B is a cross-sectional view along the I—I direction of FIG. 12A and FIG. 12C is that along the II—II direction of FIG. 12A.

Figure 13A:
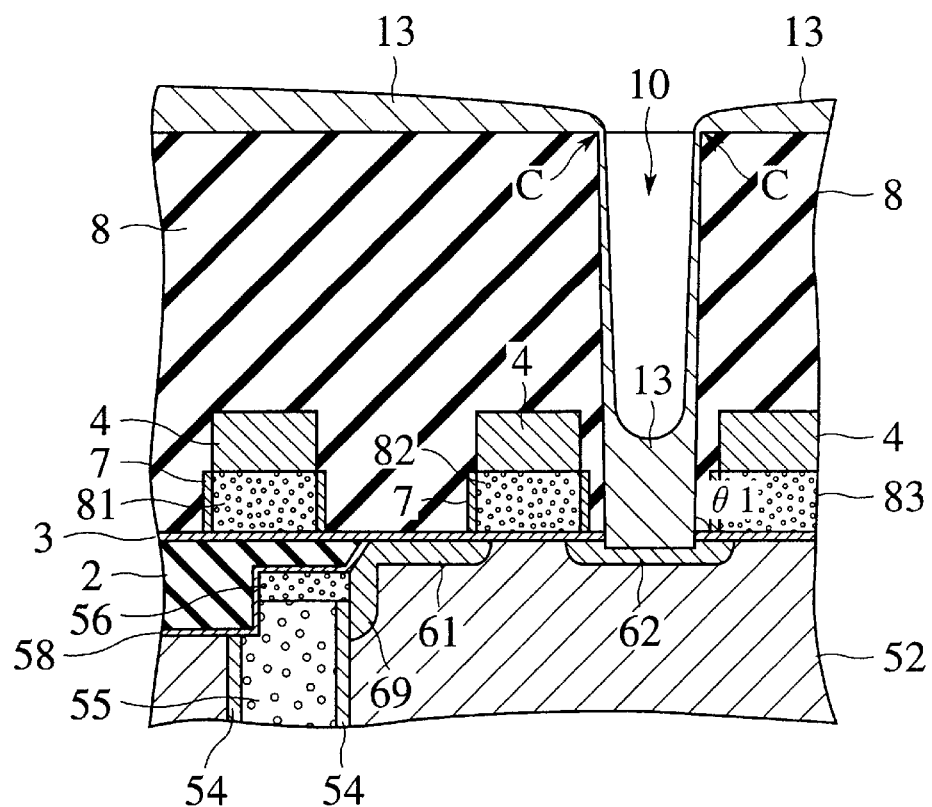
Figure 13B:
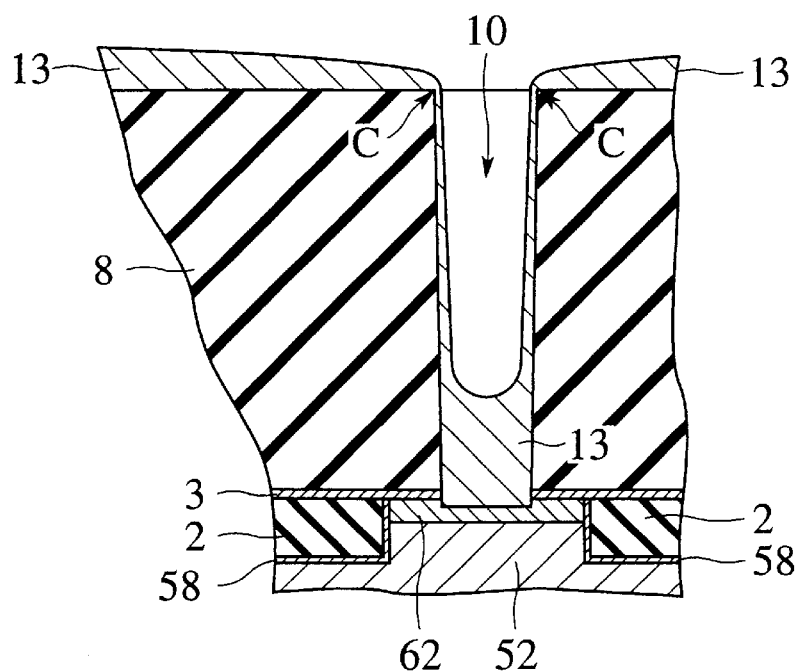

(g) Next, an auxiliary film 13 is formed on the inside wall of the contact hole 10 and on the surface of the interlayer insulating film 8. This auxiliary film 13 is desirable to be an organic layer formed by spin-coating of the layer of a liquid organic material on the inside wall of the contact hole and on the surface of the interlayer insulating film. Spin-coating of the layer of a liquid organic material is usually done by placing a viscous liquid organic material on a wafer similarly to resist and by rotating the substrate. Hence, the liquid organic material film flow into the contact hole 10 and shoulder portion thereof "C" becomes very thin. Viscosity of the liquid organic material film is chosen as for example, about 3 to 10 mPa.s and the spin-coating may be done at a rotating speed of 1500 to 4000 rpm. Desirable example of this liquid organic material film is for example, an antireflection coating material composed of organic solution, acrylic polymer and an absorbent substance (optical absorber). When the acrylic polymer has an absorbing component, the optical absorber is not needed. FIGS. 13A and 13B are the cross-sectional views corresponding to the I—I and II—II directions of FIG. 12A, respectively. Similarly, FIGS. 14A, 15A, 16A, 17A and 18A are the cross-sectional views corresponding to the I—I direction and FIGS. 14B, 15B, 16B, 17B and 18B are those corresponding to the II—II direction of FIG. 12.

Figure 14A:
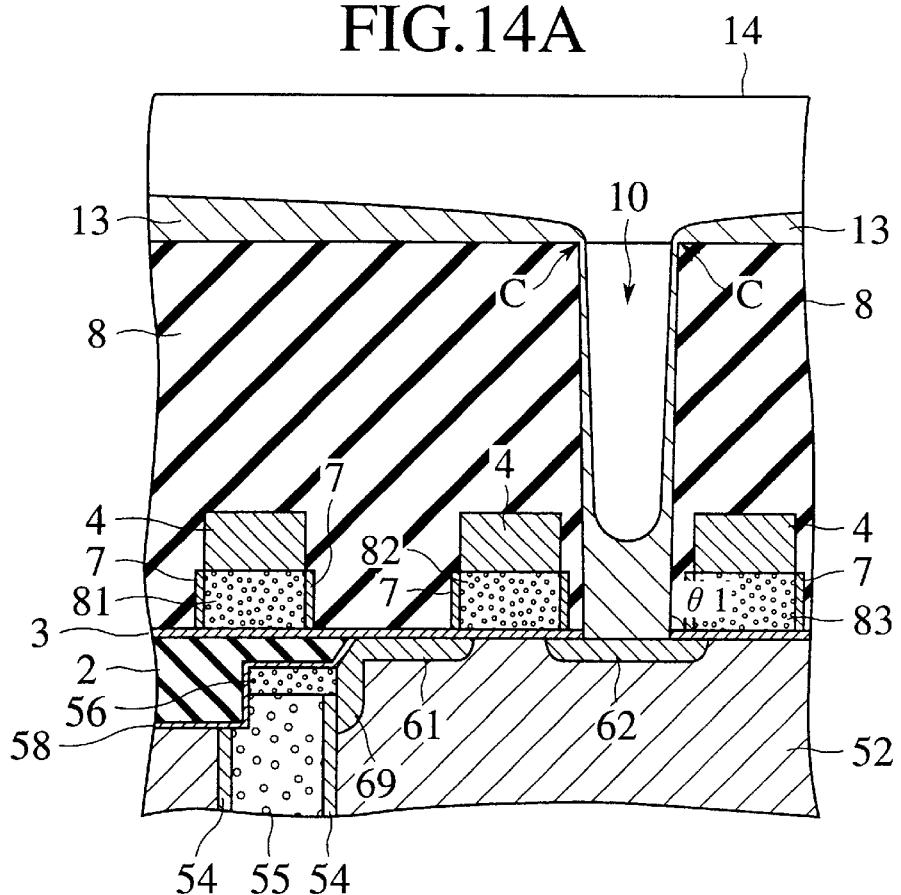
Figure 14B:
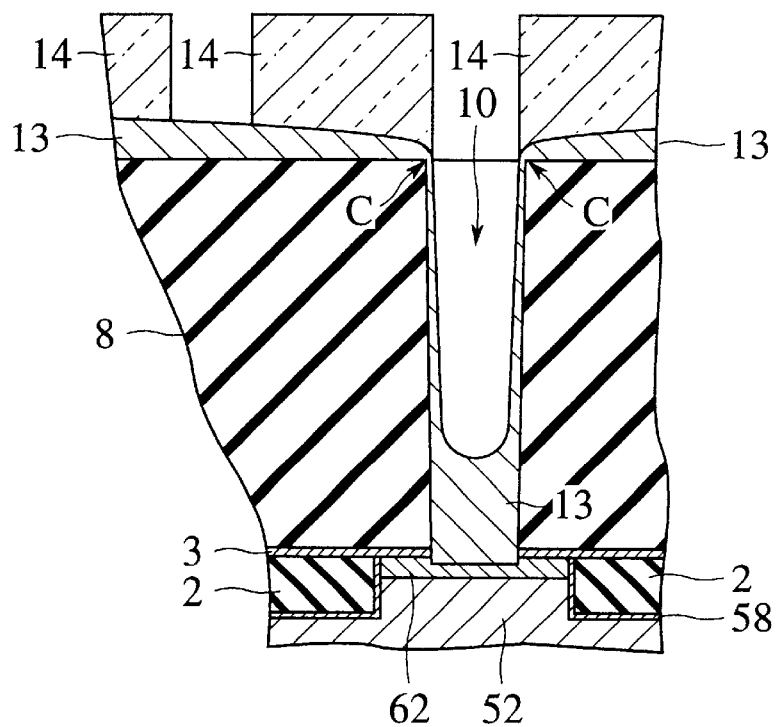
Figure 15A:
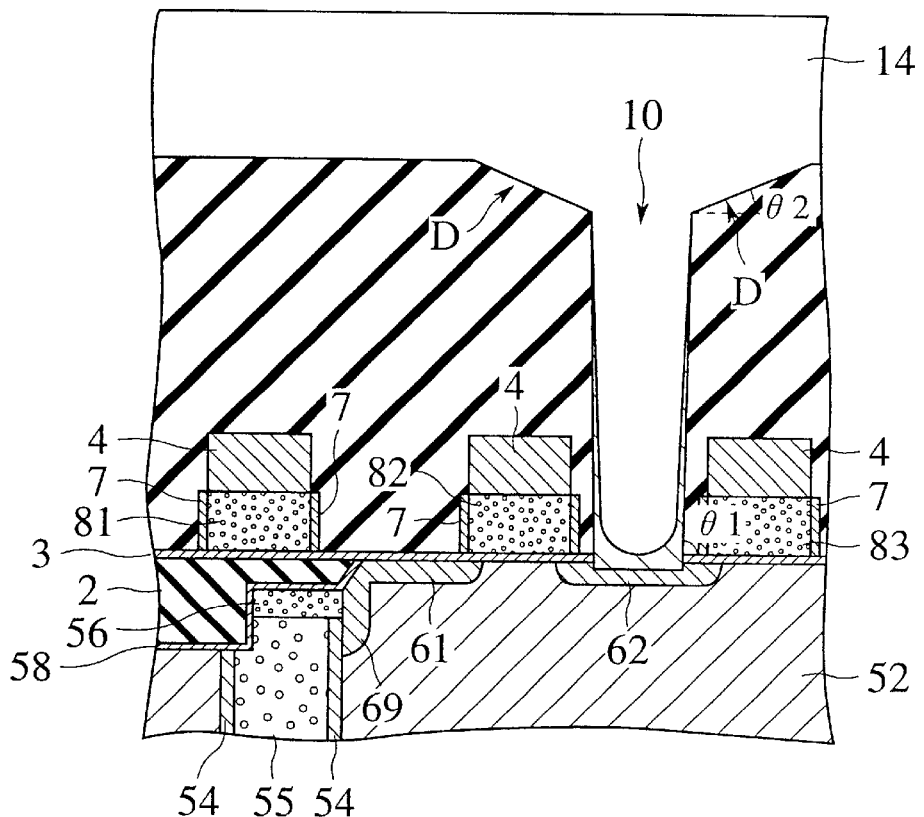
Figure 15B:
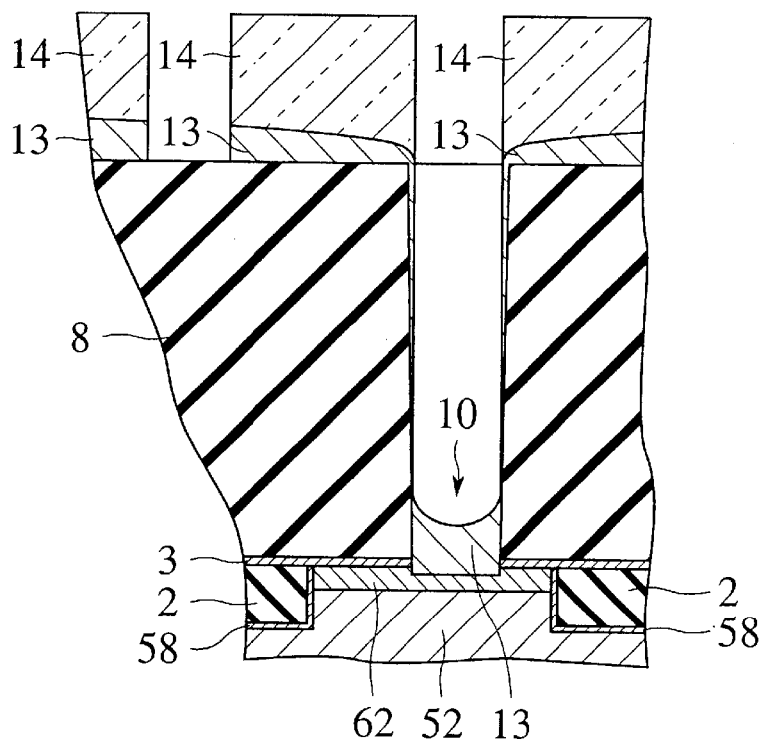

(h) Successively, the resist 14 is spin-coated over the surface and the surface of the resist 14 is exposed using a certain photo-mask (or reticle) to form an etching mask to dig the grooves of the bit lines at desired positions. After exposure, development and rinse are performed to make an etching mask made from resist 14 as shown in FIGS. 14A and 14B. The organic layer 13 is dry-etched using this etching mask made from resist 14. In this case, the dry-etching is done using a mixture of gasses of $CF_4$, $O_2$, Ar or another gas, until organic layer 13 on the insulating film surface 8 are all removed. Usually, the etching is performed until it becomes somewhat over-etched. At this time, the thin shoulder "C" of the contact hole 10 is etched in the beginning only in the direction of the bit line as shown in FIG. 15A. Hence, the insulating film 8 moves back only in the portion "D" in FIG. 15A. Since ratio of the etching rate of organic layer 13 and insulating film 8 is about 1 to 2, the shoulder "D" of the above-mentioned contact hole is more removed. This means that the taper angle θ2 is smaller than θ1 (for example, 25°<θ2<45°) and that the diameter of the above-mentioned connecting surface is anisotropically grown only in the direction of the bit line. On one hand, the shoulder of the contact hole 10 in II—II direction (gate electrode direction) is not etched as it is covered by the resist 14 so that growth of the hole diameter in the gate electrode direction does not occur. This means that the short-circuiting between the neighboring bit lines and the contact hole can be avoided even if gap between the bit lines is narrow.

Figure 16A:
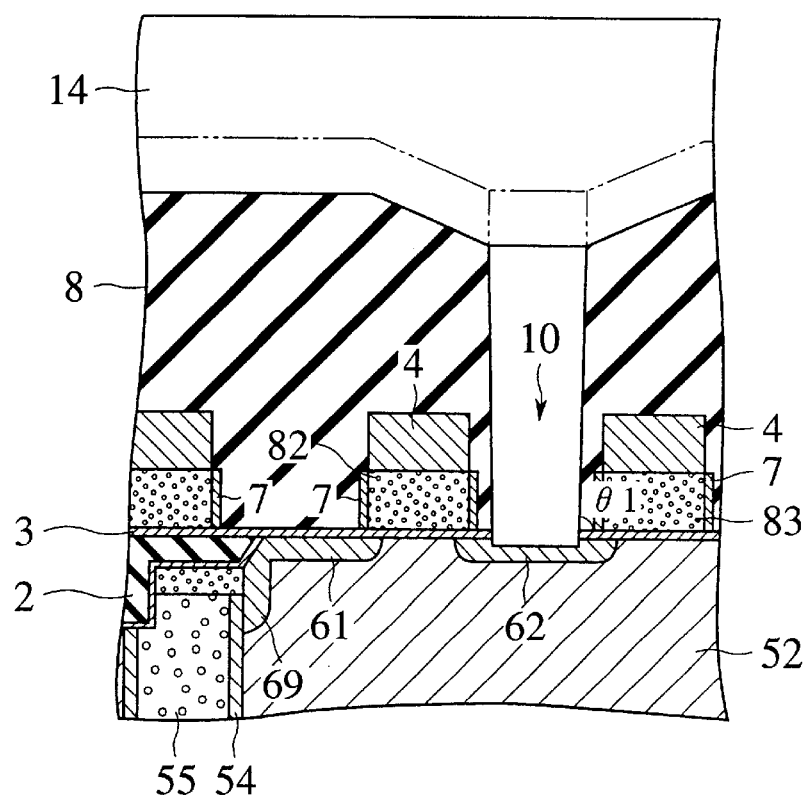
Figure 16B:
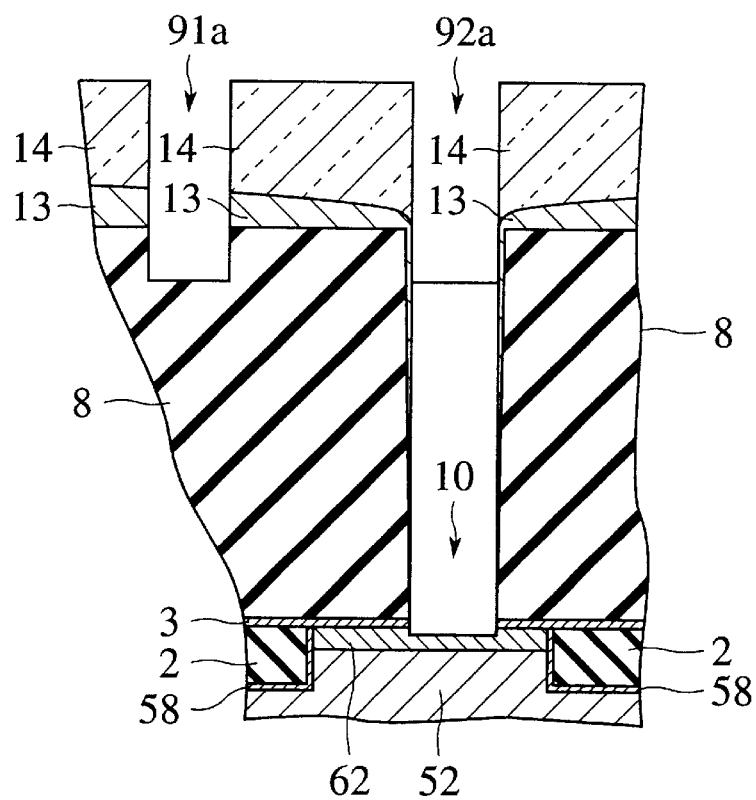

(i) Successively, in order to form the bit lines 91, 92 and 93, the grooves 91a and 92a are formed by dry-etching of the insulating film 8 into a desired depth using the resist 14 as an etching mask as shown in FIGS. 16A and 16B. The "desired depth" is for example, about 150 to 350 nm.

Thereafter, the resist 14 and the organic layer 13 remaining in the contact hole 10 are removed. If necessary, impurity concentration on the surface of semiconductor region is increased by diffusing the impurity again to decrease the contact resistance. Thus the contact hole 10 diameter of which is increased in the direction of the above-mentioned bit line groove 92a is formed without increasing the diameter in the direction of the gate electrodes (the word lines) 81, 82 and 83.

Figure 17A:
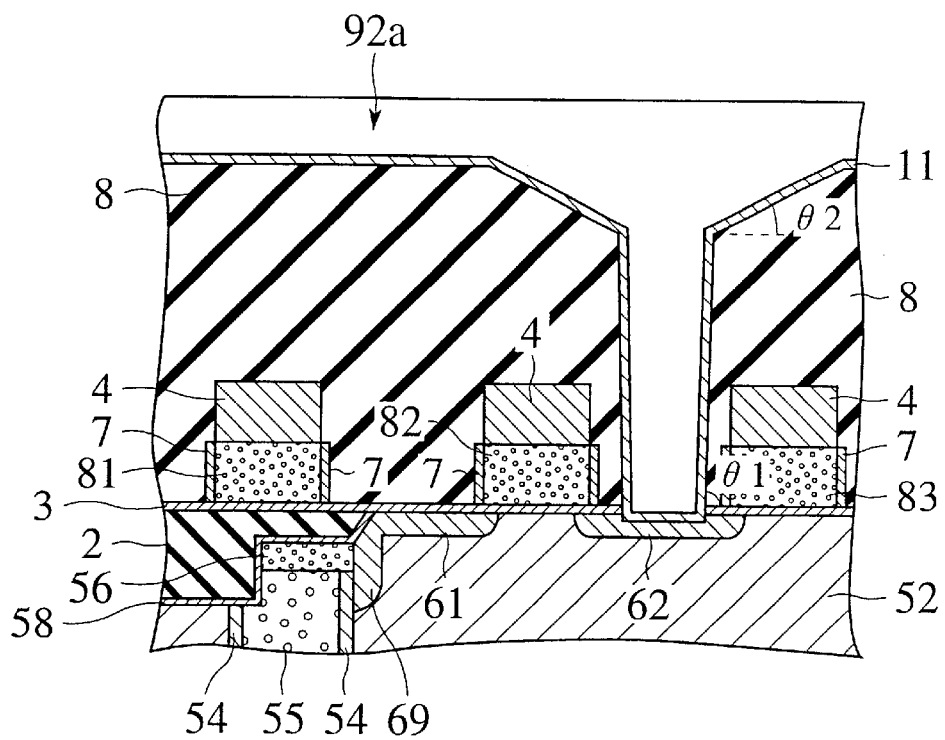
Figure 17B:
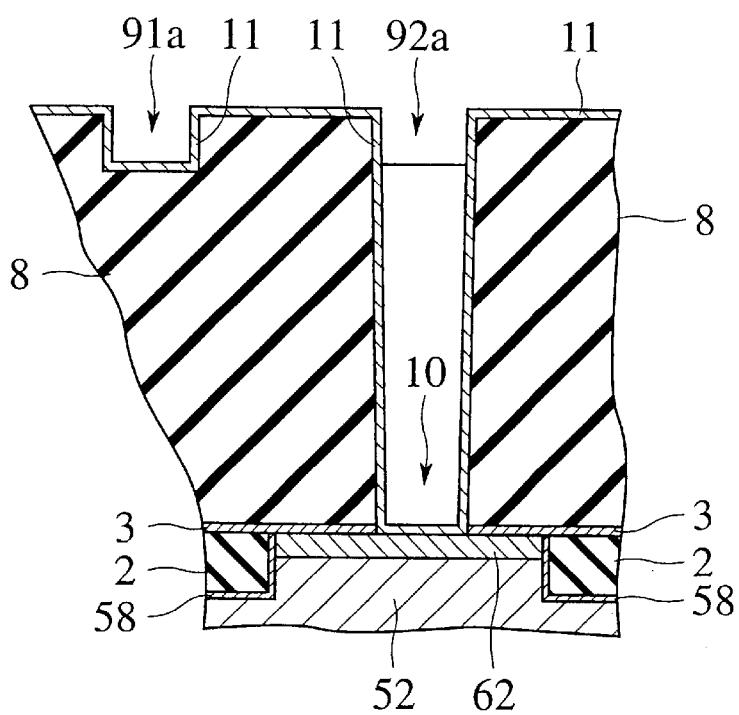
Figure 18A:
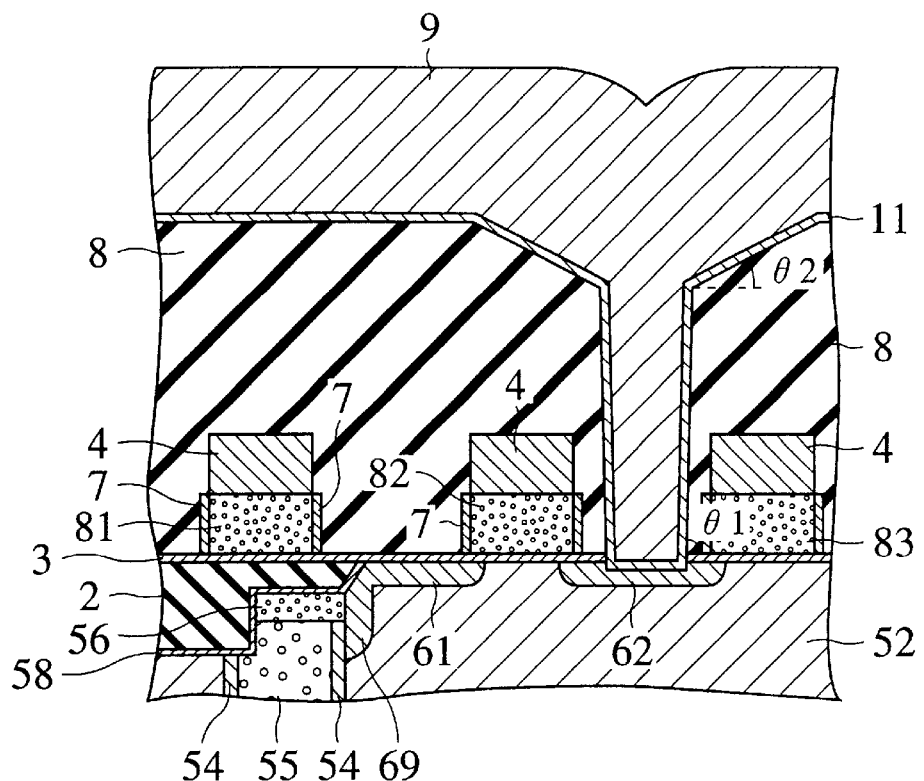
Figure 18B:
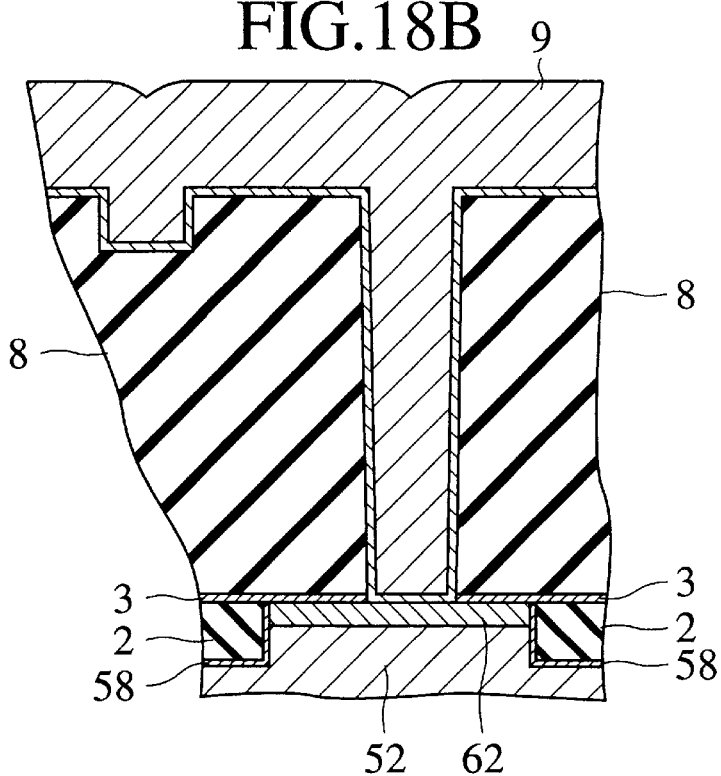

(j) Next, the barrier metal film 11, typically for example, Ti/TiN laminated film, is deposited by 10 to 50 nm as shown in FIGS. 17A and 17B. Here, the barrier metal film 11 is deposited nearly uniformly owing to the facts that the shoulder "D" of the contact hole 10 disappears by the recession of the insulating film and that the taper angle θ2 is sufficiently smaller than θ1 and that the hole diameter is large in the direction of the above-mentioned bit line groove 92a. Successively, the tungsten film 9 is buried as shown in FIGS. 18A and 18B. In this case the tungsten film 9 is also buried uniformly, owing to anisotropic growth of the shape of the upper portion on the connecting surface of the contact hole 10. Thus, both bit line groove and contact hole are buried uniformly by a same conductive film. Finally, after a flattening using the CMP method, the DRAM structure according to the first embodiment of the present invention shown in FIGS. 6A–6B is completed.

The conductive film 9 used for DRAM according to the first embodiment of the present invention is not limited to tungsten but also for example, Al, Al—Si, and Al—Si—Cu can be used. The contact plug 12 and the interconnections 91, 92 and 93 can be either the same material or different ones. For example, it is possible to use a different contact plug material from the bit line material for the DRAM memory cell portion, while using the same contact plug material as the interconnection material for the peripheral circuits.

Further, the above-mentioned interlayer insulating film 8 is not limited to BPSG but PSG and undoped $SiO_2$ layer can also be used.

SECOND EMBODIMENT

Figure 19A:
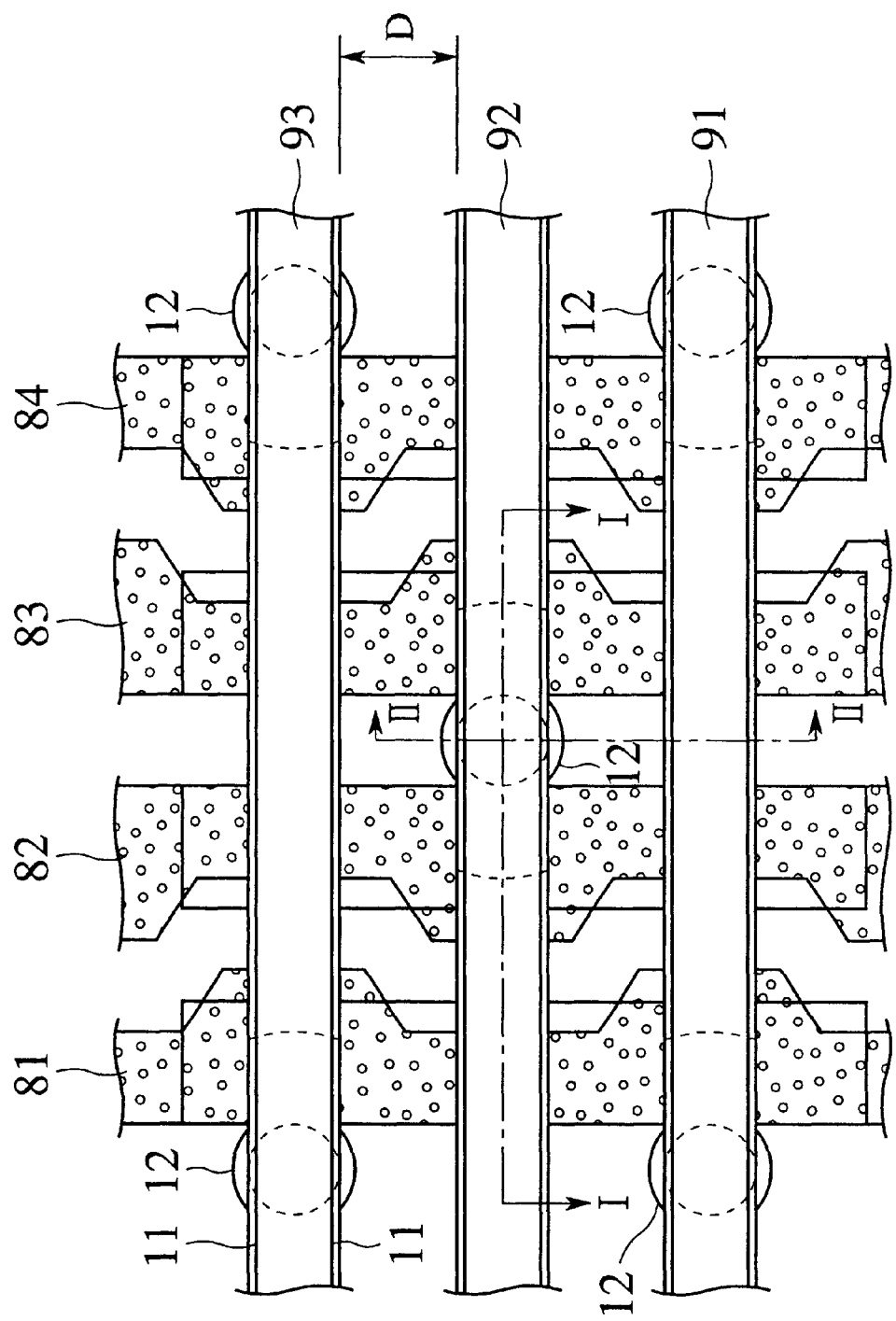
FIGS. 19A 19B are top plain view of a DRAM according to the second embodiment of the present invention.
Figure 19B:
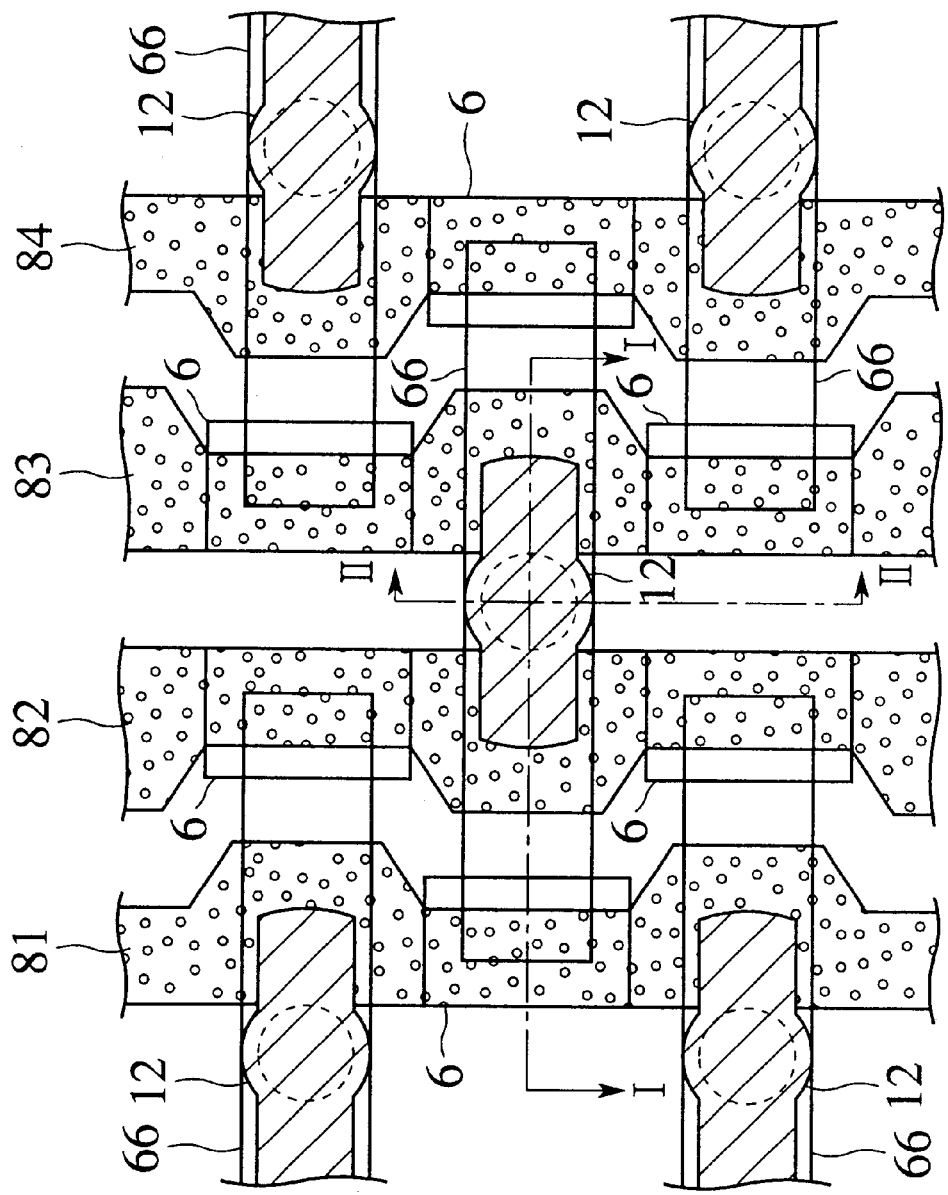
Figure 19C:
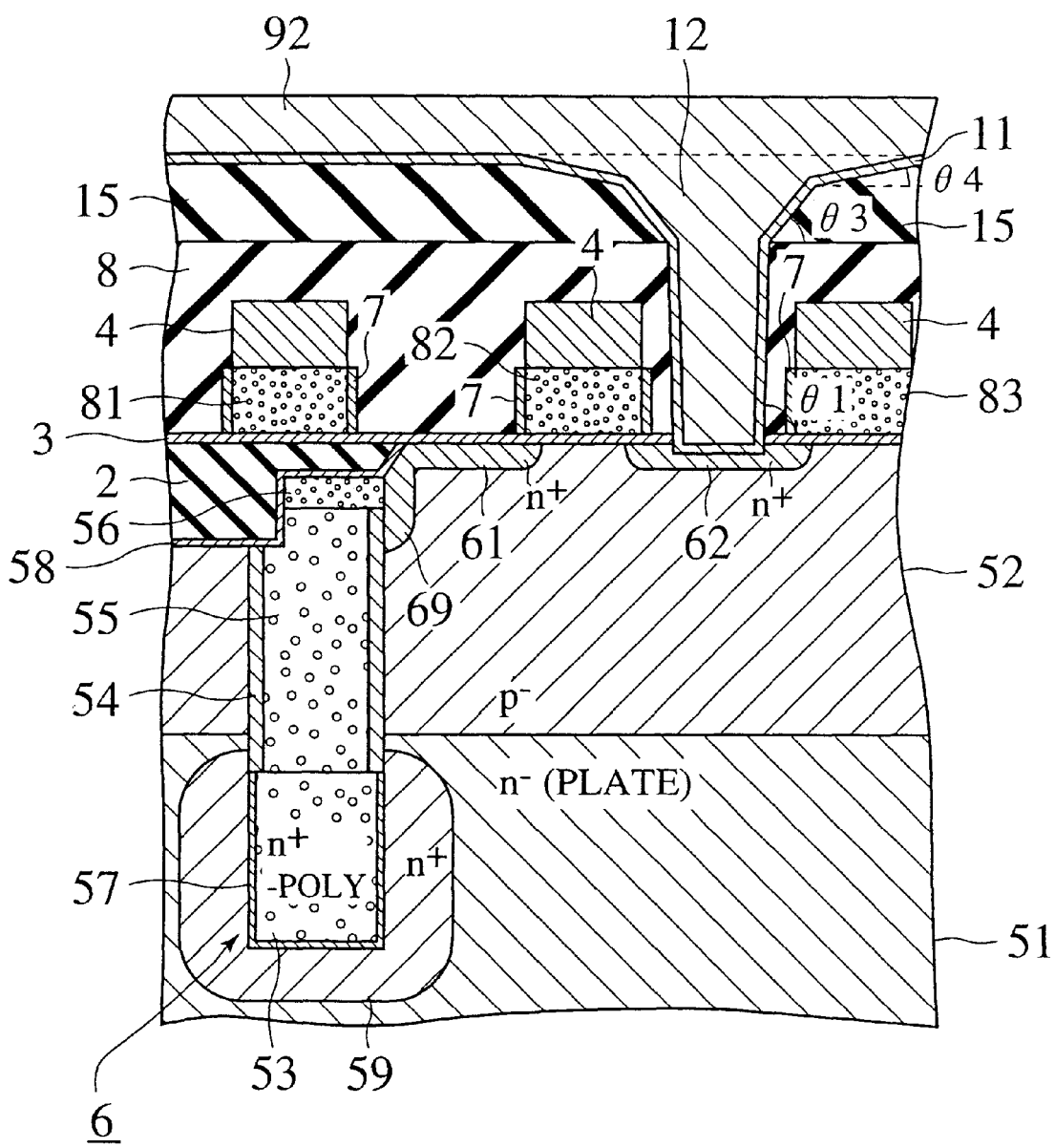
FIG. 19C is a cross-sectional view along the I—I direction of FIG. 19A.
Figure 19D:
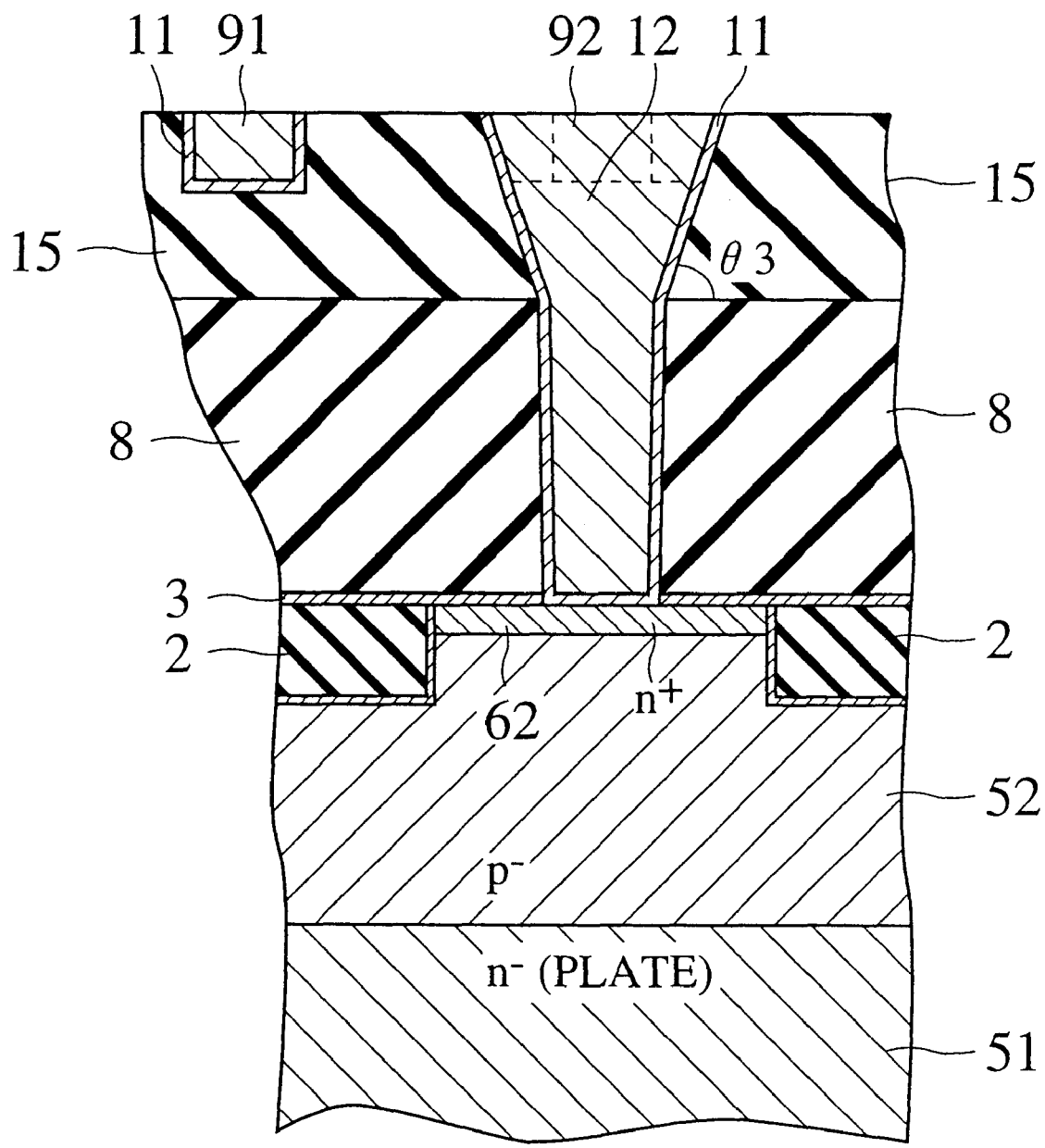
FIG. 19D is a cross-sectional view along the II—II direction of FIG. 19A.

FIGS. 19A and 19B show top plan views of a DRAM according to a second embodiment of the present invention. In FIG. 19B, the top layer bit lines have been omitted in order to illustrate the shape of the contact plugs 12 and active areas 66. FIG. 19C is a cross-sectional view along the I—I direction of FIG. 19A; FIG. 19D, a cross-sectional view along the II—II direction of FIG. 19A As FIG. 19C shows, the DRAM of the second embodiment of the present invention comprises an $n^-$ buried layer 51, which is used as a plate layer, provided on a p-type (100) silicon substrate (not shown in the diagram), and a DRAM unit cell access transistor which is provided on the surface of a p-well 52 above the plate layer. The p-well 52 is surrounded by an insulating film 2, comprising silicon oxide ($SiO_2$) or the like, for isolating the elements, formed by a method such as STI method, the inner portion thereof forming an active area (in FIG. 19B, the extent of these active areas is indicated by rectangles 66). An $n^+$ source region 61 and an $n^+$ drain region 62 of the access transistor are provided on the surface of the p-well 52 inside the active area 66. The sections of the p-well 52 located between the access transistor $n^+$ source regions 61 and the $n^-$ drain regions 62 are the channel regions. Polysilicon gate electrodes 81, 82 and 83 are provided above these channel regions, with a gate oxide film 3 in between. As FIG. 19A shows, the polysilicon gate electrodes 81, 82 and 83 also serve as word lines and extend at right angles to bit lines 91, 92 and 93. Silicon nitride films ($Si_3N_4$) 4 which have roughly the same dimensions as the polysilicon gate electrodes 81, 82 and 83 are deposited thereupon. And, thin silicon oxide ($SiO_2$) films 7 are provided on the side walls of the polysilicon gate electrodes 81, 82 and 83. Furthermore, first interlayer insulating film 8, comprising BPSG or the like, and second interlayer insulating film 15, comprising $SiO_2$ or the like, are deposited above the polysilicon gate electrodes 81, 82 and 83 and the silicon nitride films ($Si_3N_4$) 4. The thickness of the first interlayer insulating film 8 should be between 300 and 600 nm, and ideally around 480 nm. The thickness of the second interlayer insulating film 15 should be, for instance, between 200 and 350 nm, and ideally around 220 nm. And, bit line 92 is provided on the second interlayer insulating film 15.

As FIG. 19C shows, a contact plug 12 having a first tapered portion with a taper angle θ3, starting from the interface between the first interlayer insulating film 8 and the second interlayer insulating film 15, and a second tapered portion with a taper angle θ4, starting from a point within the second interlayer insulating film 15, is provided on top of the $n^+$ drain region 62. The contact plug 12 is connected to bit line 92. The diameter of the contact hole 10 at the base (bottom) should be between approximately 0.15 to 0.5 μm, and ideally around 0.3 μm. The first tapered portion is an isotropic circle with respect to the axis of the contact plug 12. By contrast, the second tapered portion is anisotropically shaped with respect to the axis of the contact plug 12. In correspondence therewith, the upper portion of the contact hole is anisotropically chamfered to a taper angle θ4, while the bottom portion is chamfered isotropically to a taper angle θ3.

Consequently, the face of the contact plug 12 which connects to the bit line 92 is anisotropic with respect to the central axis of the contact plug 12. "Anisotropic" signifies that the face of the contact plug 12 connecting with the bit line 92 extends symmetrically to the left and right only along an axis which is at a right angle to the center axis of the contact plug 12, namely along the direction of the bit line. In other words, the connecting surface of the contact plug 12 is anisotropic, having a long axis parallel to the bit line 92 and a short axis perpendicular to the bit line 92.

The anisotropic nature of the contact plug 12 can be understood if we compare the cross-sectional view along the I—I direction and that along the II—II direction of FIG. 19A. As shown in FIG. 19D, which is a cross-sectional view along the II—II direction of FIG. 19A, the p-well 52 is surrounded by an insulating film 2, and on the surface of the p-well 52 the $n^+$ drain region 62 of the access transistor are disposed. On the $n^+$ drain region 62 and the insulating film 2, a gate insulating film (gate oxide film) 3, the first interlayer insulating film 8 and the second interlayer insulating film 15 are disposed, and the bit lines 91 and 92 are arranged on the second interlayer insulating film 15. The $n^+$ drain region 62 and the bit line 92 is connected by the contact plug 12. Since, the contact plug 12 has the anisotropic shape, the second tapered portion with the taper angle θ4 depicted on FIG. 19C is not appeared on this cross-section of FIG. 19D. However, the first tapered portion is an isotropic, the taper angle θ3, starting from the interface between the first interlayer insulating film 8 and the second interlayer insulating film 15 is also observed in FIG. 19D. The width of the top end of the contact plug 12 shown in FIG. 19D is relatively short to assure a high density bit line arrangement. Namely, the growth of diameter of the contact plug 12 along the gate electrode direction due to the taper angle θ4 does not occur because the taper angle θ4 is anisotropic. And, since there is no increase in hole diameter along the direction of the word lines due to the anisotropic tapered angle θ4, shorts between adjacent bit lines and contact holes are easily prevented.

Thus, since the tapered angles θ3 and θ4 of the contact hole, namely the contact plug 12, are sufficiently smaller than the tapered angle θ1 between the bottom side wall of the contact hole and the semiconductor substrate, the thickness of the barrier metal film 11 between the contact hole side wall and the contact plug 12 has good uniformity. Consequently, the good connections between contact plug 12 and the bit lines 91, 92 and 93 are guaranteed at a small angle so that danger of open metallization ascribable to the generation of voids, gaps in the contact plug 12, or poor fillings in the contact hole can be avoided.

Furthermore, a trench is provided near to the $n^+$ source region 61. A NO film with thickness of 3 to 8 nm is provided on the inner wall of this trench as a capacitor dielectric 57. A first $n^+$ DOPOS, as a storage node electrode 55, is provided on the surface of the capacitor dielectric 57 so as to bury the trench. A refractory metal such as W, Ti or Mo, or a silicide of these ($WSi_2$, $TiSi_2$, $MoSi_2$) or the like may be used instead of this first $n^+$ DOPOS. An $n^+$ diffusion layer 59 is provided near the bottom of the trench. The DRAM storage capacitor of the second embodiment of the present invention comprises the storage node electrode 55, comprising the first $n^+$ DOPOS, the capacitor dielectric 57 and the $n^+$ diffusion layer 59 (the $n^+$ diffusion layer 59 may be regarded as a part of the n-plate electrode 51). The storage node electrode 55 of this capacitor is connected to the $n^+$ source region 61 of the access transistor by second and third $n^+$ DOPOS 55 and 56, and by a buried strap 69. A thick silicon oxide film 54 known as "collar oxide" is provided between the second $n^+$ DOPOS 55 and the p-well 52. This "collar oxide" 54 is a silicon oxide film for minimizing current leakage from the parasitic transistor which is provided between the $n^+$ source region 61 and the $n^+$ diffusion layer 59/n-plate electrode 51.

The DRAM according to the second embodiment of the present invention can be manufactured by the following processes.

(a) The n-plate 51 and the p-well 52 are formed on a p-type (100) silicon substrate, wherefore the processes of forming the element isolation region (STI region) 2, the access transistor (nMOSFET), the storage capacitor (trench capacitor) and the like are identical to those steps explained with FIGS. 7 to 10 of the first embodiment.

Figure 20:
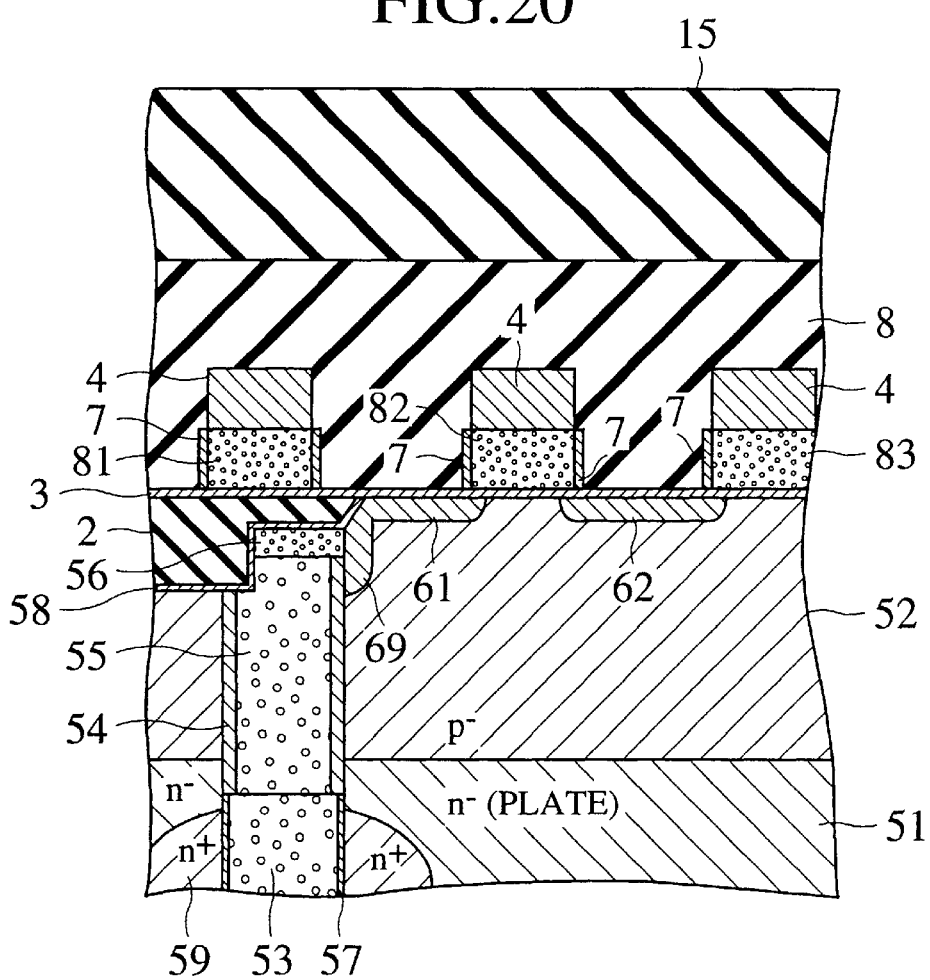
FIGS. 20, 21A–21C, 22A, 22B, 23A–23C, 24A, 24B, 25A, 25B, 26A, 26B, 27A and 27B are process flow views illustrating the fabricating method of DRAM according to the second embodiment of the present invention.

(b) Next, as FIG. 20 shows, the first interlayer insulating film 8, comprising for instance BPSG or such like, and the second interlayer insulating film 15, comprising for instance $SiO_2$ or such like, are deposited respectively. The first interlayer insulating film 8 has thickness of 300 to 600 nm, and ideally around 480 nm. The second interlayer insulating film 15 must be taller than the depth of grooves for the bit lines (to be provided subsequently), and is therefore deposited at a thickness of, for instance, 200 to 350 nm. Then, the surface of the second interlayer insulating film 15 is flattened to a predetermined thickness of, for instance, 220 nm.

Figure 21A:
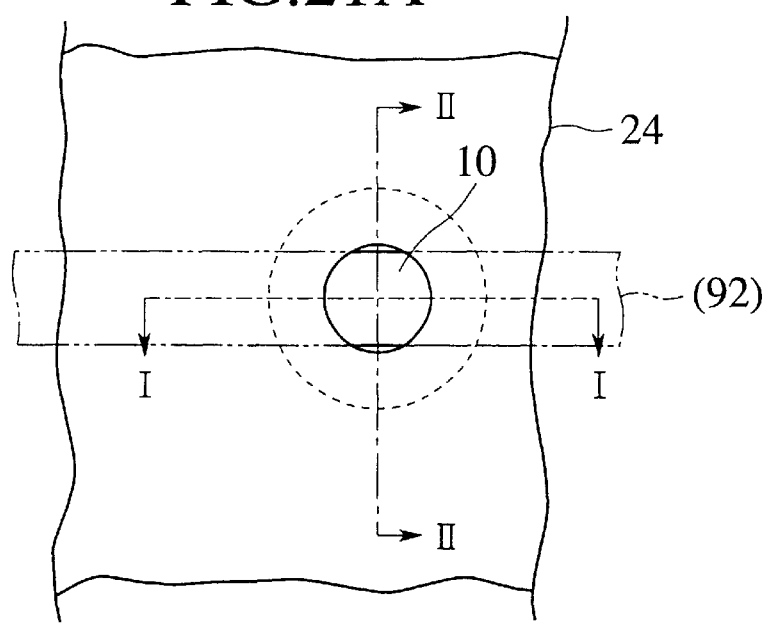
Figure 21B:
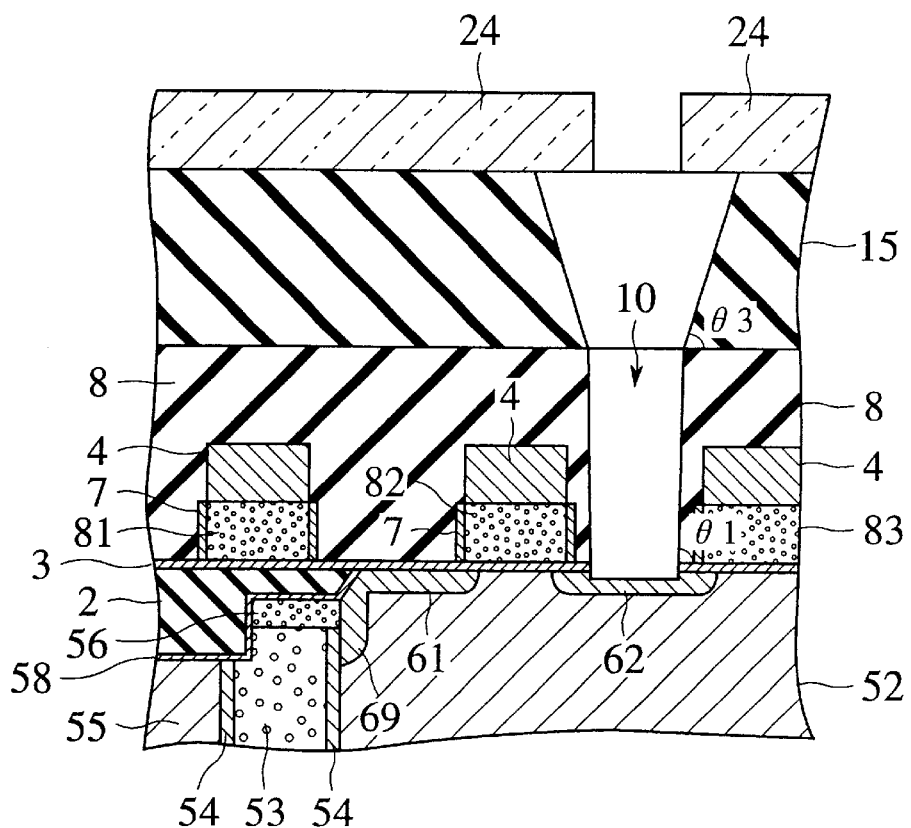
Figure 21C:
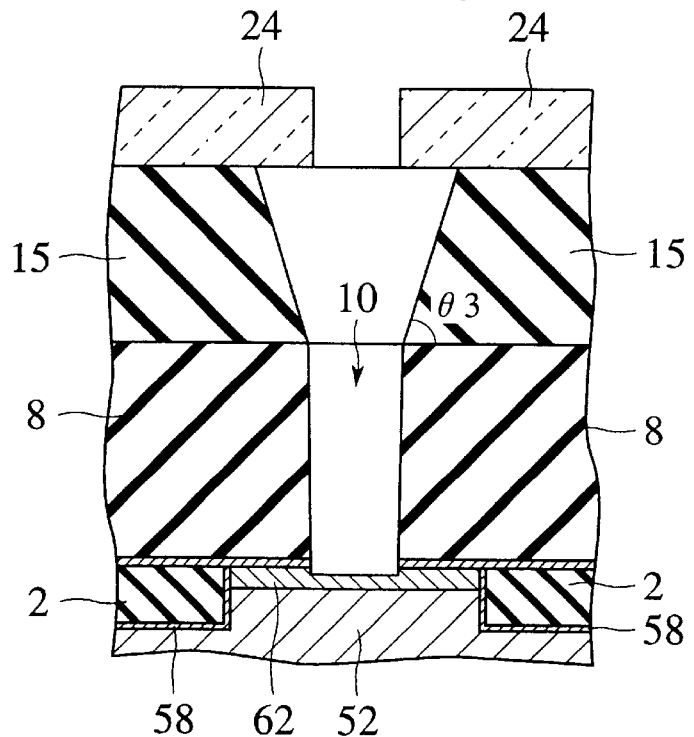

(c) Next, dry etching such as RIE is performed using the resist 24 as an etching mask and a mixed gas, such as $CF_4$, $O_2$, Ar and the like, as the etching gas. A contact hole 10, as shown in FIGS. 21A, 21B and 21C, is formed by means of this dry etching. At this point, since the first interlayer insulating film 8 and the second interlayer insulating film 15 comprise films of different types, an isotropic first tapered portion, having a taper angle θ3, is created from the interface between the first interlayer insulating film 8 and the second interlayer insulating film 15 as a result of different etching properties of the films. The taper angle θ3 is different from the angle between the lower side face of the contact hole and the substrate surface (for instance, 87°<θ1<89°, 86°<θ3<88°). But, a combination of the first interlayer insulating film 8 and the second interlayer insulating film 15 in which θ1>θ3 is selected. Then, the resist 24 is removed. FIG. 21B is a cross-sectional view taken along I—I direction of FIG. 21A, and FIG. 21C, a cross-sectional view taken along II—II direction of FIG. 21A.

Figure 22A:
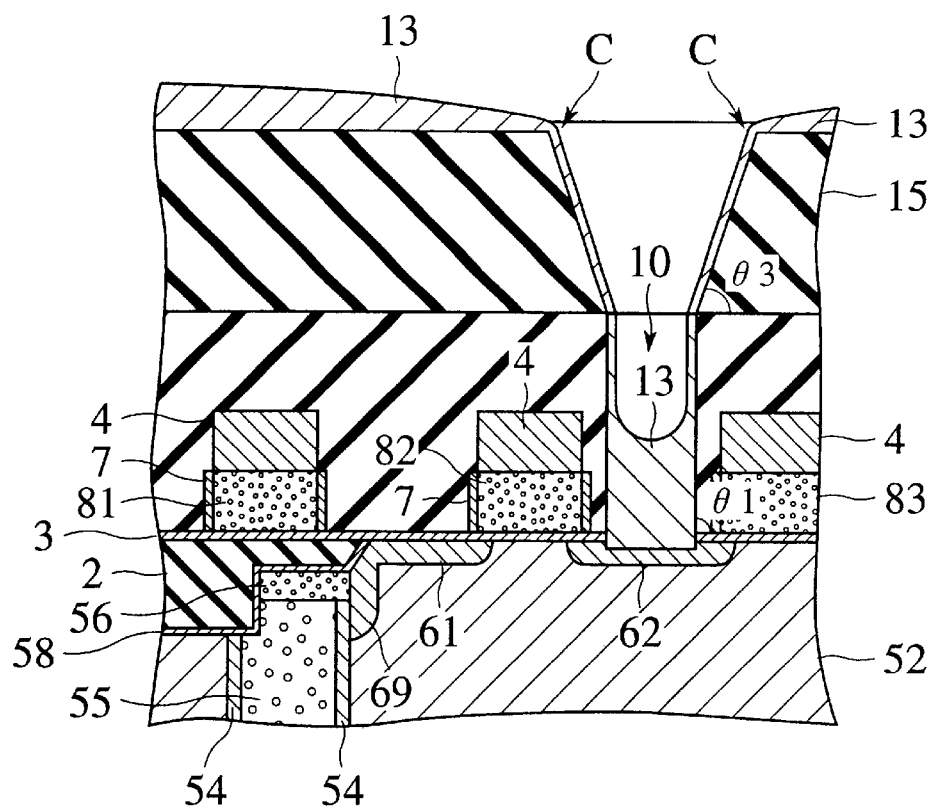
Figure 22B:
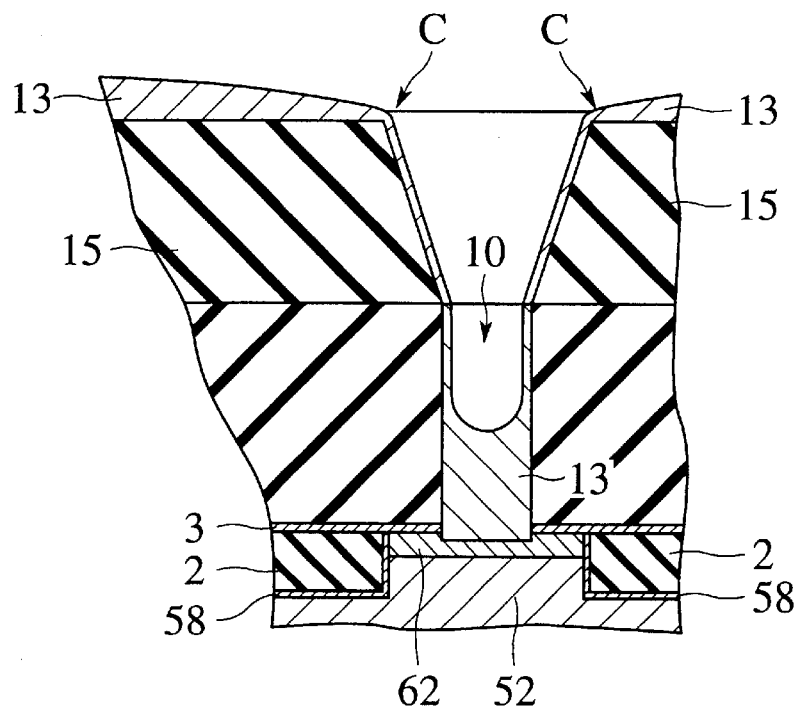

(d) Next, as FIGS. 22A and 22B illustrate, an auxiliary film 13 is deposited on the inner wall of the contact hole 10 and the surface of the second interlayer insulating film 15. Here, FIG. 22B is a cross-sectional view corresponding to I—I direction of FIG. 21B, and FIG. 22B, a cross-sectional view corresponding to II—II direction of FIG. 21A. The auxiliary film 13 should ideally comprise an organic material film which has been spin-coated with a film of liquid organic material. Due to the properties of such liquid organic material film, the film at portion "C" on the shoulders of the contact hole is extremely thin. A liquid organic material film having viscosity of approximately 3 to 10 mPa.s should be selected and deposited by spin-coating at a rotating speed of 1500 to 4000 rpm. Organic solvent, acrylic polymer and applicable antireflection coating material comprising an absorbent substance (optical absorber) are examples of suitable liquid organic material films.

Figure 23A:
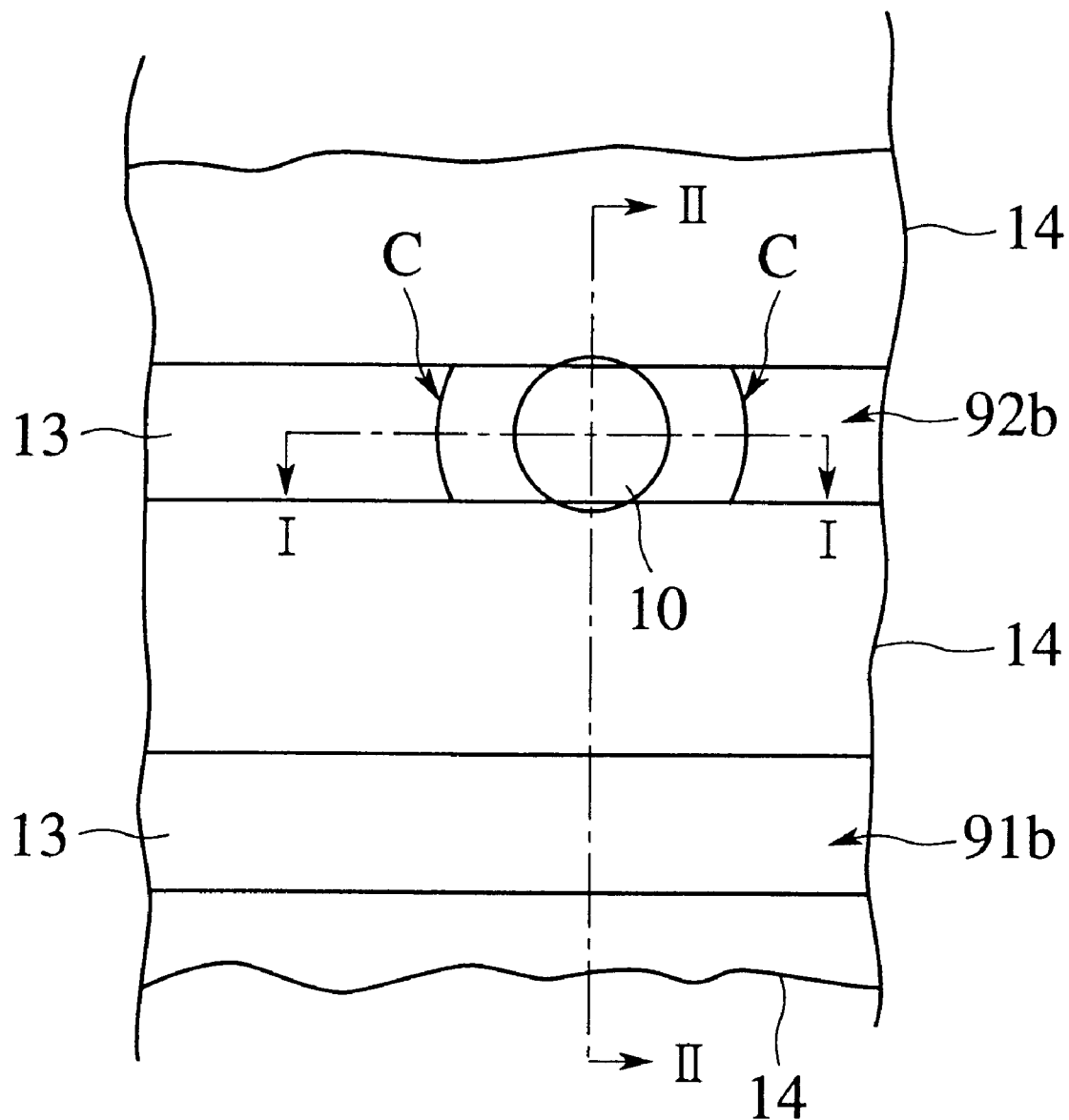
Figure 23B:
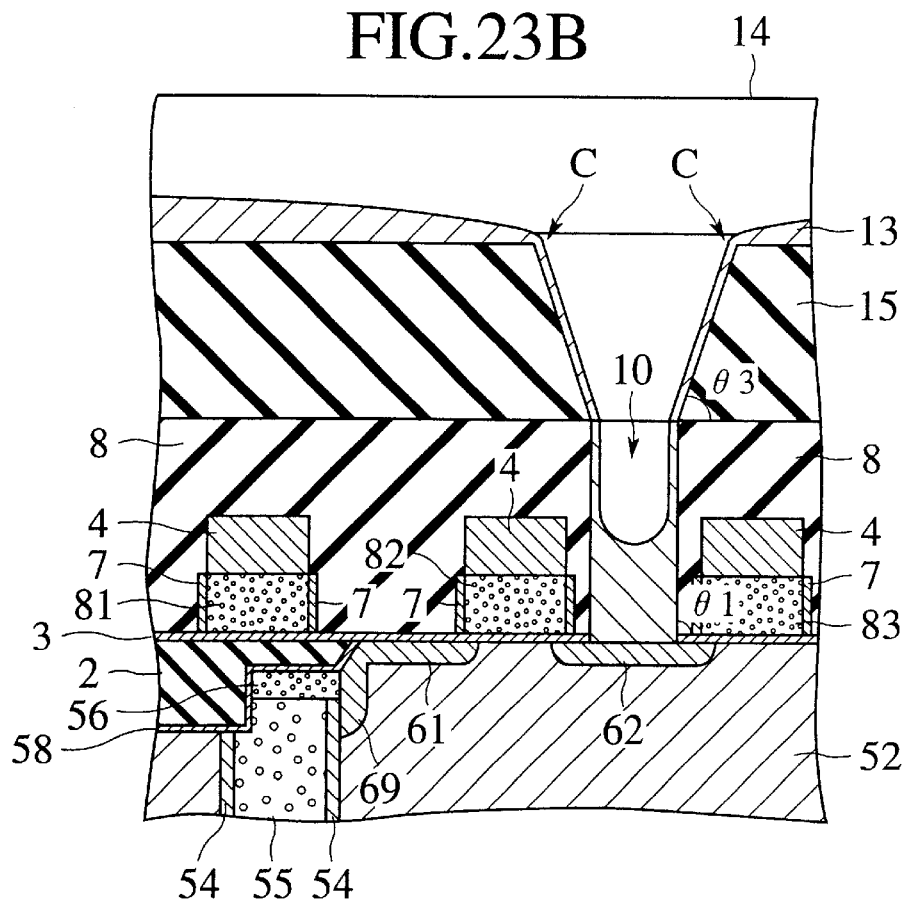
Figure 23C:
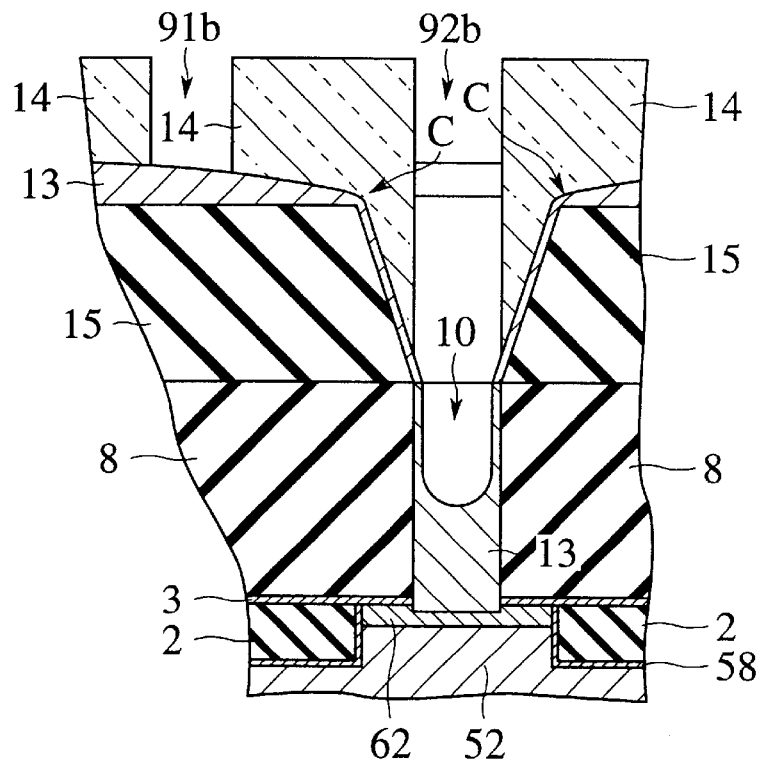

(e) Next, a resist 14 is deposited on the organic material film 13 by spin-coating. Then, as shown in FIGS. 23A, 23B and 23C, patterning is carried out by photolithography in order to form grooves for the bit lines in desired positions. FIG. 23B is a cross-sectional view taken along I—I in FIG. 23A, and FIG. 23C, a cross-sectional view taken along II—II directions of FIG. 23A. (Similarly, FIGS. 24A, 25A, 26A and 27A are cross-sectional views corresponding to I—I directions of FIG. 23A; and FIGS. 24B, 25B, 26B and 27B are cross-sectional views corresponding to II—II directions of FIG. 23A respectively.) Then, stripe-shaped windows 91b and 92b are provided in the resist 14.

Figure 24A:
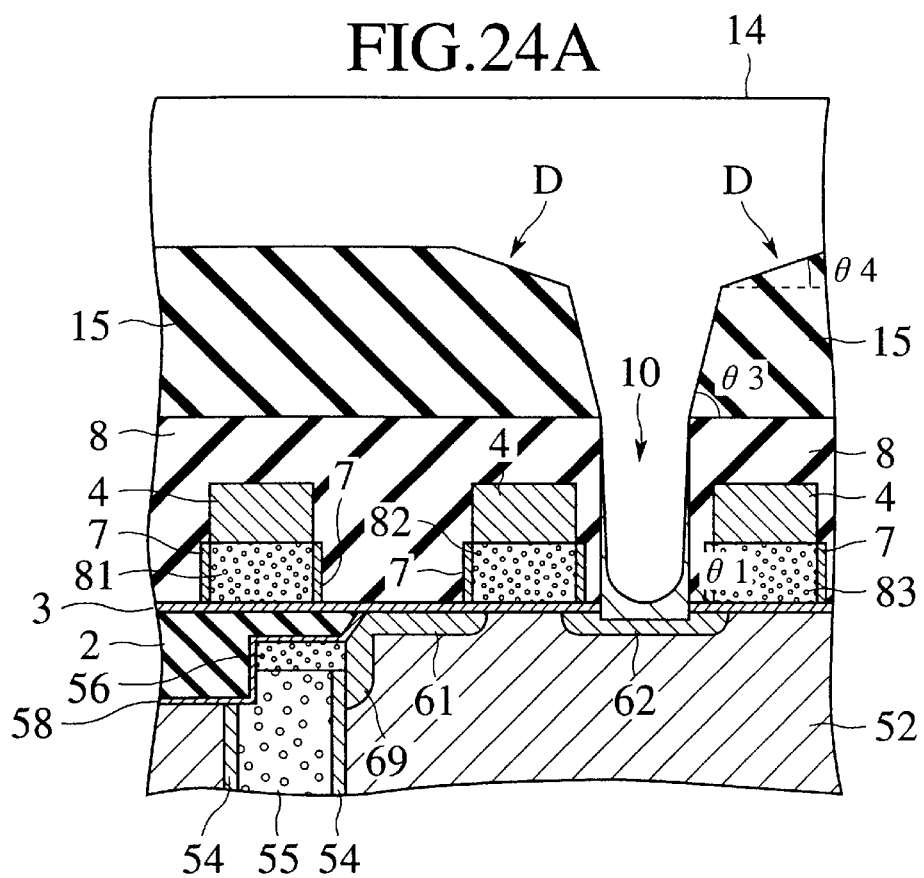
Figure 24B:
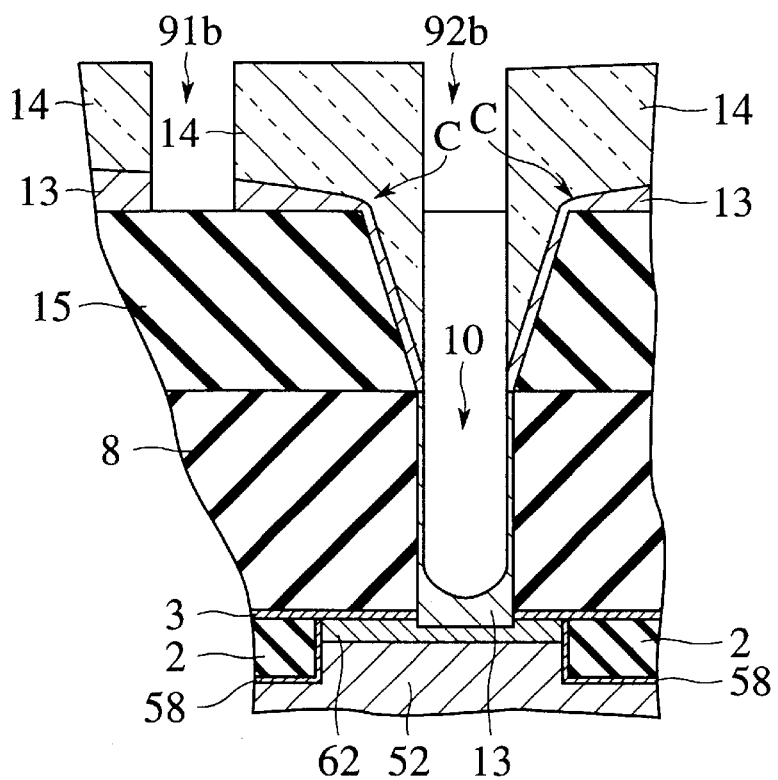

(f) The organic material film 13 is dry-etched using the resist as an etching mask. A mixed gas comprising $CF_4$, $O_2$, Ar or the like may be used as the etching gas. The organic material film is thin on the shoulders of the contact hole 10. Now, as FIG. 24A shows, firstly, only the shoulders parallel to the bit line are etched, whereby the second interlayer insulating film 15 recedes anisotropically to create a second tapered portion (shown at "D" in FIG. 24A). As in the first embodiment, this results in a third taper angle θ4 (for instance, roughly 25°<θ4<45°), and an anisotropic increase of the diameter of the connecting face of the top of the contact hole in the bit line direction only. As FIG. 24B shows, the shoulders "C" of the contact hole 10 along the direction of the word line are not affected by the etching due to their resist coating. Consequently, the diameter parallel to the word line is not increased, thereby preventing shorts between adjoining bit lines and contact holes.

Figure 25A:
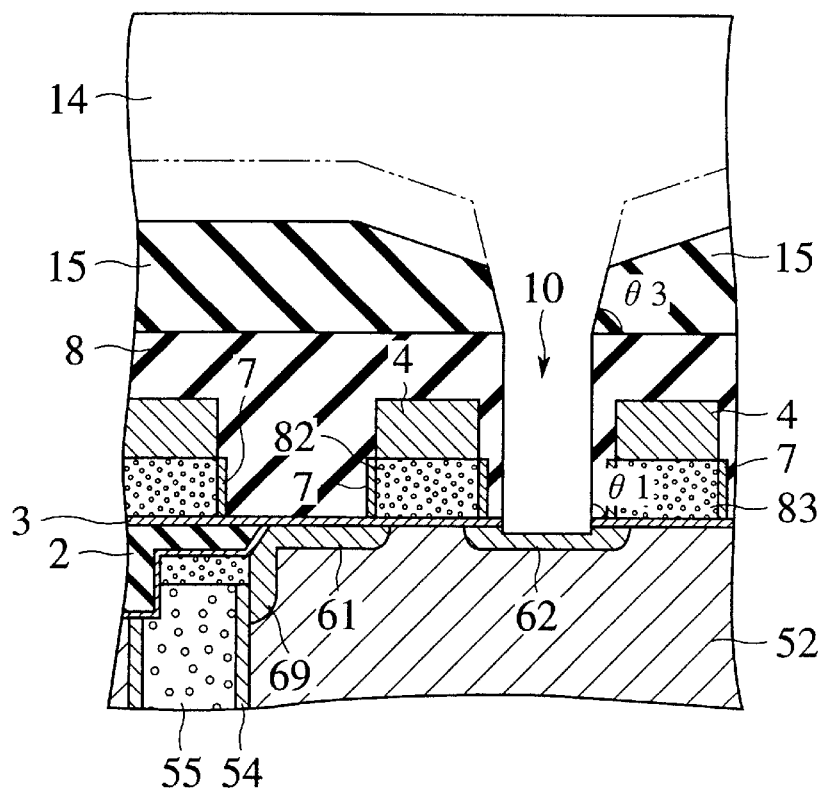
Figure 25B:
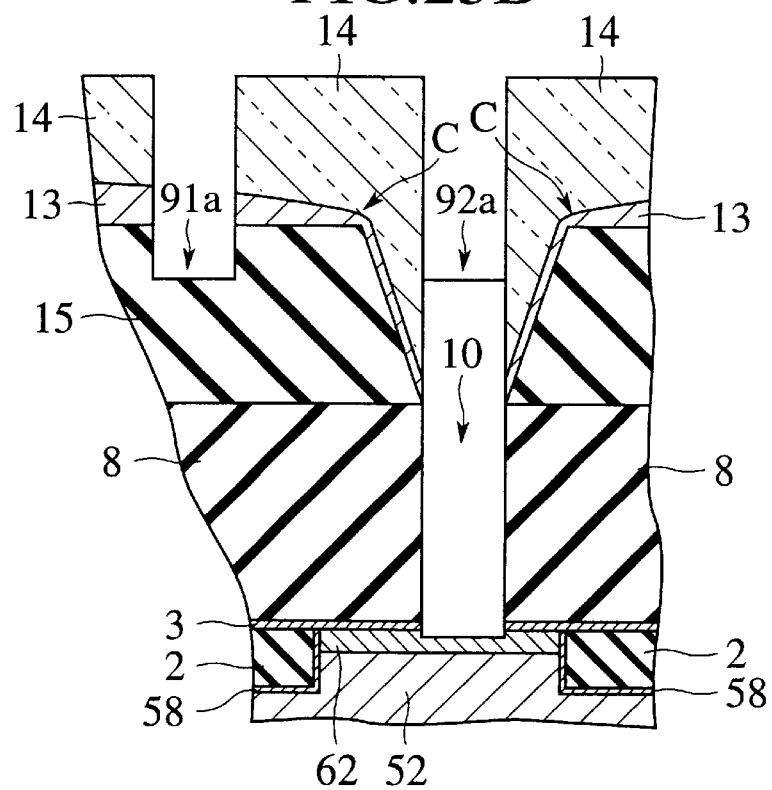

(g) Next, as FIGS. 25A and 25B show, the second interlayer insulating film 15 is dry-etched, using the resist 14 as an etching mask, to create grooves 91a and 92a of a desired depth. "Desired depth" is, for instance, 150 to 350 nm. More specifically, since the depth of the grooves 91a and 92a have a relative relation to the thickness of the second interlayer insulating film 15, when the thickness of the second interlayer insulating film 15 is for instance 220 nm, the depth of the grooves 91a and 92a should ideally be approximately 210 nm. Then, the resist 14 and the organic material film 13 remaining in the contact hole 10 are peeled away. Thus only the diameter of the contact hole 10 parallel to the bit line is anisotropically increased, while the diameter of the contact hole which is parallel to the word line remains unchanged.

Figure 26A:
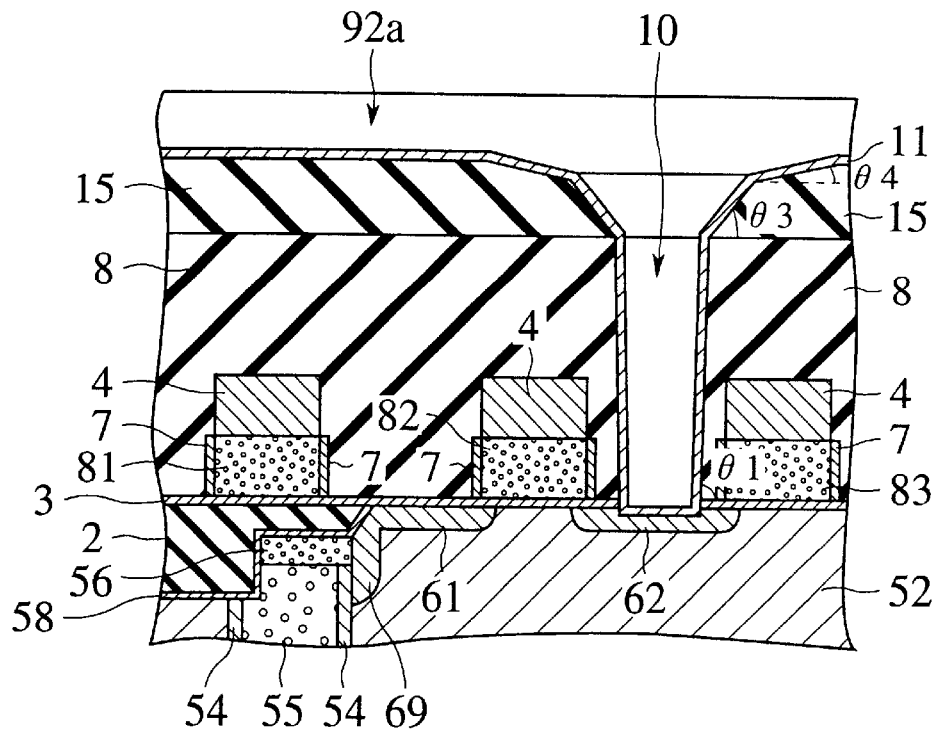
Figure 26B:
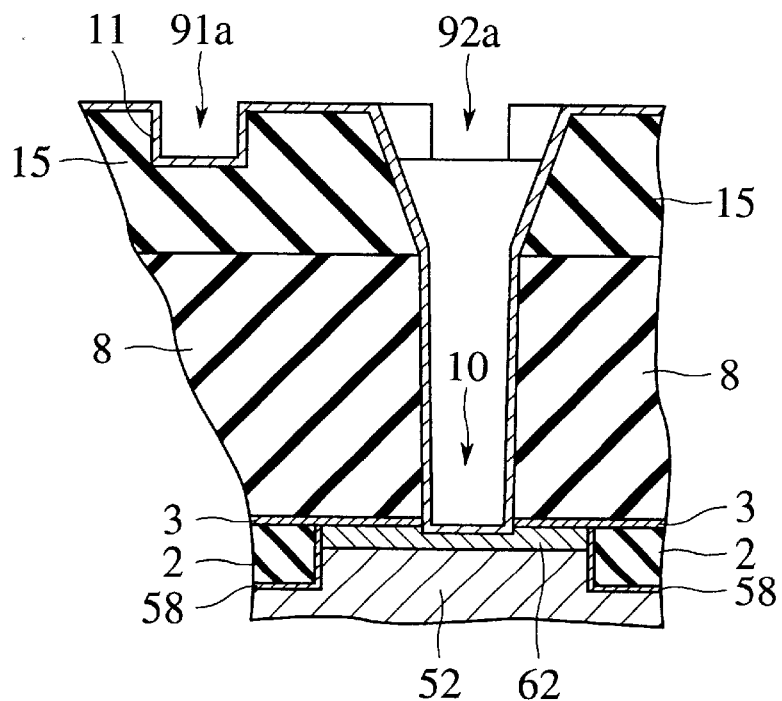

(h) Next, as FIGS. 26A and 26B show, a barrier metal film 11, such as for instance Ti/TiN laminated film, is deposited. The anisotropic recession of the second interlayer insulating film 15 smoothes the shoulders of the contact hole 10, whereby the taper angles θ3 and θ4 decrease to less than θ1. In addition, since the hole diameter widens anisotropically only in the direction of bit line groove 92a, the barrier metal film 11 can be deposited more or less evenly.

Figure 27A:
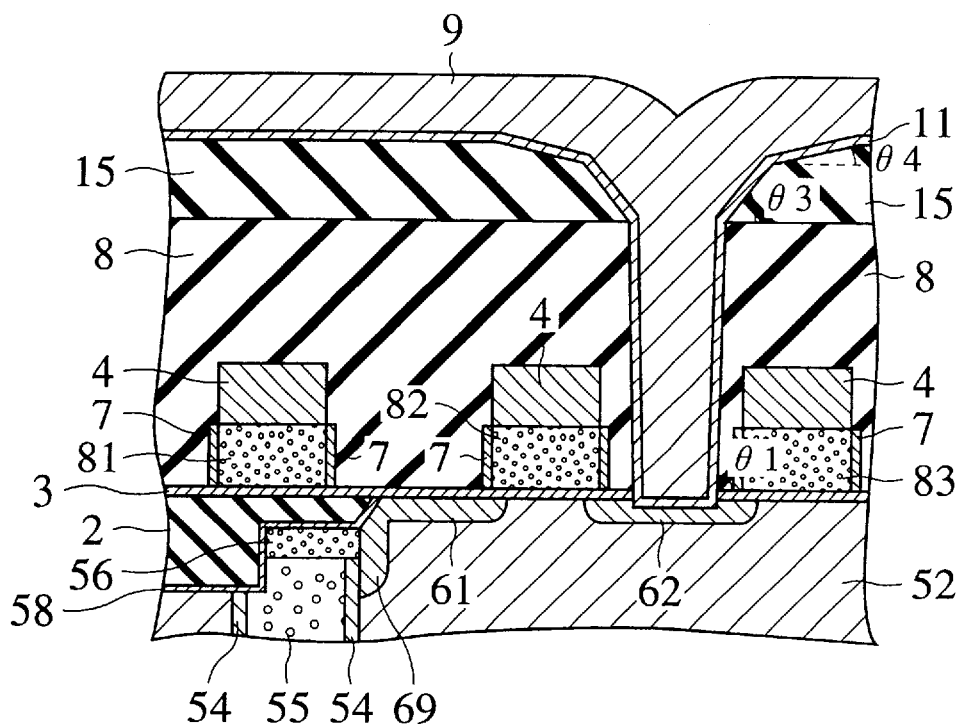
Figure 27B:
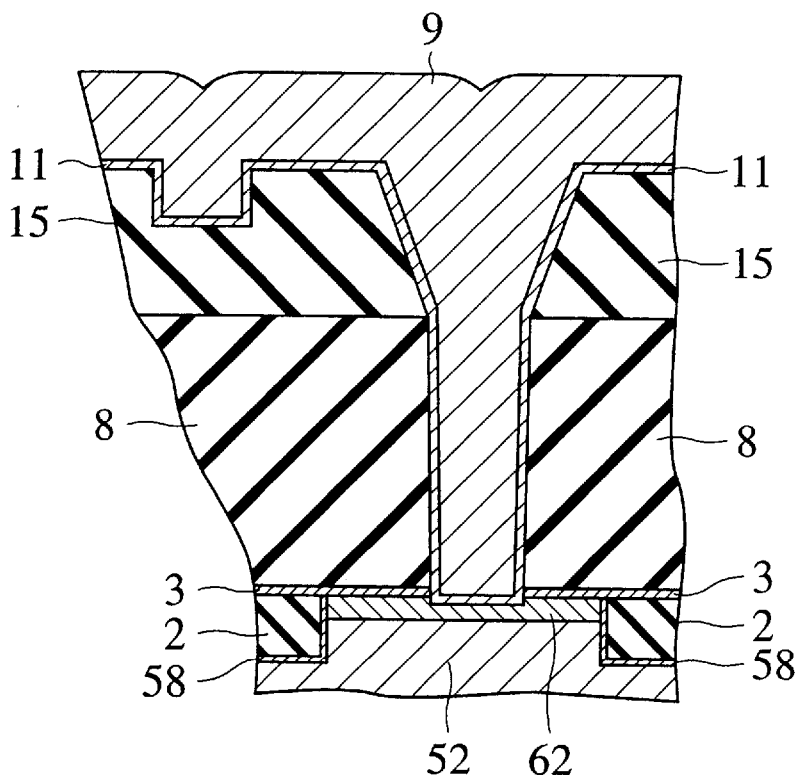

(i) Next, as FIGS. 27A and 27B show, the contact hole 10 is filled with a tungsten film 9. Since the diameter of the upper connecting portion of the contact hole 10 anisotropically increases parallel to the bit line, it is possible to fill the contact hole 10 evenly. The bit line 92 and the contact plug 12 are evenly filled in using the same conductive material (see FIGS. 19C and 19D). The process ends with flattening using the CMP method. Note that the above conductive film is not restricted to tungsten film; for instance, Al, Al—Si or AlSi—Cu film may be used instead.

The contact plug 12 and the bit lines 91, 92 and 93 may comprise identical or different materials. For instance, the DRAM memory cell portion can comprise a different material from the peripheral circuits, which are all comprised from the same material. Next, an example of a manufacturing method in a case where the contact plug 12 and the bit lines 91, 92 and 93 comprise different materials will be explained.

(a) Processes of depositing the first and second interlayer insulating films 8 and 15, forming the contact hole 10, creating the isotropic first tapered portion and providing the organic material film 13 on the inner wall of the contact hole 10 and on the surface of the second interlayer insulating film 15 are the same as illustrated above in FIGS. 22A and 22B. However, the thickness of the second interlayer insulating film 15 can be reduced by an amount equal to the thickness of the bit line; the second interlayer insulating film 15 may, for instance, have thickness of 50 to 150 nm.

Figure 28A:
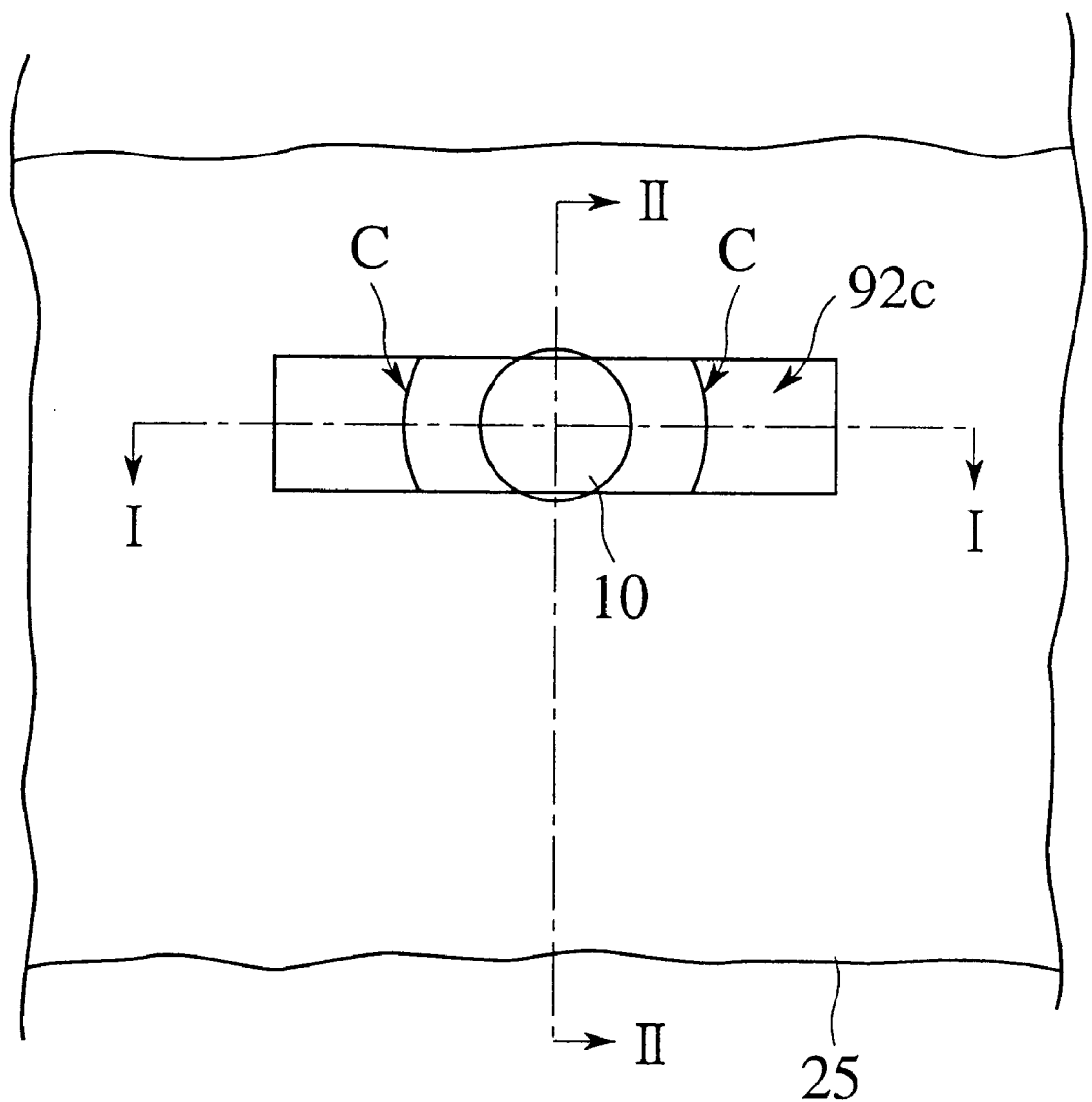
FIGS. 28A–28C, 29A, 29B, 30A, 30B 31A–31C, 32A and 32B are process flow views illustrating the fabricating method of DRAM according to an example of modification of the second embodiment of the present invention.
Figure 28B:
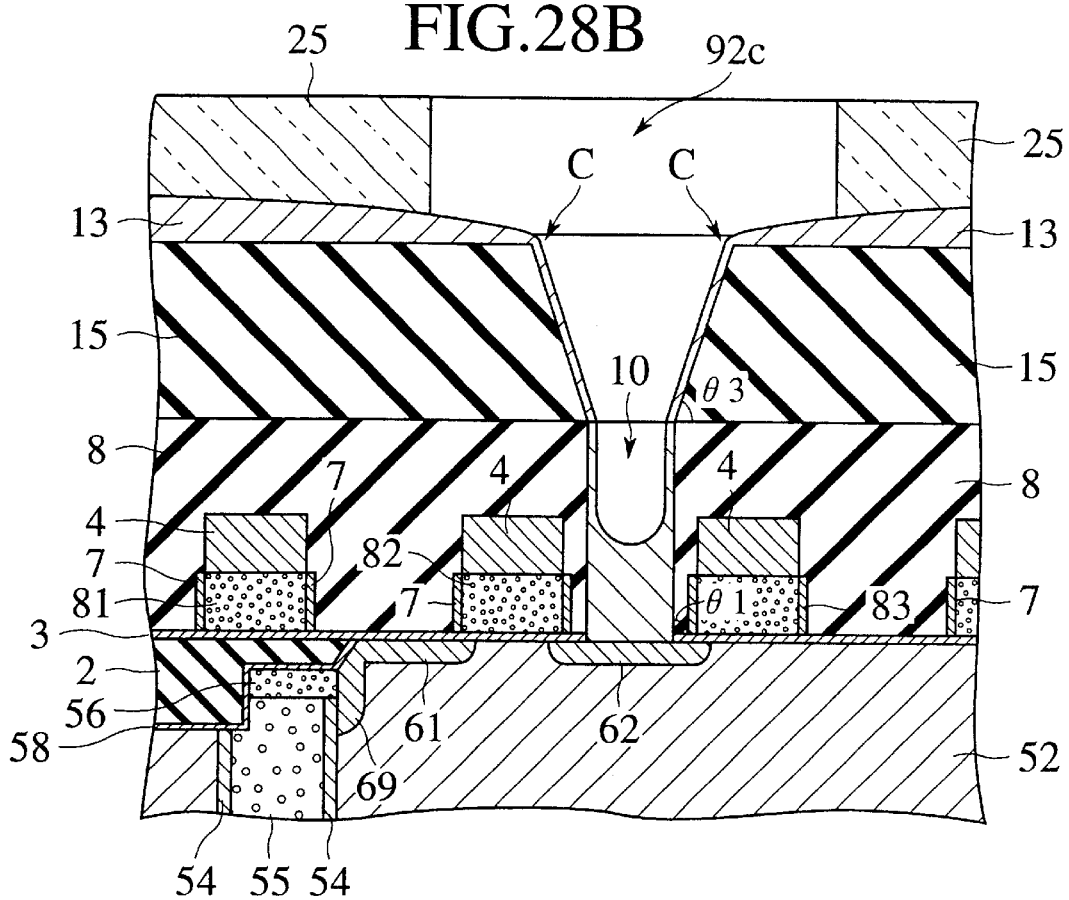
Figure 28C:
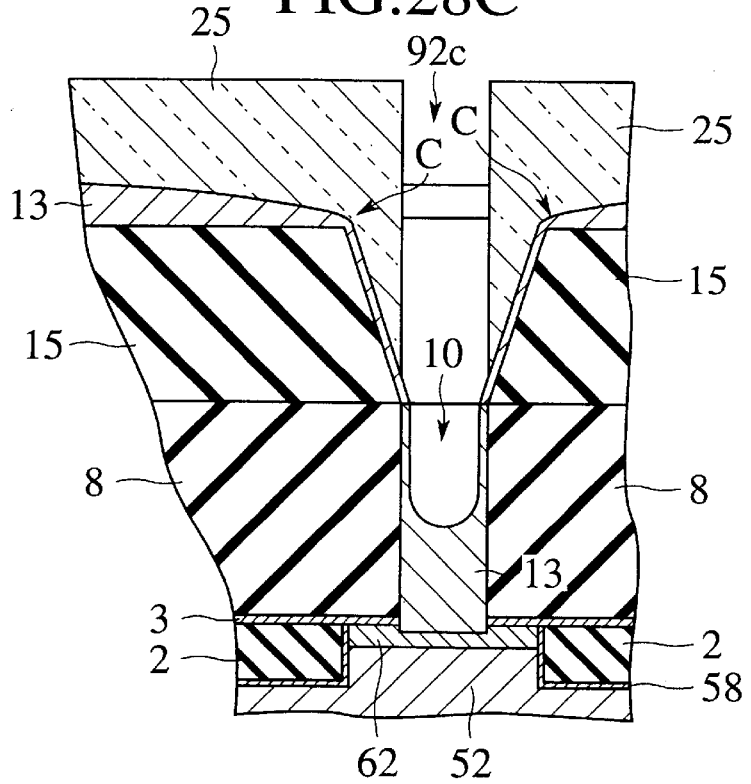
Figure 29A:
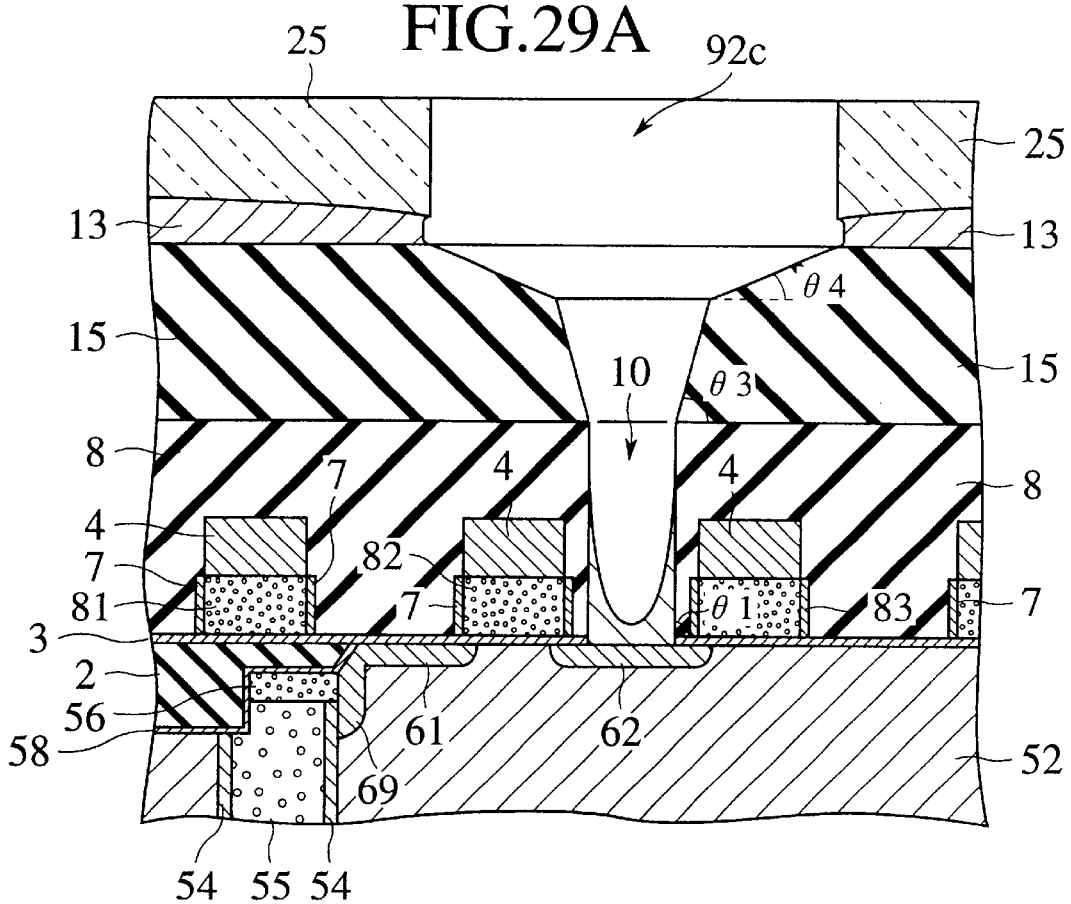
Figure 29B:
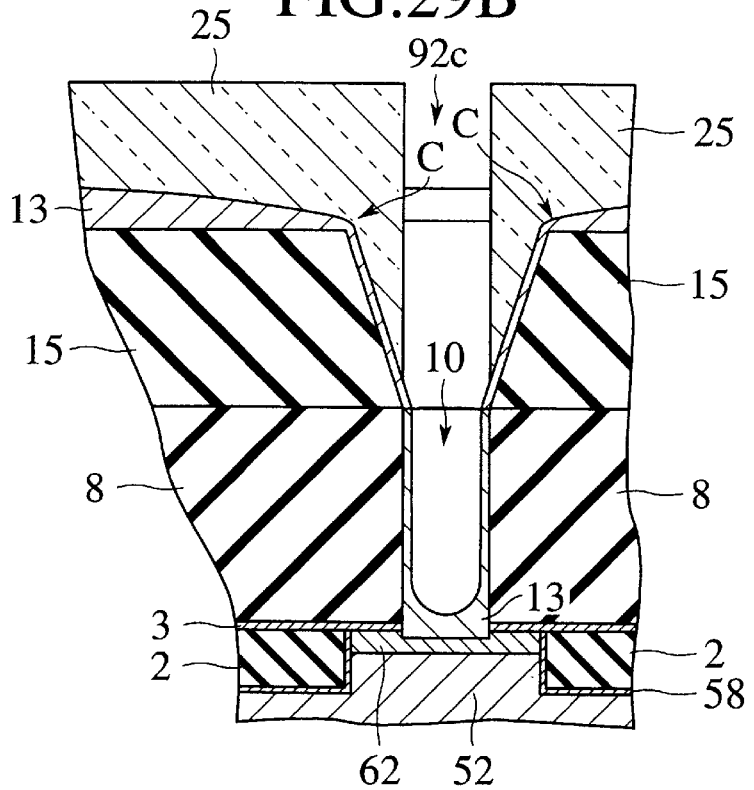

(b) Next, a resist 25 is spin-coated over the organic material film 13. Then, as shown in FIGS. 28A, 28B and 28C, an etching window is formed only in the vicinity of the contact hole 10. This etching window is in the shape of a rectangle, with the longer side parallel to the bit line. FIG. 28B is a cross-sectional view taken along I—I direction of FIG. 28A, and FIG. 28C, a cross-sectional view taken along II—II direction of FIG. 28A. (Similarly, FIGS. 29A, and 30A are cross-sectional views corresponding to I—I direction of FIG. 28A; and FIGS. 29B and 30B are cross-sectional views corresponding to II—II direction of FIG. 28A respectively.)

(c) Next, the organic material film 13 is dry-etched using the resist 25 as an etching mask. At this point, as FIG. 29A shows, only the shoulders of the contact hole 10 which are parallel to the bit line are first etched, the second interlayer insulating film 15 receding anisotropically to create an anisotropic second tapered portion having a third taper angle θ4 (for instance, approximately 25°<θ4<45°). As a result, the diameter of the connecting face of the upper portion of the contact hole anisotropically increases in the bit line direction only. As FIG. 29B shows, the shoulders C of the contact hole 10 along the direction of the word line are not affected by the etching since they are covered with resist. Consequently, the diameter of the contact hole does not increase parallel to the word line.

Figure 30A:
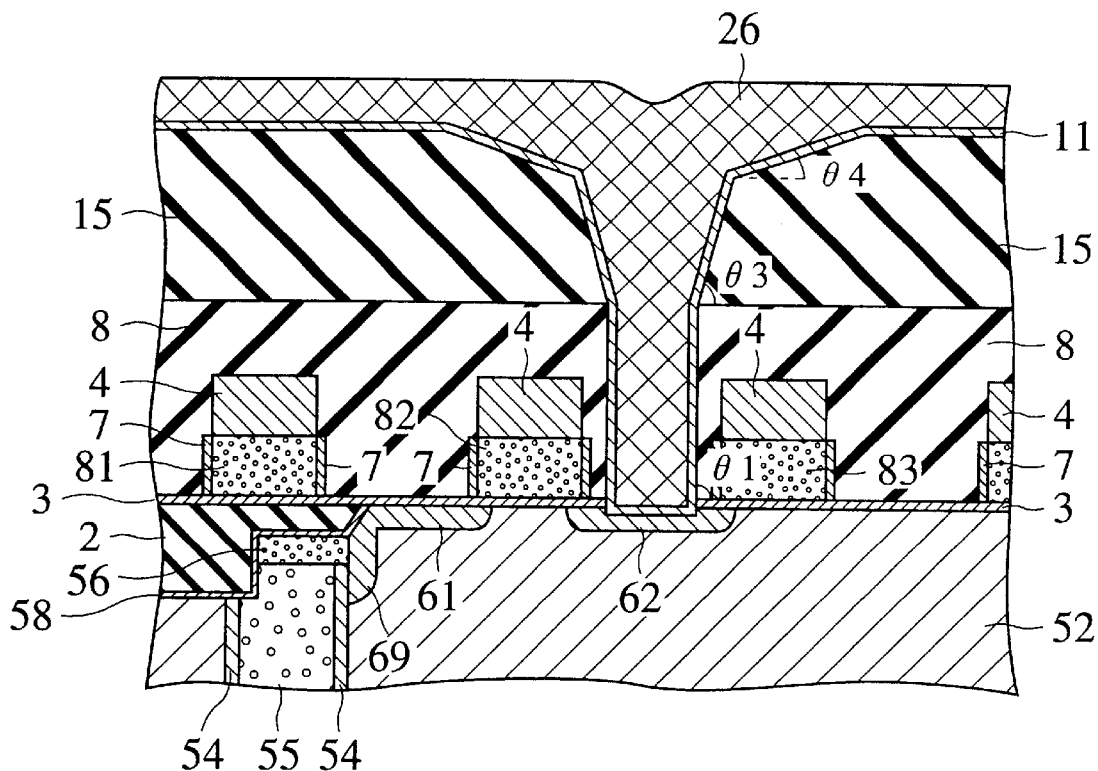
Figure 30B:
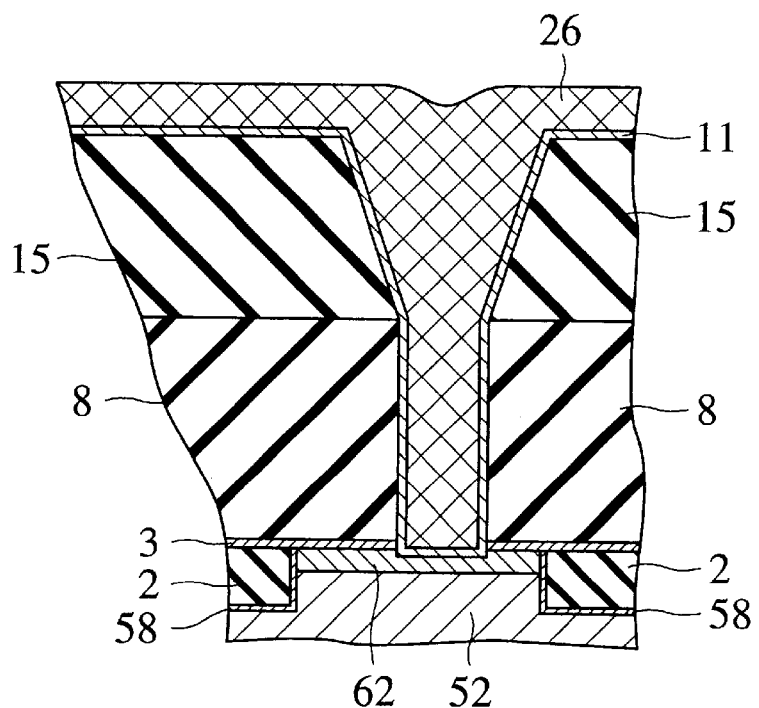

(d) Next, as FIGS. 30A and 30B show, a barrier metal film 11, such as for instance Ti/TiN laminated film, is deposited. The anisotropic recession of the second interlayer insulating film 15 smoothes the shoulders of the contact hole 10, and the contact hole diameter widens. Therefore, the barrier metal film 11 can be deposited more or less evenly. Then, the contact hole 10 is filled with a tungsten film 26. Due to the anisotropic increase along the bit line direction of the diameter of the upper connecting portion of the contact hole 10, it is possible to fill the contact hole 10 evenly with the tungsten film 26.

Figure 31A:
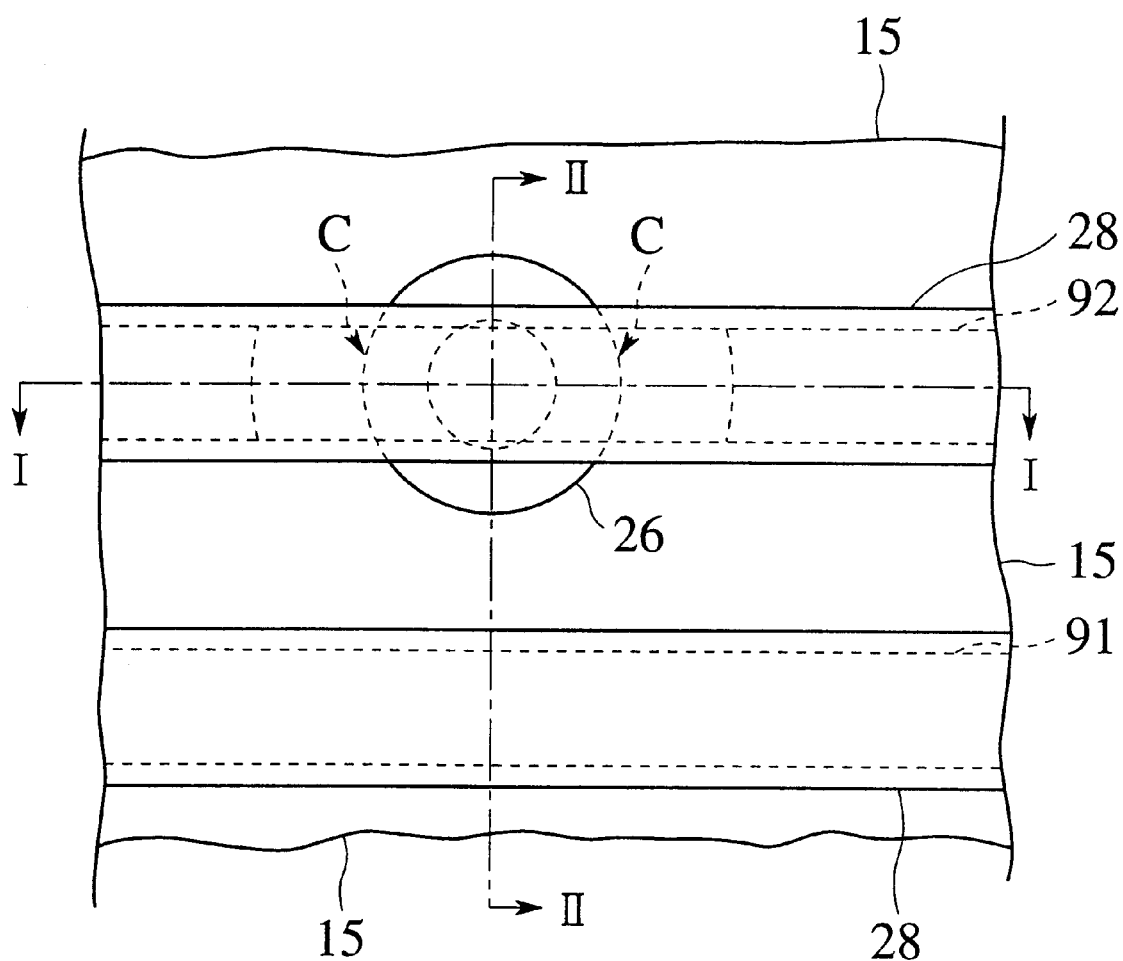
Figure 31B:
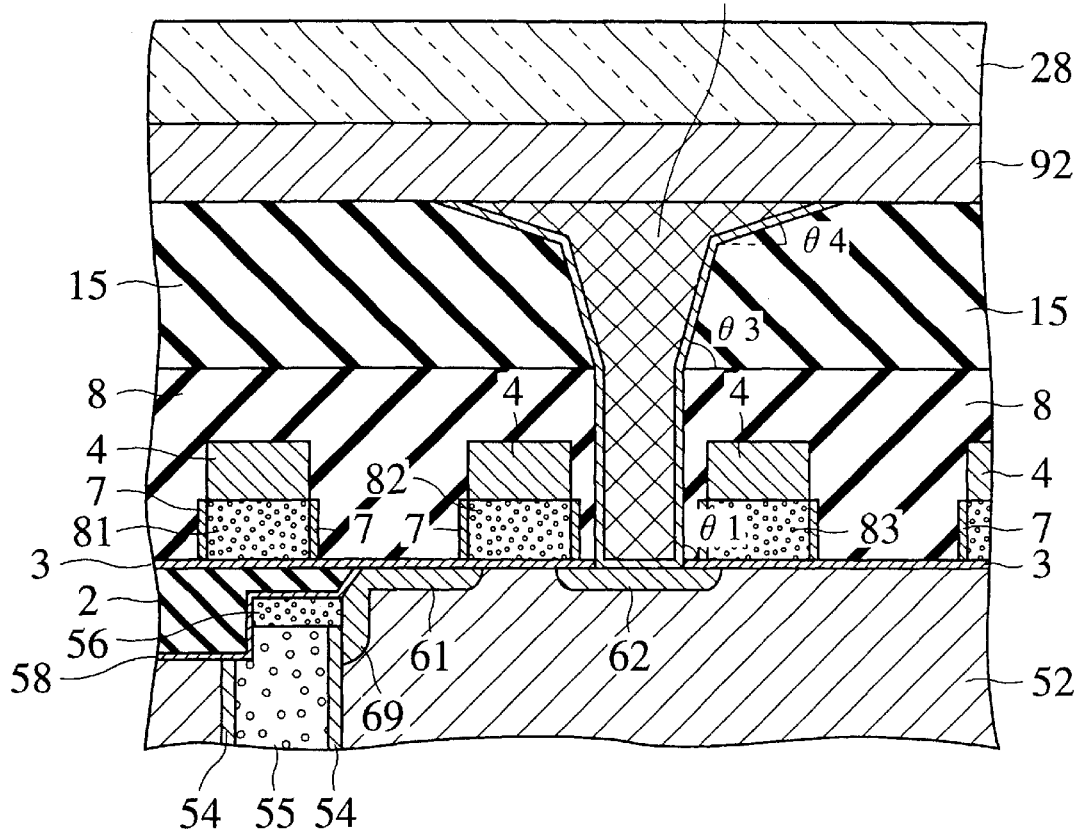
Figure 31C:
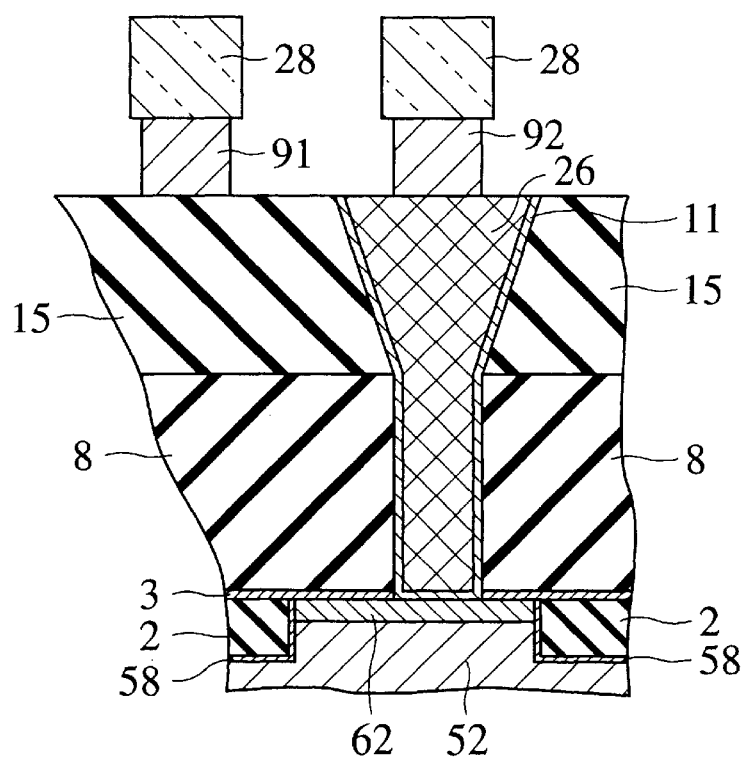

(e) Next, the surface of the tungsten film 26 is flattened by CMP method until the second interlayer insulating film 15 is exposed. After the surfaces of the second interlayer insulating film 15 and the tungsten film 26 have been etched and cleaned, a metal film 92, comprised of Al, Al—Si, Al—Si—Cu film or such like, is deposited thereabove by vacuum evaporation, sputtering or the like. Then, as shown in FIGS. 31A, 31B and 31C, a resist pattern corresponding to the bit line pattern is formed in a predetermined position. Here, FIG. 31B is a cross-sectional view taken along I—I direction of FIG. 31A, and FIG. 31C, a cross-sectional view taken along II—II direction of FIG. 31A. Then, using this resist pattern as an etching mask, the metal film 92 is patterned by RIE.

Figure 32A:
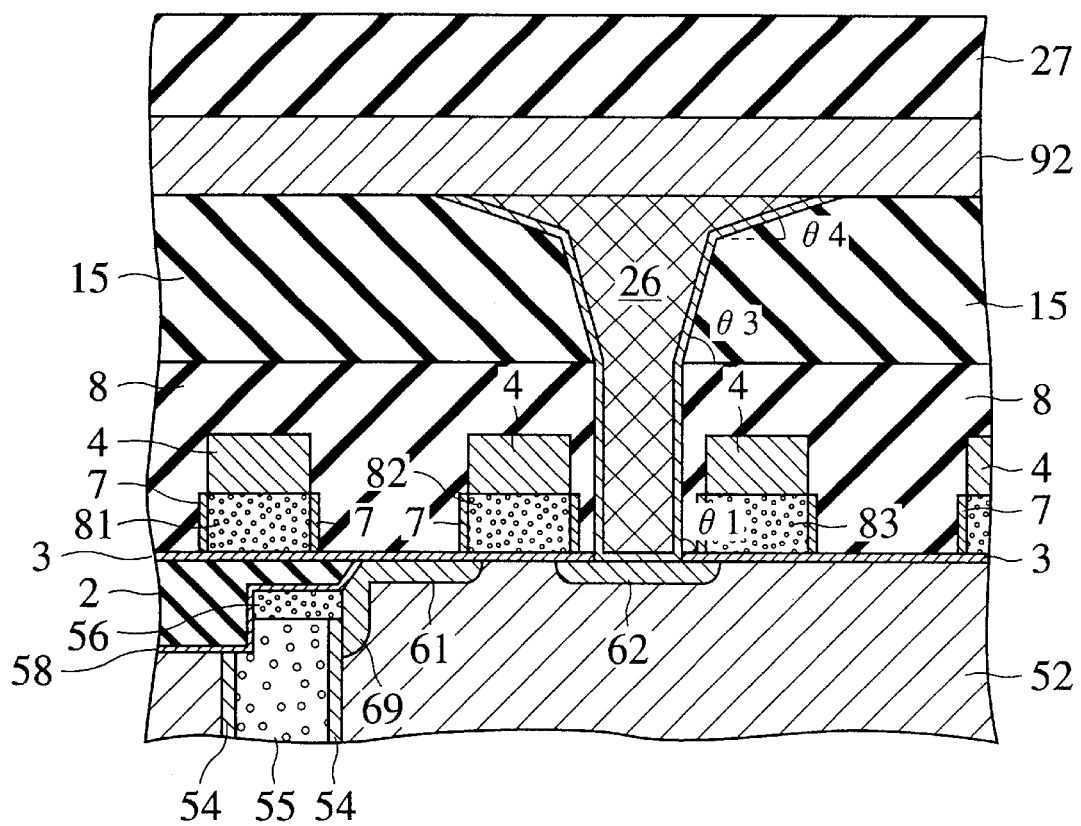
Figure 32B:
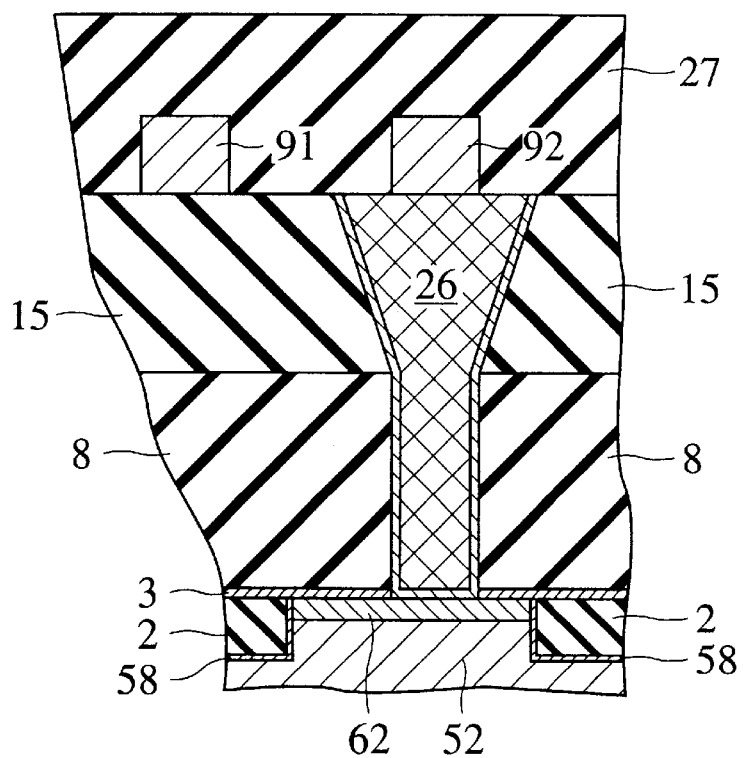

(f) Finally, a final passivation film 27 is deposited and flattened by CMP method, thereby completing the configuration wherein the contact plug 26 comprises a different type of material from the bit lines 91 and 92 as shown in FIGS. 32A and 32B. (FIG. 32A is a cross-sectional view corresponding to I—I direction of FIG. 31A, and FIG. 32B is a cross-sectional view corresponding to II—II direction of FIG. 31A.)

THIRD EMBODIMENT

The above explanation described a case where the position of the contact hole and the position of the surface interconnections, such as the bit lines, are correctly aligned. In fact, however, there may be slight deviation from the correct positions within a permissible range. But, it should be clear from the following explanation of a third embodiment that the present invention is able to achieve its objectives even when such deviation exists.

Figure 33A:
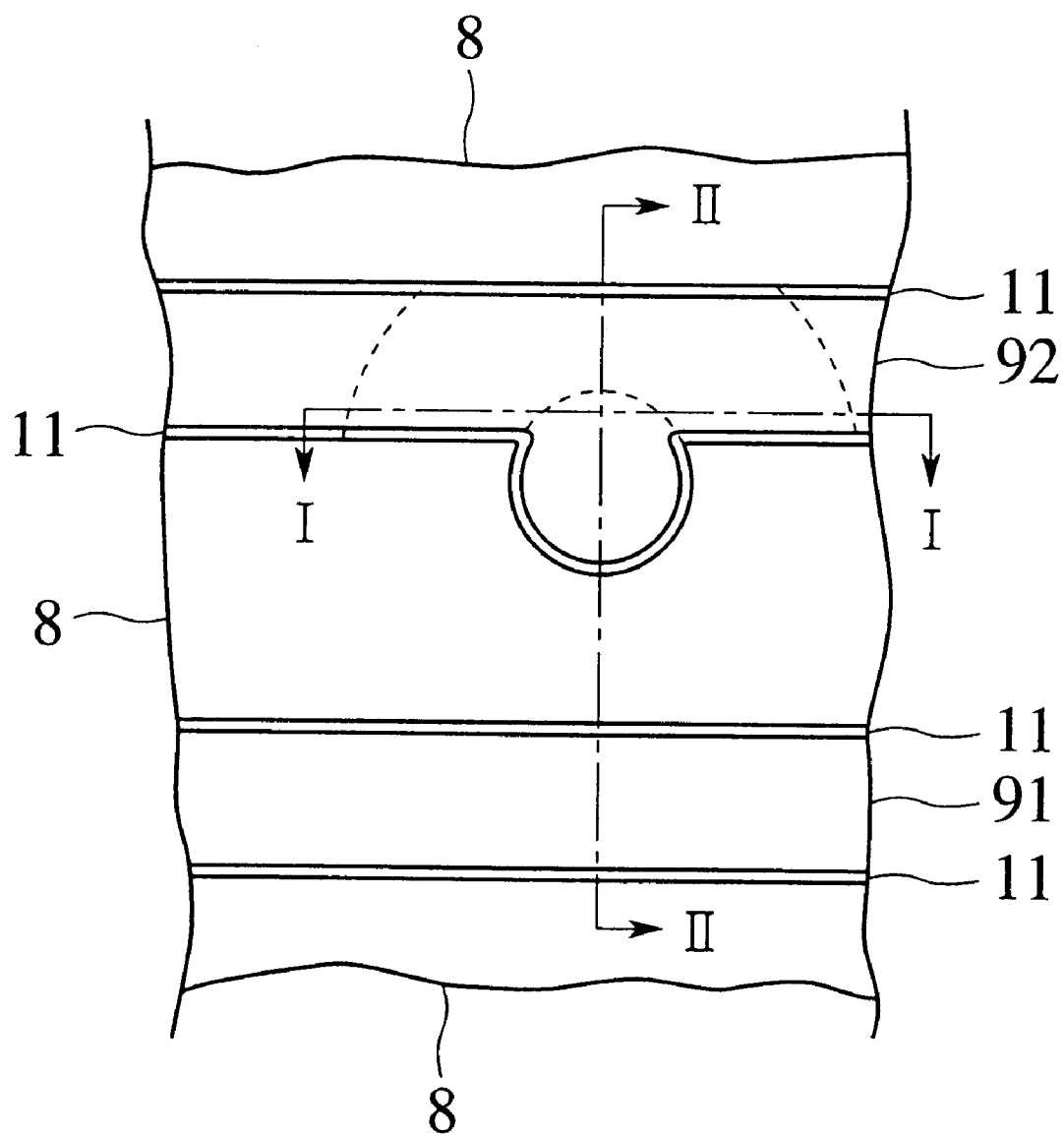
FIG. 33A is a top plan view of a semiconductor device according to the third embodiment of the present invention.
Figure 33B:
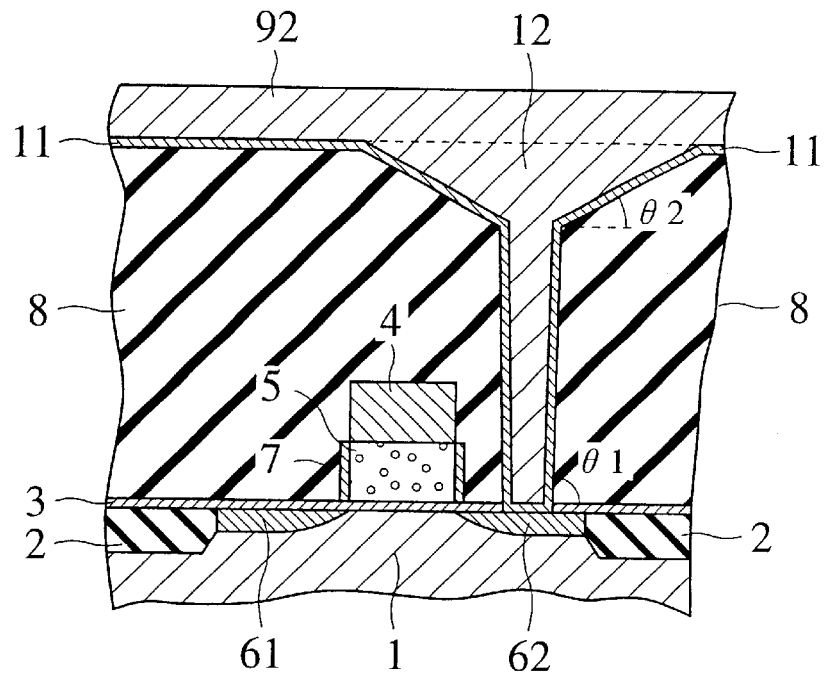
FIG. 33B is a cross-sectional view along the I—I direction of FIG. 33A.
Figure 33C:
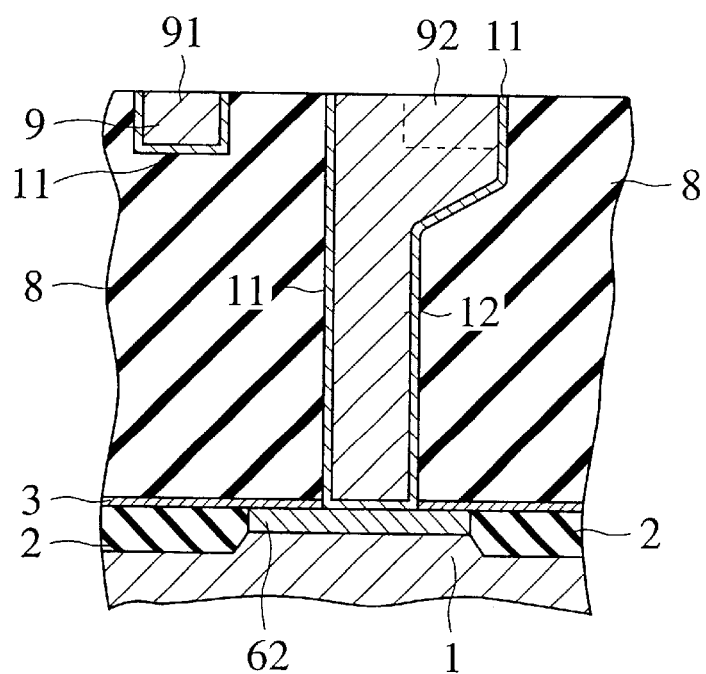
FIG. 33C is a cross-sectional view along the II—II direction of FIG. 33A.

FIG. 33A is a top plan view of a semiconductor device according to a third embodiment of the present invention. And, FIG. 33B is a cross-sectional view taken along I—I direction of FIG. 33A, and FIG. 33C, a cross-sectional view taken along II—II direction of FIG. 33A. As FIG. 33B shows, contact plug 12 juts out asymmetrically at a right angle to the surface interconnections (the II—II direction). As FIGS. 33B and 33C show, the semiconductor device according to the third embodiment of the present invention comprises a transistor on a p-type (100) silicon substrate 1. The transistor comprises an $n^+$ source region 61 and an $n^+$ drain region 62 which are provided on the surface of the p-type (100) silicon substrate 1, surrounded by an element isolation region 2, formed by a method such as STI method. The section of the p-type (100) silicon substrate 1 located between the transistor $n^+$ source region 61 and the $n^+$ drain region 62 is the channel region. A polysilicon gate electrode 5 is provided above this channel region, with a gate oxide film 3 in between. A silicon nitride film ($Si_3N_4$) 4 which has roughly the same dimensions as the polysilicon gate electrode 5 is deposited above the gate electrode 5. And, a thin silicon oxide film 7 is provided on the side walls of the polysilicon gate electrode 5. And, an interlayer insulating film 8, comprising BPSG or the like, is deposited over the polysilicon gate electrode 5/silicon nitride film ($Si_3N_4$) 4. Then, surface interconnections 91 and 92 are provided on the interlayer insulating film 8 (see FIG. 33A). The surface interconnections 91 and 92 may be the bit lines mentioned in the explanation of the first embodiment, or other kinds of signal wires or power supply lines.

As FIG. 33C shows, an anisotropic and asymmetrical contact plug 12 is connected on top of the $n^+$ drain region 62. Moreover, the contact plug 12 is connected to surface interconnection 92. The contact plug 12 is buried in a contact hole which is provided in the interlayer insulating film 8. As FIG. 33B shows, in the semiconductor device according to the third embodiment of the present invention, the contact plug 12 has a tapered portion with a taper angle θ2. This tapered portion is anisotropically shaped in relation to the axis of the contact plug 12. In other words, as FIG. 33B shows, the upper portion of the contact hole is symmetrically chamfered to a taper angle θ2 only in the direction parallel to the surface interconnection 92 and, as FIG. 33C shows, the upper portion of the contact hole extends asymmetrically at a right angle to the length of the surface interconnections. As FIG. 33A clearly illustrates, the shape of the connecting face (top end face) of the contact plug 12 is anisotropic, having a long axis parallel to the surface interconnection 92 and a short axis which is perpendicular to the surface interconnection 92.

Thus, since the tapered angle θ2 of the contact hole, namely the contact plug 12, is sufficiently smaller than the tapered angle θ1, the thickness of the barrier metal film 11 between the contact hole side wall and the contact plug 12 has good uniformity. With this shape, which is asymmetric in cross-section, one part of the connection portion of the contact plug 12, which is parallel to the gate electrode direction, has an increased diameter. But, the maximum value of this increase is limited within a fixed range. Therefore, shorts between adjacent surface interconnections and contact holes can easily be prevented, even when there is deviation between the positions of the surface interconnections and the contact hole.

Next, a method for manufacturing the semiconductor device according to the third embodiment of the present invention will be explained based on FIGS. 34A, 34B, 34C, 35A, 35B, 36A and 36B. The following explanation refers to a case in which there is slight alignment deviation between the contact hole and the surface interconnections, but the present invention is not limited to such a case. In fact, it should be noted that the present invention is valid even in a case where, for instance, the position of the surface interconnection is to be adjusted by deliberately shifting the position of the surface interconnection without moving the contact hole.

(a) First, element isolation regions 2 are provided at predetermined positions on a p-type silicon substrate 1. Next, a gate insulating film 3, and $n^+$ DOPOS film 5 and a silicon nitride film ($Si_3N_4$) 4 are deposited respectively, and patterned by means of dry etching or such like to form a gate electrode 5. Next, an nMOSFET $n^+$ source region 61 and an $n^+$ drain region 62 are formed by, for instance, ion implantation of phosphorus ($^{31}P^+$) while using the gate electrode 5/silicon nitride film ($Si_3N_4$) 4 as an implantation mask. Then, an interlayer insulating film 8 comprising BPSG or such like is deposited and a contact hole is formed therein by dry etching. Next, an auxiliary film 13 is provided on the inner wall of the contact hole 10 and on the surface of the interlayer insulating film 8. This auxiliary film 13 should preferably comprise a liquid organic material film formed by spin-coating. As in the first embodiment, the organic film 13 on the shoulders of the top rim of the contact hole 10 becomes extremely thin (see FIGS. 13A and 13B).

Figure 34A:
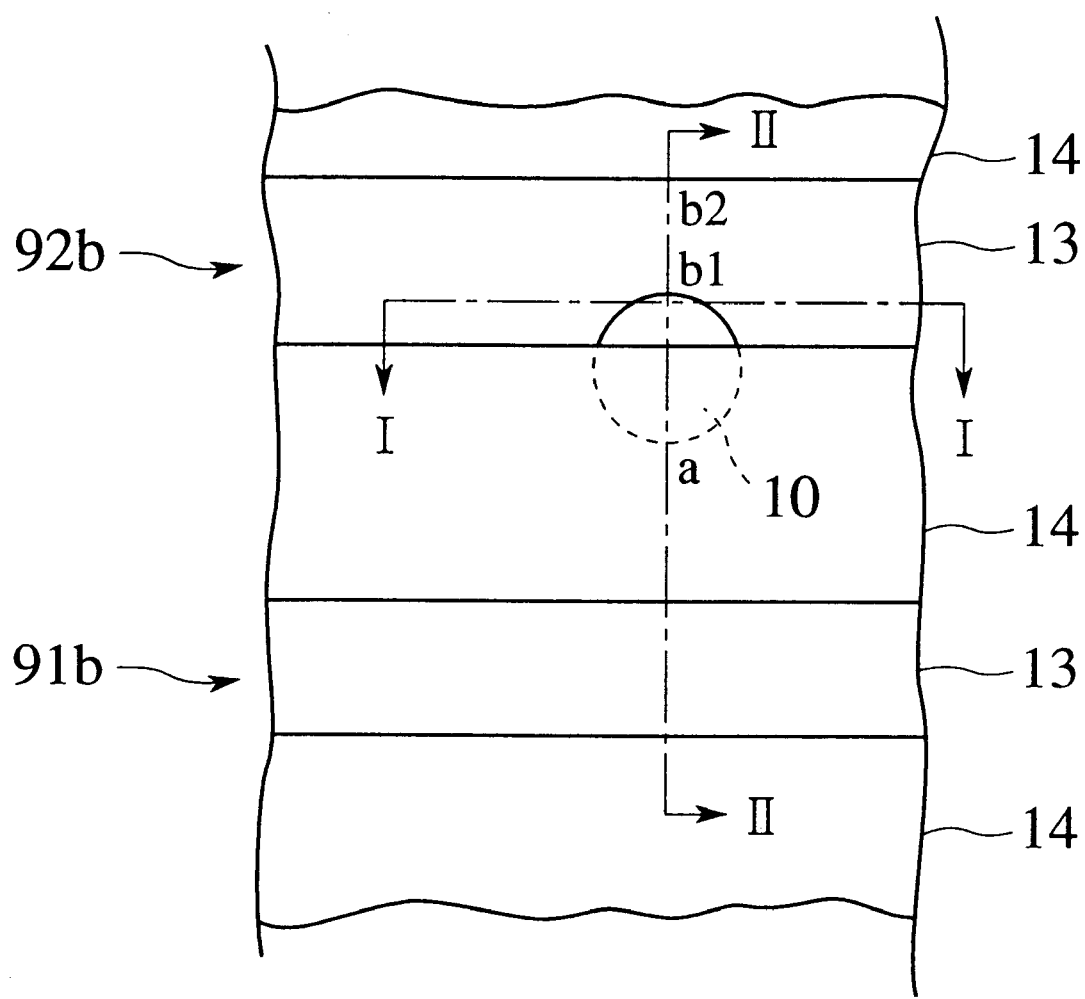
FIGS. 34A–34C, 35A, 35B, 36A and 36B are process flow views illustrating the fabricating method of a semiconductor device according to the second embodiment of the present invention.
Figure 34B:
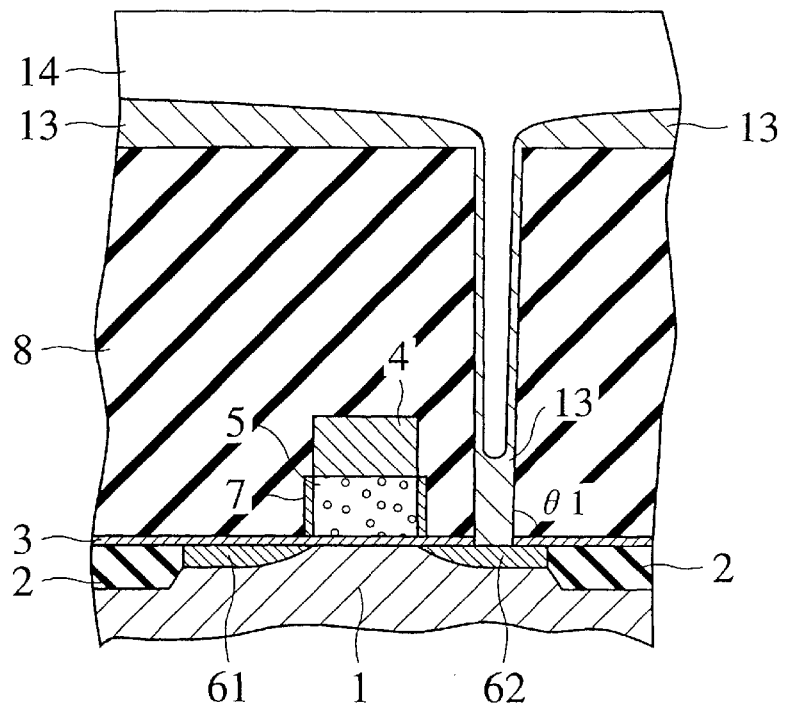
Figure 34C:
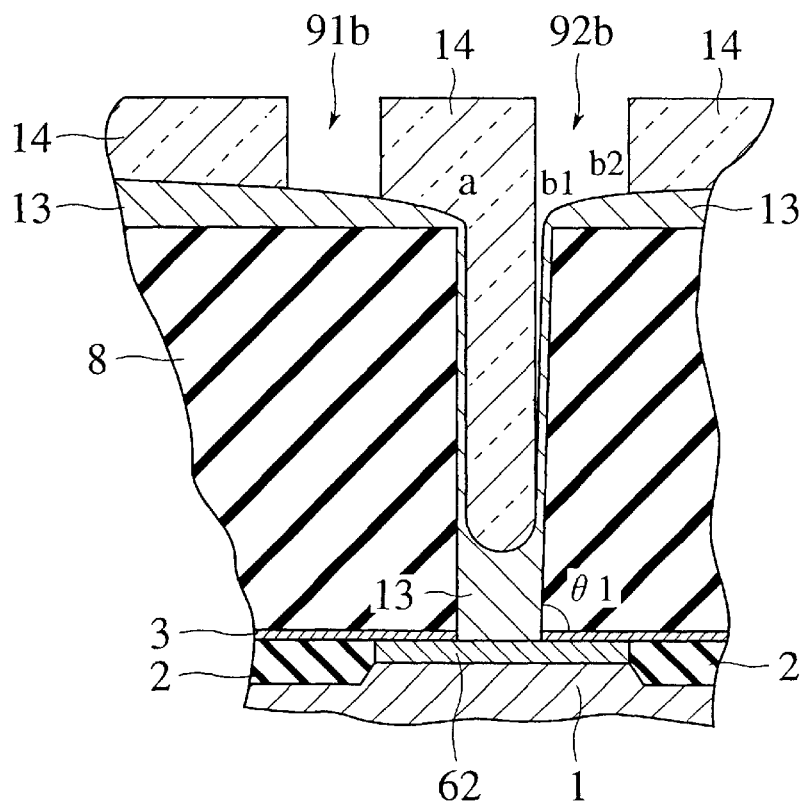

(b) A resist 14 is applied, and patterning is performed using photolithography to create grooves (wiring grooves) for the surface interconnections in desired positions. Here, FIGS. 34A, 34B and 34C illustrate the case where there is deviation between the positions of the pattern of wiring groove 92b and the pattern of the contact hole 10. (FIG. 34B is a cross-sectional view taken along I—I direction of FIG. 34A, and FIG. 34C, a cross-sectional view taken along II—II direction of FIG. 34A.)

Figure 35A:
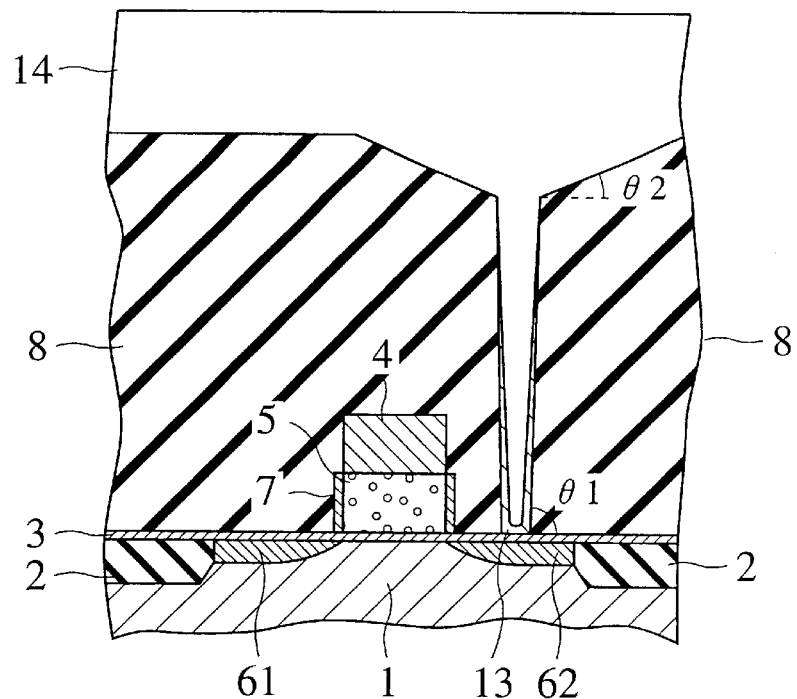
Figure 35B:
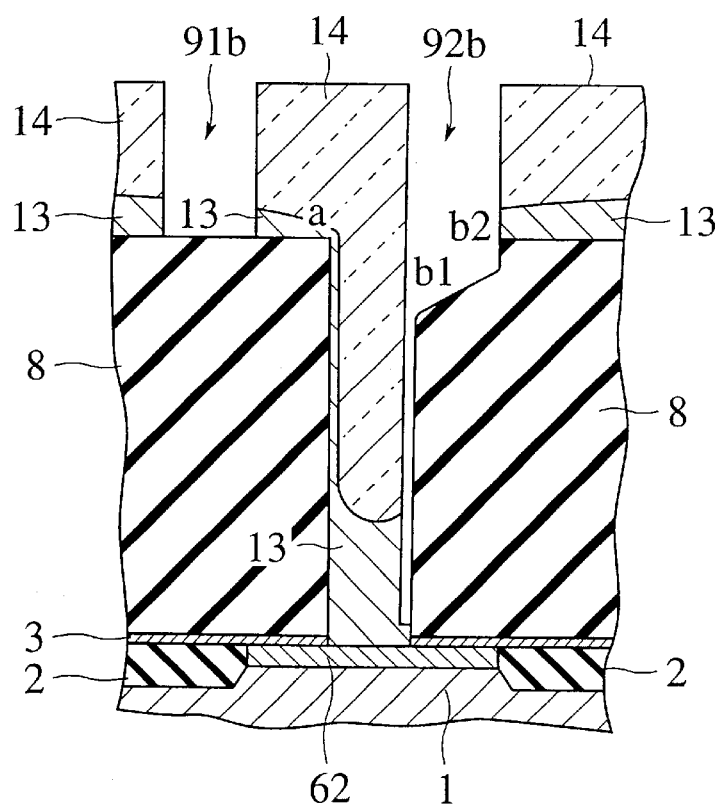

(c) Next, the organic material film 13 is dry-etched using the resist 14 as an etching mask. Now, as the cross-sectional view taken along the length of wiring groove 92b in FIG. 35A shows, the shoulders of the contact hole 10, where the organic material film is thin, are first etched, causing the interlayer insulating film 8 to recede. FIG. 35A is a cross-sectional view corresponding to the I—I direction of FIG. 34A, and FIG. 35B, a cross-sectional view corresponding to II—II of FIG. 34A. Consequently, the top of the contact hole 10 is chamfered to taper angle θ2, thereby increasing the opening. In other words, the diameter of the upper connecting surface is increased in the direction of the surface interconnections. By contrast, as the cross-sectional view taken along the gate electrode direction in FIG. 35B illustrates, the etching proceeds asymmetrically. In other words, since the leftside shoulder point "a" of the contact hole 10 is covered by the resist 14, it is not affected by etching. But, since the rightside shoulder point "b1" is not covered with resist 14, it is etched. Therefore, there is a fixed limit on the increase of the diameter of the upper connecting portion of the contact hole 10 parallel to the gate electrode direction. In other words, etching is restricted from point "b2" due to the covering by the resist 14, stopping the increase of the diameter of the top of the contact hole 10 in the gate electrode direction. Thus, a section of the diameter increases parallel to the gate electrode direction, but the maximum increase value is limited to "a-b2". As a consequence, shorts between adjacent surface interconnections and contact holes can be prevented even when there is an alignment deviation between the positions of the surface interconnections and the contact holes.

Figure 36A:
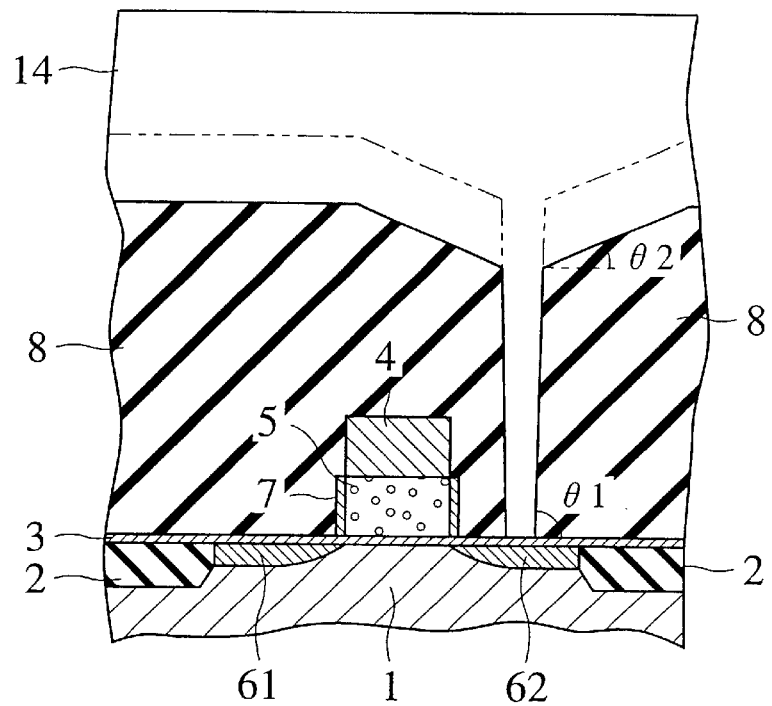
Figure 36B:
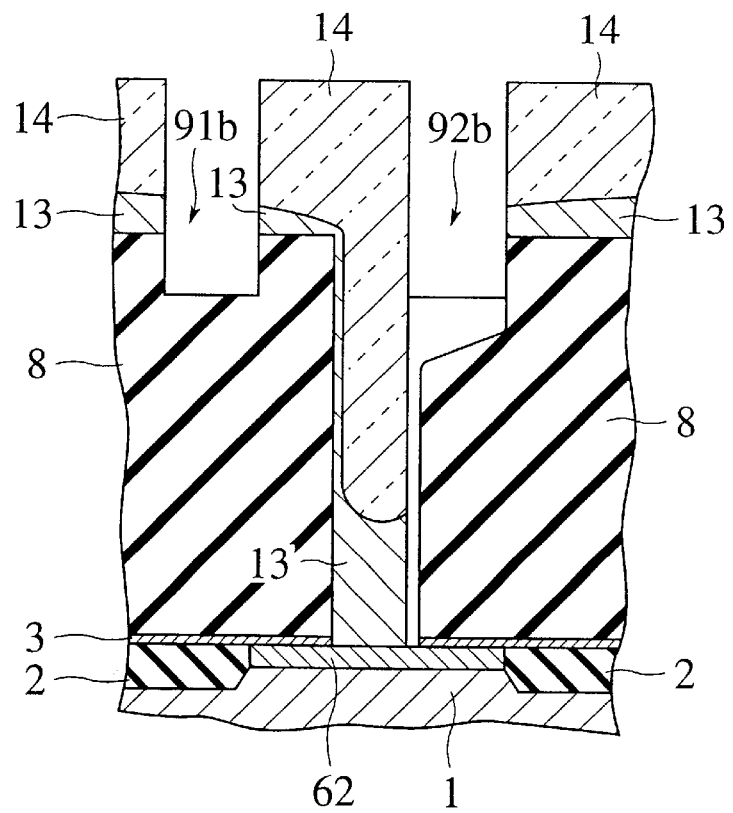

(d) Next, as FIGS. 36A and 36B show, wiring grooves 91a and 92a of desired depth are dry-etched into the interlayer insulating film 8, using the resist 14 as an etching mask. (FIG. 36B is a cross-sectional view taken along I—I direction of FIG. 34A, and FIG. 36C, a cross-sectional view taken along II—II direction of FIG. 34A.) As a result, as the cross-sectional view along the gate electrode direction in FIG. 35B shows, the etching of the interlayer insulating film 8 proceeds asymmetrically. In other words, since the leftside shoulder of the contact hole 10 is covered by the resist 14, it is not affected by etching. But, the uncovered rightside shoulder is etched approximately to a predetermined depth. Therefore, the diameter of the upper connecting face increases in the gate electrode direction on the right side only. Thereafter, the resist 14 and the organic material film 13 remaining inside the contact hole 10 are peeled away.

(e) Subsequent processes are depicted in FIGS. 26A to 26C. A barrier metal film 11, such as for instance Ti/TiN laminated film, is deposited on the inner wall of the contact hole 10 and on the surface of the interlayer insulating film 8. The anisotropic recession of the interlayer insulating film 8 has smoothed the shoulders of the contact hole 10, enabling the barrier metal film 11 to be deposited approximately evenly. As FIG. 33B shows, the taper angle θ2 is sufficiently less than θ1, and the diameter is expanding parallel to the wiring groove 92a. Therefore, the thickness of the barrier metal film 11 has good uniformity. Next, the contact hole 10 is filled with a tungsten film 12. Now, since the diameter of the upper connecting portion of the contact hole 10 increases anisotropically along the direction of the bit line, it is possible to fill the contact hole 10 evenly. The surface interconnections and the contact plug 12 are evenly filled in using the same conductive material and the process ends with flattening using CMP method.

The above-mentioned conductive film is not restricted to tungsten; for instance, Al, Al—Si or Al—Si—Cu may be used instead. Furthermore, the interlayer insulating film is not restricted to BPSG. An $SiO_2$ film, which dopants have not been added to, is acceptable.

OTHER EMBODIMENTS

Various modifications will become possible for those skilled in the art after receiving the teachings of the present disclosure without departing from the scope thereof.

For instance, the first and second embodiments described a trench-type DRAM, but this is merely one example. These embodiments can, of course, also be applied to various types of DRAM having various capacitor cells such as stacked, double-stacked, spread-stacked and fin structures.

Figure 37:
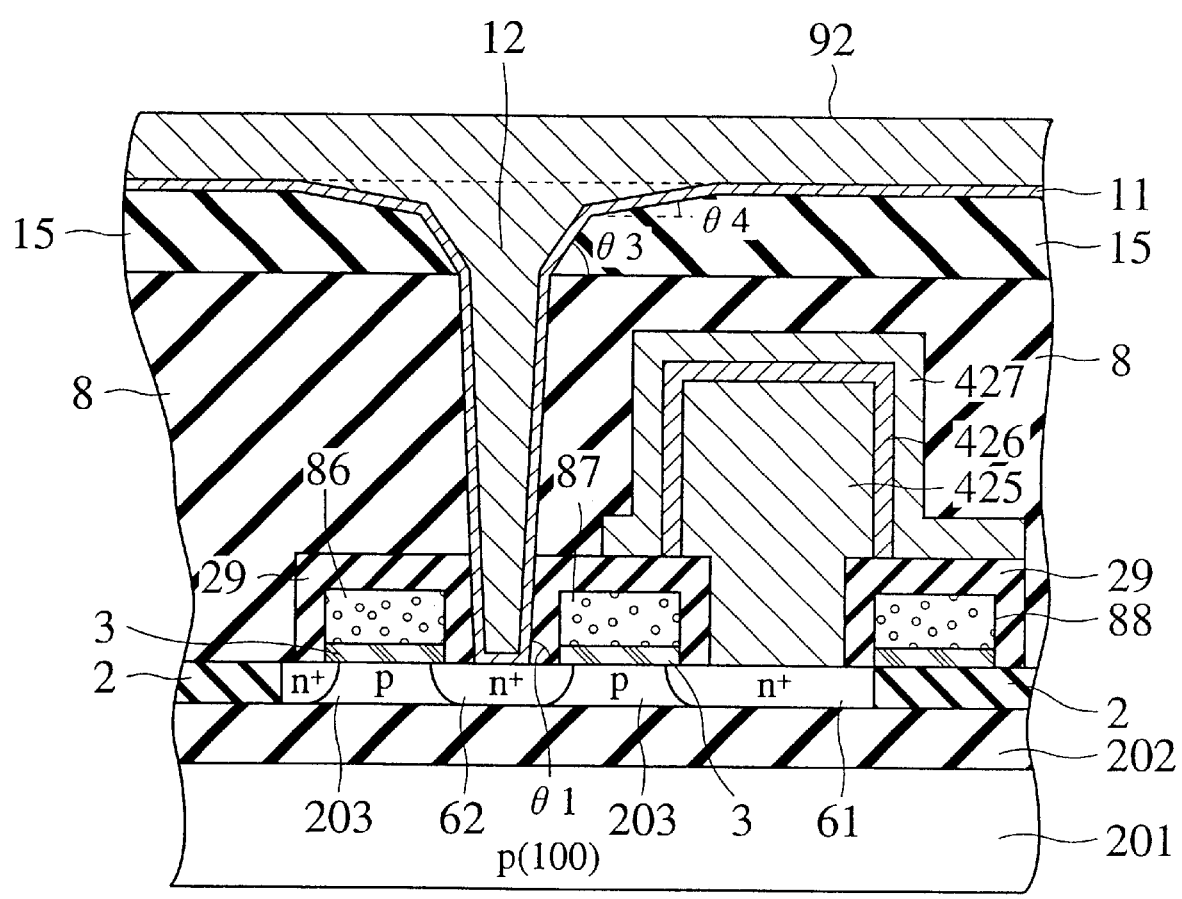
FIG. 37 is a cross-sectional view of a semiconductor device (DRAM) according to another embodiment of the present invention.

FIG. 37 is a cross-sectional diagram schematically depicting a DRAM having stacked capacitor cells, utilizing an SOI structure. As the diagram shows, a p-type SOI layer 203 is provided on the surface of a p-type (100) silicon substrate 201 with a buried oxide film 202 therebetween. The p-type SOI layer 203 is surrounded by an element isolation region 2, formed by a method such as STI method, the surrounded portion being the active area. An $n^+$ source region 61 and an $n^+$ drain region 62 of an access transistor are provided on the surface of the p-type SOI layer 203 within this active area. The section of the p-type SOI layer 203 located between the access transistor $n^+$ source region 61 and $n^+$ drain region 62 is the channel region. Gate electrodes 86, 87 and 88, comprised of polysilicon or the like, are provided above the channel region 203, with a gate insulating film 3 in between. The polysilicon gate electrodes 86, 87 and 88 also serve as word lines and extend at right angles to the bit line 92. Silicon oxide films ($SiO_2$) or nitride films ($Si_3N_4$) 29 are deposited over and on the side walls of the polysilicon gate electrodes 86, 87 and 88. Furthermore, a first interlayer insulating film 8, comprising BPSG or the like, and a second interlayer insulating film 15, comprising $SiO_2$ or the like, are deposited on the silicon oxide film ($SiO_2$) or nitride film ($Si_3N_4$) 29. The bit line 92 is provided above the second interlayer insulating film 15.

The storage capacitor of the stacked DRAM shown in FIG. 37 comprises a storage node electrode 425, a capacitor dielectric 426 and a plate electrode 427. The storage node electrode 425 connects to the $n^+$ source region 61. Furthermore, a contact plug 12 having a first tapered portion with an isotropic taper angle θ3, starting from the interface between the first interlayer insulating film 8 and the second interlayer insulating film 15, and a second tapered portion with an anisotropic taper angle θ4, starting from a point within the second interlayer insulating film 15, is provided on top of the $n^+$ drain region 62. The contact plug 12 is connected to the bit line 92. The shape of the opening in cross-section extends anisotropically only along the direction of the bit line. Thus, since the tapered angles θ3 and θ4 of the contact hole, namely the contact plug 12, are sufficiently smaller than the tapered angle θ1, the thickness of the barrier metal film 11 between the contact hole side wall and the contact plug 12 has good uniformity. Since there is no increase in hole diameter along the direction of the gate electrode direction due to the anisotropic tapered angle θ4, shorts between adjacent bit lines and contact holes can easily be prevented.

Various types of insulating films can be used as the capacitor dielectric 426, such as silicon oxide film ($SiO_2$), silicon nitride film ($Si_3N_4$), tantalum oxide film ($Ta_2O_5$), titanium oxide strontium film ($SrTiO_3$) or titanium oxide barium film ($BaTiO_3$). Moreover, the device operates as a FRAM when a ferroelectric film such as lead zirconate titanate (PZT) or Ba-rich titanium oxide barium strontium film ($Ba_xSr_{1-x}TiO_3$) is used as the capacitor dielectric 426.

Figure 38:
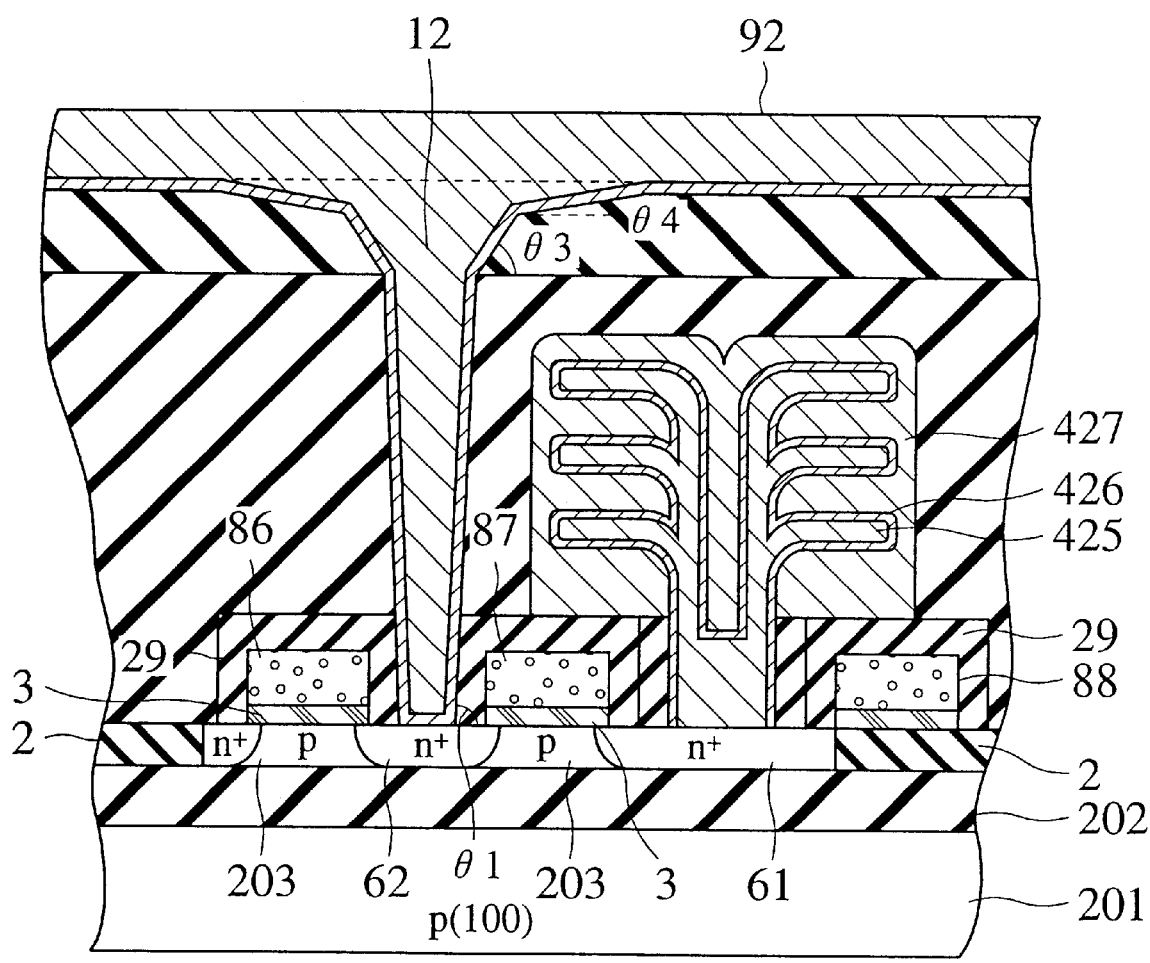
FIG. 38 is a cross-sectional view of a semiconductor device (DRAM) according to another embodiment of the present invention.

FIG. 38 is a schematic cross-sectional view of a fin-type DRAM utilizing an SOI structure. As FIG. 38 shows, the storage capacitor of this fin-type DRAM comprises a storage node electrode 425, a capacitor dielectric 426 and a plate electrode 427, and can have larger storage capacitance with smaller cell sizes. Excepting the structure of the storage capacitor, the remaining structure of the memory cell is substantially identical to FIG. 37, and further explanation will be omitted. In FIG. 38, a contact plug 12 having an anisotropic first tapered portion with an isotropic taper angle θ3, starting from the interface between the first interlayer insulating film 8 and the second interlayer insulating film 15, and a second tapered portion with an anisotropic taper angle θ4, starting from a point within the second interlayer insulating film 15, is provided on top of the $n^+$ drain region 62. The shape of the opening in cross-section extends anisotropically along the direction of the bit line only. Thus, since the tapered angles θ3 and θ4 of the contact hole, namely the contact plug 12, are sufficiently smaller than the tapered angle θ1, the thickness of the barrier metal film 11 between the contact hole side wall and the contact plug 12 has good uniformity. Since there is no increase in hole diameter along the gate electrode direction due to the anisotropic tapered angle θ4, shorts between adjacent bit lines and contact holes can easily be prevented.

Figure 39A:
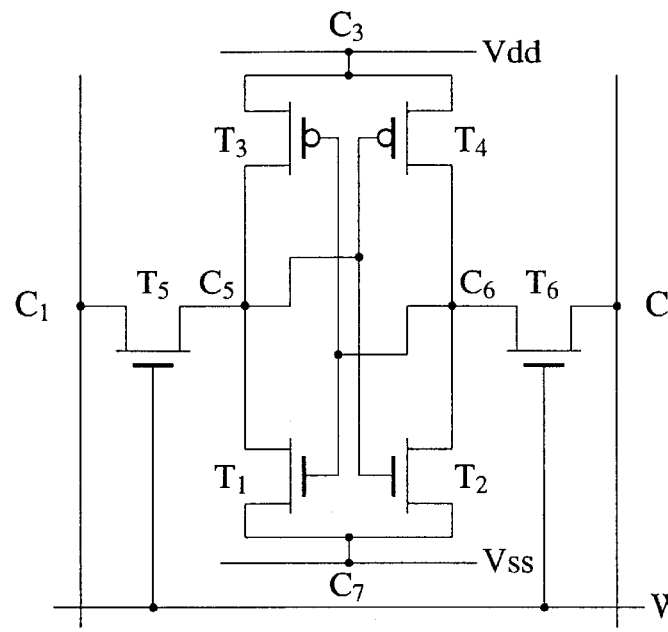
FIG. 39A is a circuit diagram of a semiconductor device (SRAM) according to another embodiment of the present invention.

FIG. 39A is a circuit diagram showing an SRAM memory cell according to yet another embodiment of the present invention. This SRAM memory cell comprises 6 transistors $T_1$ to $T_6$. And, a CMOS inverter, comprising a pMOSFET $T_3$ and an nMOSFET $T_1$, and another CMOS inverter, comprising a pMOSFET $T_4$ and an nMOSFET $T_2$, operate together in flip-flop. A bit line B is connected via a contact portion $C_1$ to the drain electrode of the nMOSFET $T_5$, a word line W having been connected to the gate electrode of the nMOSFET $T_5$. The source electrode of the nMOSFET $T_5$ connects to the input of one of the CMOS inverters and to the output of the another CMOS inverter. Furthermore, an inverse bit line B (bar) is connected via a contact portion $C_2$ to the drain electrode of the nMOSFET $T_6$, the word line W̄ having been connected to the gate electrode of the nMOSFET $T_6$. The source electrode of the nMOSFET $T_6$ connects to the output of one of the CMOS inverters and to the input of the other CMOS inverter. The source electrodes of the pMOSFETs $T_3$ and $T_4$ are connected via the contact portion $C_3$ to a high-level power supply line Vdd. The source electrodes of the nMOSFETs $T_1$ and $T_2$ are connected via a contact portion $C_7$ to a low-level power supply line Vss.

Figure 39B:
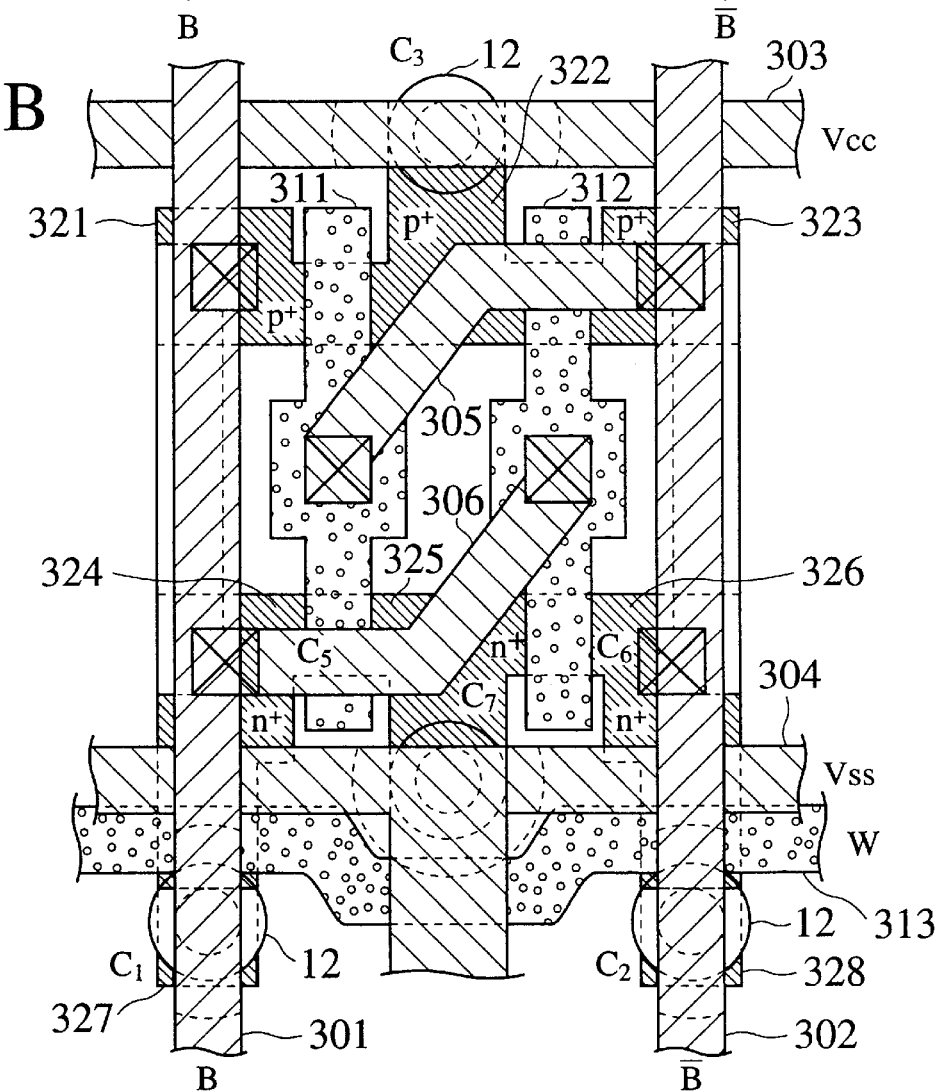
FIG. 39B is a top plan view of the semiconductor device (SRAM) shown in the circuit diagram 39A.

FIG. 39B is a top plan view of a main surface pattern of the memory cell shown in FIG. 39A. A bit line 301 and an inverse bit line 302 run vertically. A high-level power supply line 303, a low-level power supply line 304 and a word line 313 run horizontally so as to intersect the bit line 301 and the inverse bit line 302 at right angles. The pMOSFET $T_3$ has a p+ source region 322 and a p+ drain region 321. The pMOSFET $T_4$ has a p+ source region 322 and a p+ drain region 323. The nMOSFET $T_1$ has an n+ source region 325 and an n+ drain region 324, the nMOSFET $T_2$ has an n+ source region 325 and an n+ drain region 326, the nMOSFET $T_5$ has an n+ source region 324 and an n+ drain region 327, and the nMOSFET $T_6$ has an n+ source region 326 and an n+ drain region 328. The gate electrodes of nMOSFET $T_5$ and nMOSFET $T_6$ serve as polysilicon word lines 313. The pMOSFET $T_3$ and nMOSFET $T_4$ share a polysilicon gate electrode 311. The pMOSFET $T_4$ and nMOSFET $T_2$ share a polysilicon gate electrode 312. The output of one of the CMOS inverters and the input of the other CMOS inverter are connected by a metal interconnection 305, and the input of one of the CMOS inverters and the output of the another CMOS inverter are connected by a metal interconnection 306.

As FIG. 39B shows, the characteristic shape of the contact plug 12 explained in the second embodiment of the present invention is here used at connection $C_1$ with the bit line 301, connection $C_2$ with the inverse bit line 302, connection $C_3$ with the high-level power supply line 303 and connection $C_7$ with the lower-power supply line 304. In other words, the contact plugs 12 at these connections $C_1$, $C_2$, $C_3$ and $C_7$ are anisotropic in shape, being longer in the direction parallel to the interconnections than in the direction perpendicular to the interconnections at the junctions with each of the interconnections (the broken lines in FIG. 39B, although somewhat hidden under the interconnections, show how the contact plugs 12 extend anisotropically parallel to the interconnections). No cross-sectional view is shown here, but the tops of the contact holes are, of course, chamfered to an anisotropic taper angle $\theta 4$ and therebelow chamfered to an isotropic taper angle $\theta 3$, as explained in the second embodiment. Since the contact plug 12 is anisotropic with respect to the center axis of the contact plug 12, in other words, since the shoulders of the contact hole 10 are anisotropically smoothened, the thickness of the barrier metal film 11 between the contact hole inner wall and the contact plug 12 has good uniformity. Furthermore, since there is no increase in contact hole diameter along the direction perpendicular to the direction of the surface interconnection due to the anisotropic taper angle $\theta 4$, shorts between adjacent interconnections and contact holes can easily be prevented. Moreover, the contact plug 12 at connection $C_7$ can have the anisotropic and asymmetrical shape explained in the third embodiment.

It should also be noted that the present invention is not limited to interconnection for small signal, but can also be applied to the power supply lines as shown in FIG. 39B.

What is claimed is:

1. A semiconductor device comprising:
    (a) a semiconductor region;
    (b) a main electrode region provided in the semiconductor region;
    (c) an interlayer insulating film provided on the semiconductor region;
    (d) an interconnection having a uniform width provided on top of the interlayer insulating film;
    (e) a deformed trumpet-shaped contact plug for connecting the main electrode region with the interconnection, the contact plug has first and second tapered sidewalls obliquely intersecting with a bottom surface of the interconnection, the first and second tapered sidewalls having different orientations as to a center axis of the contact plug, the shape of a top end face of the contact plug at which the contact plug connects with the interconnection being anisotropically deformed in relation to the center axis of the contact plug so that a length of the top end face measured along a direction of the interconnection increases compared with a shorter length measured perpendicular to the direction of the interconnection, wherein the first and second tapered sidewalls have different intersecting angles with the top end surface such that the shorter length substantially conform with the uniform width of the interconnection.

2. The semiconductor device of claim 1, wherein the shape of the top end face extends symmetrically only in an orthogonal direction to the center axis of the contact plug.

3. The semiconductor device of claim 2, wherein the orthogonal direction is parallel to the direction along which the interconnection extends, and the first tapered sidewall intersects with a first intersecting angle measured between the orthogonal direction on the top end surface and the first tapered sidewall, while the second tapered sidewall intersects with a second intersecting angle measured between a perpendicular direction on the top end surface to the orthogonal direction and the second tapered sidewall.

4. The semiconductor device of claim 1, wherein the top end face has a long axis parallel to the direction of the interconnection and a short axis perpendicular to the direction of the interconnection, and the contact plug has the first tapered sidewall which starts to incline toward the direction of the long axis from a point within the contact plug and the second tapered sidewall which starts to incline toward the direction of the short axis from a point within the contact plug.

5. The semiconductor device of claim 4, wherein the first tapered sidewall comprises multiple portions having different taper angles, while the second tapered sidewall has substantially a single taper angle.

6. The semiconductor device of claim 4, wherein the first tapered sidewall comprises at least a first tapered portion configured such that the taper angle of the first tapered portion is substantially same as the taper angle of the second tapered sidewall so as to form a circular cross-section of the contact plug, and a second tapered portion having a different taper angle from the first tapered portion so as to form a non-circular top end surface such that the length of the top end face measured along the direction of the interconnection is longer than the shorter length.

7. The semiconductor device of claim 6, wherein the interlayer insulating film comprises at least a first interlayer insulating film and a second interlayer insulating film which is disposed on the first interlayer insulating film, the first tapered portion starting from an interface between the first and second interlayer insulating films, and the second tapered portion starting from a point within the second interlayer insulating film.

8. The semiconductor device of claim 7, wherein the first and second interlayer insulating films are comprised of different materials so as to have different etching properties.

9. The semiconductor device of claim 1, wherein the interconnection and the contact plug are comprised of different materials.

10. The semiconductor device of claim 1, wherein the interconnection and the contact plug are comprised of the same material.

11. The semiconductor device of claim 1, further comprising a barrier metal provided between the contact plug and the interlayer insulating film.

12. A semiconductor memory comprising:

(a) a semiconductor region;

(b) first and second main electrode regions provided in the semiconductor region;

(c) a storage capacitor connected to the first main electrode region;

(d) a word line provided above a portion between the first and second main electrode regions;

(e) an interlayer insulating film provided above the semiconductor region and the word line;

(f) a bit line having a uniform width provided above the interlayer insulating film; and (g) a deformed trumpet-shaped contact plug for connecting the second main electrode region to the bit line, the contact plug has first and second tapered sidewalls obliquely intersecting with a bottom surface of the bit line, the first and second tapered sidewalls having different orientations as to a center axis of the contact plug, the shape of a top end face of the contact plug at which the contact plug connects with the bit line being anisotropically deformed in relation to the center axis of the contact plug so that a length of the top end face measured along a direction of the bit line increases compared with a shorter length measured perpendicular to the direction of the bit line, wherein the first and second tapered sidewalls have different intersecting angles with the top end surface such that the shorter length substantially conform with the uniform width of the bit line.

13. The semiconductor memory of claim 12, wherein the shape of the top end face extends symmetrically only in an orthogonal direction to the center axis of the contact plug.

14. The semiconductor of claim 13, wherein the orthogonal direction is parallel to the direction along which the bit line extends, and the first tapered sidewall intersects with a first intersection angle measured between the orthogonal direction in the top end surface and the first tapered sidwall, while the second tapered sidwall intersects with a second intersecting angle measured between a perpendicular direction on the top end surface to the orthogonal direction and the second tapered sidwall.

15. The semiconductor memory of claim 12, wherein the top end face has a long axis parallel to the direction of the bit line and a short axis perpendicular to the direction of the bit line, and the contact plug has the tapered sidewall which starts to incline toward the direction of the long axis from a point within the contact plug and the second tapered sidewall which starts to incline toward the direction of the short axis form a point within the contact plug.

16. The semiconductor memory of claim 15, wherein the first tapered sidwall comprises multiple portions having different taper angles, while the second tapered sidewall has substantially single taper angle.

17. The semiconductor memory of claim 15, wherein the first tapered sidwall comprises at least a first tapered portion configured such that the taper angle of the first tapered portion is substantially same as the taper angle of the second tapered sidewall so as to form a circular cross-section of the contact plug, and a second tapered portion having a different taper angle from the first tapered portion so as to form a non-circular top end surface such that the length of the top end face measured along the direction of the interconnection is longer than the shorter length.

18. The semiconductor memory of claim 17, wherein the interlayer insulating film comprises at least a first interlayer insulating film and a second interlayer insulating film which is disposed on the first interlayer insulating film, the first tapered portion starting from an interface between the first and second interlayer insulating films, and the second tapered portion starting from a point within the second interlayer insulating film.

19. The semiconductor memory of claim 18, wherein the first and second interlayer insulating films are comprised of different materials so as to have different etching properties.

20. The semiconductor memory of claim 12, wherein the bit line and the contact plug are comprised of different materials.

21. The semiconductor memory of claim 12, wherein the bit line and the contact plug are comprised of the same material.

22. The semiconductor memory of claim 12, wherein the bit line and the contact plug are comprised from different materials in a memory cell portion, and from the same material in a peripheral circuit portion surrounding the memory cell portion.

23. The semiconductor memory of claim 12, further comprising a barrier metal provided between the contact plug and the interlayer insulating film.

* * * * *